US012764938B2

(12) United States Patent
Hwang

(10) Patent No.: US 12,764,938 B2
(45) Date of Patent: Oct. 13, 2026

(54) MEMORY DEVICE AND MANUFACTURING METHOD THEREOF

(71) Applicant: Seoul National University R&DB foundation, Seoul (KR)

(72) Inventor: Cheol Seong Hwang, Seoul (KR)

(73) Assignee: Seoul National University R&DB foundation, Seoul (KR)

( * ) Notice: Subject to any disclaimer, the term of this patent is extended or adjusted under 35 U.S.C. 154(b) by 335 days.

(21) Appl. No.: 18/571,781

(22) PCT Filed: Nov. 10, 2023

(86) PCT No.: PCT/KR2023/018022
§ 371 (c)(1),
(2) Date: Dec. 19, 2023

(87) PCT Pub. No.: WO2024/136124
PCT Pub. Date: Jun. 27, 2024

(65) Prior Publication Data

US 2025/0089238 A1 Mar. 13, 2025

(30) Foreign Application Priority Data

Dec. 21, 2022 (KR) ........................ 10-2022-0180961
Dec. 21, 2022 (KR) ........................ 10-2022-0180972

(51) Int. Cl.
*H10B 12/00* (2023.01)
*H10D 30/01* (2025.01)
(Continued)

(52) U.S. Cl.
CPC ......... *H10B 12/37* (2023.02); *H10B 12/0387* (2023.02); *H10B 12/488* (2023.02);
(Continued)

(58) Field of Classification Search
CPC .. H10B 12/37; H10B 12/0387; H10B 12/488; H10B 12/05; H10B 12/30; H10B 12/315;
(Continued)

(56) References Cited

U.S. PATENT DOCUMENTS 11,227,864 B1 * 1/2022 Saeedi Vahdat ....... H10B 12/03
11,476,254 B2 10/2022 Yokoyama
(Continued)

FOREIGN PATENT DOCUMENTS

CN 115064494 9/2022
KR 10-2019-0038223 4/2019
(Continued)

OTHER PUBLICATIONS

International Search Report mailed Feb. 19, 2024 for PCT/KR2023/018022.

*Primary Examiner* — Mark W Tornow

(57) ABSTRACT

The present disclosure discloses a manufacturing method including forming a stack including a first insulating layer, and a first sacrificial layer and a second insulating layer which are sequentially stacked on the first insulating layer; forming a patterned stack including at least one pattern portion having a first sacrificial layer obtained from the first sacrificial layer by patterning the stack; forming a structure including the patterned stack and the insulating material by filling empty spaces on both sides of the at least one pattern portion with an insulating material; forming a first vertical hole penetrating through the first sacrificial layer pattern of the pattern portion in the structure; forming a horizontal hole by removing the first sacrificial layer pattern exposed by the first vertical hole; and forming a gate insulating material layer on inner surfaces of the first vertical hole and the horizontal hole.

25 Claims, 71 Drawing Sheets

(51) Int. Cl.
*H10D 30/43* (2025.01)
*H10D 30/67* (2025.01)
*H10D 62/10* (2025.01)

(52) U.S. Cl.
CPC ........... *H10D 30/014* (2025.01); *H10D 30/43* (2025.01); *H10D 30/6735* (2025.01); *H10D 30/6757* (2025.01); *H10D 62/121* (2025.01)

(58) Field of Classification Search
CPC ...... H10B 12/00; H10D 30/014; H10D 30/43; H10D 30/6735; H10D 30/6757; H10D 62/121; H10D 62/122; H10D 1/716; H10D 48/30
See application file for complete search history.

(56) References Cited

U.S. PATENT DOCUMENTS

| | | | | |
|---|---|---|---|---|
| 2021/0057416 A1 | 2/2021 | Kim et al. | | |
| 2022/0130834 A1 | 4/2022 | Lee et al. | | |
| 2022/0149046 A1* | 5/2022 | Karda | .................... | H10B 12/30 |
| 2022/0254784 A1* | 8/2022 | Lee | ......................... | H10B 12/02 |
| 2022/0278105 A1* | 9/2022 | Karda | .................... | H10B 53/30 |

FOREIGN PATENT DOCUMENTS

| | | |
|---|---|---|
| KR | 10-2021-0075269 | 6/2021 |
| KR | 10-2022-0047047 | 4/2022 |
| KR | 10-2022-0166604 | 12/2022 |
| KR | 10-2022-0166618 | 12/2022 |

* cited by examiner

MEMORY DEVICE AND MANUFACTURING METHOD THEREOF

This application claims the priority of Korean Patent Application No. 10-2022-0180961, filed on Dec. 21, 2022, and 10-2022-0180972, filed on Dec. 21, 2022 in the KIPO (Korean Intellectual Property Office), the disclosure of which is incorporated herein entirely by reference. Further, this application is the National Stage application of International Application No. PCT/KR2023/018022, filed on Nov. 10, 2023, which designates the United States and was published in Korean. Each of these applications is hereby incorporated by reference in their entirety into the present application.

TECHNICAL FIELD

The present invention relates to semiconductor/electronic devices and manufacturing methods thereof, and more particularly, to memory devices and manufacturing methods thereof.

BACKGROUND ART

There is a continuous need to increase the performance of semiconductor devices and the degree of integration of semiconductor devices. Arranging unit cells of semiconductor devices two-dimensionally, that is, in a planar manner, is reaching its limit in increasing the degree of integration of semiconductor devices. Accordingly, the attempts are being made to develop technologies that greatly increase the degree of integration of semiconductor devices by three-dimensionally integrating the unit cells of the semiconductor devices. In this regard, the attempts to increase the integration degree of memory devices such as NAND devices or DRAM devices are being attempted in various forms. In addition, research and development are continuously being conducted to improve the performance and operating characteristics of memory devices.

Recently, attempts have been made to replace silicon-based semiconductors with amorphous oxide semiconductors to secure high mobility characteristics and low off-current characteristics. However, since oxide semiconductors have the disadvantage that it is vulnerable to etching damage, when they are applied to semiconductor devices, etching damage occurs during the patterning process, which causes the characteristics of the semiconductor devices to deteriorate and become unstable. In particular, the oxide semiconductors may be vulnerable to dry etching.

Furthermore, the properties of an oxide semiconductor may be deteriorated by a hydrogen $H_2$ process, and the properties may also be deteriorated due to a thermal process. In other words, when a subsequent hydrogen process or thermal process is performed after forming an oxide semiconductor, the oxide semiconductor may suffer damage due to hydrogen (i.e., $H_2$ damage) or damage due to heat (i.e., thermal damage).

DISCLOSURE OF THE INVENTION

Technical Problem

The technological object to be achieved by the present invention is to provide a memory device which may increase the degree of integration and realize excellent performance, and a manufacturing method thereof.

In addition, the technological object to be achieved by the present invention is to provide a manufacturing method of a memory device which may suppress property deterioration due to etching damage of a semiconductor material (e.g., oxide semiconductor material) and a memory device manufactured by the method.

In addition, the technological object to be achieved by the present invention is to provide a manufacturing method of a memory device which may prevent or minimize characteristic deterioration of a semiconductor material (e.g., oxide semiconductor material) due to etching damage, damage due to hydrogen $H_2$ process, damage due to thermal process, and the like, and a memory device manufactured by this method.

The object to be solved by the present invention is not limited to the objects mentioned above, and other objects not mentioned will be understood by those skilled in the art from the description below.

Technical Solution

According to one embodiment of the present invention, there is provided a manufacturing method of a memory device comprising: forming a stack including a first insulating layer, and a first sacrificial layer and a second insulating layer which are sequentially stacked on the first insulating layer; forming a patterned stack having at least one pattern portion having a first sacrificial layer pattern obtained from the first sacrificial layer by patterning the stack, wherein the pattern portion has a shape extending in a first direction, and empty spaces are provided on both sides of the pattern portion along a second direction perpendicular to the first direction; forming a structure including the patterned stack and an insulating material by filling the empty spaces on both sides of the at least one pattern portion with the insulating material; forming a first vertical hole penetrating through the first sacrificial layer pattern of the pattern portion in the structure; forming a horizontal hole extending in the first direction by removing the first sacrificial layer pattern exposed by the first vertical hole; forming a gate insulating material layer on inner surfaces of the first vertical hole and the horizontal hole, and forming a channel material layer filling the first vertical hole and the horizontal hole on the gate insulating material layer; forming a second vertical hole in a region corresponding to the first vertical hole in the structure where the gate insulating material layer and the channel material layer are formed; exposing the gate insulating material layer by removing the first and second insulating layers and the insulating material from a transistor formation region around the second vertical hole of the structure; defining a transistor including a word line by forming the word line surrounding the exposed portion of the gate insulating material layer in the transistor formation region; forming a first trench in a capacitor formation region adjacent to the transistor formation region of the structure; forming a first recess exposing the gate insulating material layer by removing the first and second insulating layers and the insulating material exposed by the first trench in the capacitor formation region; forming a mold insulating layer filling the first recess; forming a bit line connected to one end of the channel material layer in a region corresponding to the second vertical hole in the transistor formation region; and forming a second recess by removing the channel material layer and the gate insulating material layer from the capacitor formation region, forming an electrode member connected to the other end of the channel material layer on an inner surface of the second recess, and forming a capacitor including the electrode member, a dielectric layer, and a plate electrode by sequentially forming the dielectric layer and the plate electrode on the electrode member.

In the forming the horizontal hole, the entire first sacrificial layer pattern may be removed.

The first insulating layer, the second insulating layer, and the insulating material may include a silicon nitride, and the first sacrificial layer may include a silicon oxide.

The channel material layer may include an oxide semiconductor.

The defining the transistor by forming the word line may include forming a word line material layer surrounding the exposed portion of the gate insulating material layer in the transistor formation region; forming a through hole by etching a region corresponding to the second vertical hole in the word line material layer; recessing a portion of the word line material layer exposed through the through hole so that the one end of the channel material layer may protrude toward the through hole rather than the word line material layer; and forming a body insulating layer to fill the through hole.

The method may further include recessing a portion of the word line material layer exposed by the first recess after forming the first recess in the capacitor formation region.

The forming the bit line may include forming a third vertical hole in a region of the body insulating layer corresponding to the second vertical hole; and forming the bit line in the third vertical hole.

A step for forming an insertion insulating layer surrounding the exposed portion of the gate insulating material layer in the capacitor formation region after forming the first recess in the capacitor formation region may further included, the mold insulating layer may be formed to fill the first recess and the first trench on the insertion insulating layer, a step for forming a second trench in a region corresponding to the first trench in the mold insulating layer may further included, and the second recess may be formed by etching the channel material layer, the gate insulating material layer, and the insertion insulating layer exposed by the second trench.

The method may further include exposing an outer surface of the electrode member by etching the mold insulating layer after forming the electrode member, and the dielectric layer and the plate electrode may be sequentially formed after etching the mold insulating layer.

The stack may further include a second sacrificial layer and a third insulating layer sequentially stacked on the second insulating layer, and the stack may have a vertically symmetrical structure with respect to the second insulating layer.

The second insulating layer may have a thickness larger than that of each of the first insulating layer, the third insulating layer, the first sacrificial layer, and the second sacrificial layer.

The transistor may be a first transistor, the capacitor may be a first capacitor, and the memory device may further include a second transistor disposed on the first transistor and a second capacitor disposed on the first capacitor.

According to another embodiment of the present invention, there is provided a memory device comprising: a plurality of memory cells stacked in a vertical direction, wherein each of the plurality of memory cells includes a transistor and a capacitor electrically connected to the transistor in a lateral direction, the transistor includes a channel material layer, a word line surrounding the channel material layer, and a gate insulating layer disposed therebetween, the capacitor includes an electrode member electrically connected to the transistor, a dielectric layer disposed on a surface of the electrode member, and a plate electrode disposed on a surface of the dielectric layer, a bit line connected to a plurality of transistors of the plurality of memory cells, and extending in a vertical direction is provided, a body insulating layer surrounding at least a portion of an outer surface of the bit line between the bit line and the word line is provided, and a filling insulating layer which is a separate material layer from the body insulating layer is provided between two mutually adjacent word lines of the plurality of transistors.

The transistor may have a gate-all-around (GAA) structure.

The body insulating layer may have a line shape extending in the same direction as the word line when observed from above.

An insertion insulating layer surrounding a portion of the gate insulating layer adjacent to the electrode member and extending to cover a side surface of the word line may be further provided, and the insertion insulating layer may be a separate material layer from the body insulating layer and the filling insulating layer.

The body insulating layer may be in contact with a first side surface of the filling insulating layer, and the insertion insulating layer may be in contact with a second side surface of the filling insulating layer.

The insertion insulating layer may be an atomic layer deposition (ALD) material layer.

According to another embodiment of the present invention, there is provided manufacturing method of a memory device comprising: forming a stack including a first insulating layer, and a first sacrificial layer and a second insulating layer which are sequentially stacked on the first insulating layer; forming a patterned stack having at least one pattern portion having a first sacrificial layer pattern obtained from the first sacrificial layer by patterning the stack, wherein the pattern portion has a shape extending in a first direction, and empty spaces are provided on both sides of the pattern portion along a second direction perpendicular to the first direction; forming a structure including the patterned stack and an insulating material by filling the empty spaces on both sides of the at least one pattern portion with the insulating material; forming a first vertical hole penetrating through the first sacrificial layer pattern of the pattern portion in the structure; forming a horizontal hole extending in the first direction by removing the first sacrificial layer pattern exposed by the first vertical hole; forming a gate insulating material layer on inner surfaces of the first vertical hole and the horizontal hole, and forming a dummy channel material layer to fill the first vertical hole and the horizontal hole on the gate insulating material layer; forming a second vertical hole in a region corresponding to the first vertical hole in the structure where the gate insulating material layer and the dummy channel material layer are formed; exposing the gate insulating material layer by removing the first and second insulating layers and the insulating material from a transistor formation region around the second vertical hole of the structure; forming a word line surrounding the exposed portion of the gate insulating material layer in the transistor formation region; forming a first trench in a capacitor formation region adjacent to the transistor formation region of the structure; forming a first recess exposing the gate insulating material layer by removing the first and second insulating layers and the insulating material exposed by the first trench in the capacitor formation region; forming a mold insulating layer filling the first recess; forming a second recess by removing the dummy channel material layer and the gate insulating material layer from the capacitor formation region, forming an electrode member on an inner surface of the second recess, and forming a capacitor including the electrode member, a dielectric layer, and a plate electrode by sequentially forming the dielectric layer and the plate electrode on the electrode member; forming an empty channel space by removing the dummy channel material layer from the transistor formation region, and forming a channel material layer connected to the capacitor in the empty channel space to define a transistor including the channel material layer; and forming a bit line connected to the channel material layer.

The first insulating layer, the second insulating layer, and the insulating material may include a silicon nitride, and the first sacrificial layer may include a silicon oxide.

The dummy channel material layer may include polysilicon (poly-Si).

The channel material layer may include an oxide semiconductor.

The forming the word line may include forming a word line material layer surrounding the exposed portion of the gate insulating material layer in the transistor formation region; forming a through hole by etching a region corresponding to the second vertical hole in the word line material layer; recessing a portion of the word line material layer exposed through the through hole so that one end of the dummy channel material layer may protrude toward the through hole rather than the word line material layer; and forming a body insulating layer to fill the through hole.

The method may further include recessing a portion of the word line material layer exposed by the first recess after forming the first recess in the capacitor formation region.

The forming the empty channel space and forming the channel material layer may include forming a third vertical hole in a region of the body insulating layer corresponding to the second vertical hole; forming the empty channel space by removing the dummy channel material layer exposed by the third vertical hole; and forming the channel material layer in the empty channel space and the third vertical hole.

The forming the bit line may include reforming the third vertical hole by removing a portion of the channel material layer formed in the third vertical hole; and forming the bit line in the reformed third vertical hole.

A step for forming an insertion insulating layer surrounding the exposed portion of the gate insulating material layer in the capacitor formation region after forming the first recess in the capacitor formation region may further included, wherein the mold insulating layer may be formed to fill the first recess and the first trench on the insertion insulating layer, and a step for forming a second trench in a region corresponding to the first trench in the mold insulating layer may further included, and the second recess may be formed by etching the dummy channel material layer, the gate insulating material layer, and the insertion insulating layer exposed by the second trench.

The stack may further include a second sacrificial layer and a third insulating layer sequentially stacked on the second insulating layer, and the stack may have a vertically symmetrical structure with respect to the second insulating layer.

The second insulating layer may have a thickness larger than that of each of the first insulating layer, the third insulating layer, the first sacrificial layer, and the second sacrificial layer.

The transistor may be a first transistor, the capacitor may be a first capacitor, and the memory device may be formed to include a second transistor disposed on the first transistor and a second capacitor disposed on the first capacitor.

According to another embodiment of the present invention, there is provided a memory device comprising: a plurality of memory cells stacked in a vertical direction, and wherein each of the plurality of memory cells includes a transistor and a capacitor electrically connected to the transistor in a lateral direction, the transistor includes a channel material layer, a word line surrounding the channel material layer, and a gate insulating layer disposed therebetween, the capacitor includes an electrode member electrically connected to the transistor, a dielectric layer disposed on a surface of the electrode member, and a plate electrode disposed on a surface of the dielectric layer, a bit line connected to a plurality of transistors of the plurality of memory cells, and extending in a vertical direction is provided, a body insulating layer surrounding at least a portion of an outer surface of the bit line between the bit line and the word line is provided, the body insulating layer has a line shape extending in the same direction as the word line when observed from above, and a filling insulating layer is provided between two mutually adjacent word lines of the plurality of transistors.

The transistor may have a gate-all-around (GAA) structure.

An insertion insulating layer surrounding a portion of the gate insulating layer adjacent to the electrode member and extending to cover a side surface of the word line may be further provided, and the insertion insulating layer may be a separate material layer from the body insulating layer and the filling insulating layer.

The body insulating layer may be in contact with a first side surface of the filling insulating layer, and the insertion insulating layer may be in contact with a second side surface of the filling insulating layer.

The insertion insulating layer may be an atomic layer deposition (ALD) material layer.

Advantageous Effects

According to embodiments of the present invention, a stack-type memory device which may improve integration degree and have excellent performance and operation characteristics may be implemented. In particular, according to embodiments of the present invention, after patterning a sacrificial layer according to a given method, a semiconductor material (e.g., oxide semiconductor material) may be later formed in a region (space) from which the pattern of the sacrificial layer was removed. Thus, a manufacturing method of a stack-type memory device which may suppress/prevent property deterioration due to etch damage of a semiconductor material (e.g., oxide semiconductor material) may be implemented.

In addition, according to the embodiments of the present invention, it is possible to implement a manufacturing method of a memory device which may prevent or minimize property deterioration of a semiconductor material (e.g., oxide semiconductor material) due to etching damage, damage due to a hydrogen $H_2$ process, damage due to a thermal process, and the like. For example, according to the embodiments of the present invention, after patterning a sacrificial layer according to a given method, a dummy material is formed in a region (space) where the pattern of the sacrificial layer was removed, and then, when the manufacturing of the device is almost completed, by replacing the dummy material with an effective semiconductor material (e.g., oxide semiconductor material), a manufacturing method of a stack-type memory device which may prevent or minimize property deterioration due to etching damage, damage due to hydrogen $H_2$ damage, damage due to heat, and the like for an effective semiconductor material (e.g., oxide semiconductor material) may be implemented.

According to one example, the stack-type memory device may be configured to include a horizontal stack-type DRAM device.

However, the effects of the present invention are not limited to the above effects and may be expanded in various ways without departing from the technological spirit and scope of the present invention.

BRIEF DESCRIPTION OF THE DRAWINGS

FIG. 1A to FIG. 26A are cross-sectional diagrams for explaining an example of a manufacturing method of a memory device according to an embodiment of the present invention.

FIG. 1B to FIG. 26B are diagrams for explaining an example of a manufacturing method of a memory device according to an embodiment of the present invention.

FIG. 1C to FIG. 19C are cross-sectional diagrams for explaining an example of a manufacturing method of a memory device according to an embodiment of the present invention.

BEST MODE FOR CARRYING OUT THE INVENTION

Figure 1A:
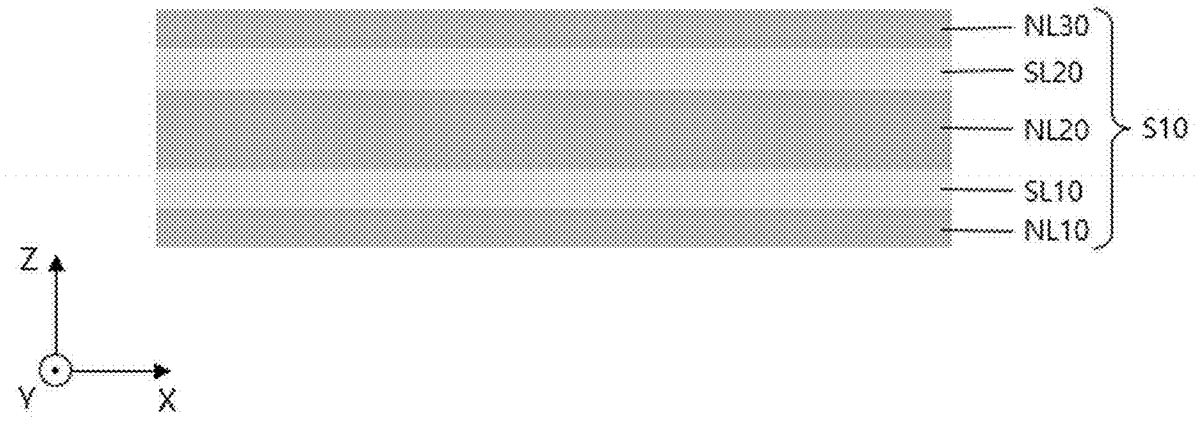

Hereinafter, the embodiments of the present invention will be described in detail with reference to the accompanying drawings.

The embodiments of the present invention to be described below are provided to more clearly explain the present invention to those skilled in the art, and the scope of the present invention is not limited by the following embodiments, and the embodiments may be modified in many different forms.

The terms used in this specification are used to describe specific embodiments and are not intended to limit the present invention. The terms indicating a singular form used herein may include plural forms unless the context clearly indicates otherwise. Also, as used herein, the terms, "comprise" and/or "comprising" specify the presence of the stated shape, step, number, operation, member, element, and/or group thereof and does not exclude the presence or addition of one or more other shapes, steps, numbers, operations, elements, elements and/or groups thereof. In addition, the term, "connection" used in this specification means not only a direct connection of certain members, but also a concept including an indirect connection in which other members are interposed between the members.

In addition, in the description of this specification, the descriptions such as "first" and "second", "upper or top", and "lower or bottom" are intended to distinguish members, and not used to limit the members themselves or mean a specific order, but rather a relative positional relationship among them, and does not limit specific cases where the other members are directly contacted with the described configuring members or another member is introduced into the interface between them. The same interpretation may be applied to other expressions which describe relationships between the configuring components.

In addition, in the present specification, when a member is said to be located "on" another member, this arrangement includes not only a case in which a member is in contact with another member, but also a case where another member exists between the two members. As used herein, the term, "and/or" includes any one and all combinations of one or more of the listed items. In addition, the terms of degree such as "about" and "substantially" used in the present specification are used as a range of values or degrees, or as a meaning close thereto, taking into account inherent manufacturing and material tolerances, and exact or absolute figures provided to aid in the understanding of this application are used to prevent the infringers from unfairly exploiting the stated disclosure.

Hereinafter, embodiments of the present invention will be described in detail with reference to the accompanying drawings. a size or a thickness of areas or parts shown in the accompanying drawings may be slightly exaggerated for clarity of the specification and convenience of description. The same reference numbers indicate the same configuring elements throughout the detailed description.

FIG. 1A to FIG. 26B are diagrams for explaining an example of a manufacturing method of a memory device (stack-type memory device) according to an embodiment of the present invention.

The same numbers (e.g., FIG. 1 in FIGS. 1A, 1B, and 1C) in FIG. 1A to FIG. 26B refer to the same steps. FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, and 26A are cross-sectional diagrams cut along the X-Z plane. FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, and 26B are plan diagrams when observed from above (i.e., top-view) or cross-sectional views cut along the X-Y plane (i.e., Z-cut view). FIGS. 1C, 2C, 3C, 4C, 5C, 6C, 7C, 8C, 9C, 10C, 11C, 12C, 13C, 14C, 15C, 16C, 17C, 18C and 19C are cross-sectional diagrams cut along the Y-Z plane.

Figure 1B:
Figure 1C:
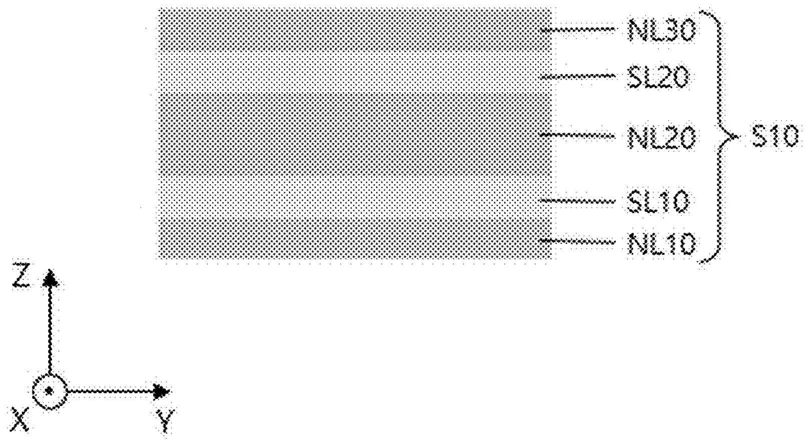

Referring to FIG. 1A to FIG. 1C, a stack S10 may be formed on a predetermined substrate (not shown). The material of the substrate may be selected from a variety of materials. The substrate may be formed by including a semiconductor material or an insulating material. The substrate may include a semiconductor wafer. The substrate may include a bulk silicon substrate, a silicon-on-insulator (SOI) substrate, a germanium substrate, or a germanium-on-insulator (GOI), a silicon-germanium substrate, or a substrate formed by an epitaxial growth process.

The stack S10 may be formed on the substrate. The stack S10 may include a first insulating layer NL10, and a first sacrificial layer SL10 and a second insulating layer NL20 which are sequentially stacked on the first insulating layer NL10. As a non-limiting example, the first insulating layer NL10 and the second insulating layer NL20 may include a silicon nitride (e.g., $SiN_x$) or may be formed of a silicon nitride (e.g., $SiN_x$). As a non-limiting example, the first sacrificial layer SL10 may include a silicon oxide (e.g., $SiN_2$) or may be formed of a silicon oxide (e.g., $SiN_x$). The first insulating layer NL10 and the first sacrificial layer SL10 may have an etching selectivity, and similarly, the second insulating layer NL20 and the first sacrificial layer SL10 may have an etching selectivity. The first insulating layer NL10, first sacrificial layer SL10, and second insulating layer NL20 may be formed through a deposition process.

Furthermore, according to one embodiment, the stack S10 may further include a second sacrificial layer SL20 and a third insulating layer NL30 sequentially stacked on the second insulating layer NL20. In this case, the stack S10 may have a vertically symmetrical structure with respect to the second insulating layer NL20. The second sacrificial layer SL20 may be formed of the same material as the first sacrificial layer SL10, and the third insulating layer NL30 may be formed of the same material as the first insulating layer NL10 and/or the second insulating layer NL20. The second sacrificial layer SL20 and the third insulating layer NL30 may be formed through a deposition process.

The second insulating layer NL20 may have a thickness greater than that of each of the first insulating layer NL10, the third insulating layer NL30, the first sacrificial layer SL10, and the second sacrificial layer SL20. For example, the second insulating layer NL20 may have a thickness which is about 1.5 times to about 2.5 times greater than the thickness of each of the first insulating layer NL10, the third insulating layer NL30, the first sacrificial layer SL10, and the second sacrificial layer SL20. It is possible to secure a gap between upper and lower cells to be formed later by forming the second insulating layer NL20 relatively thick. The first insulating layer NL10 and the third insulating layer NL30 may have the same thickness or substantially the same thickness. The first sacrificial layer SL10 and the second sacrificial layer SL20 may have the same thickness or substantially the same thickness. The first insulating layer NL10, the third insulating layer NL30, the first sacrificial layer SL10, and the second sacrificial layer SL20 may have the same thickness or substantially the same thickness.

Figure 2A:
Figure 2B:
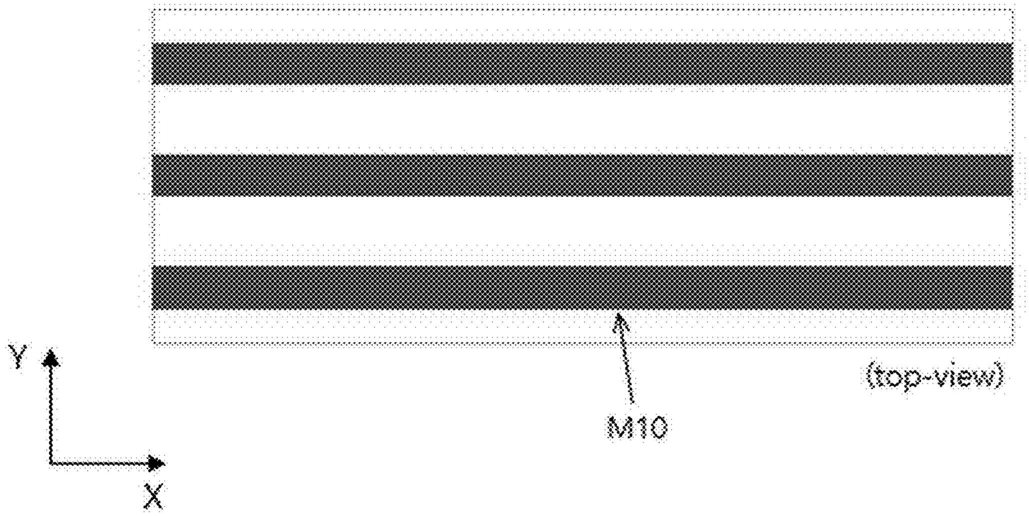
Figure 2C:
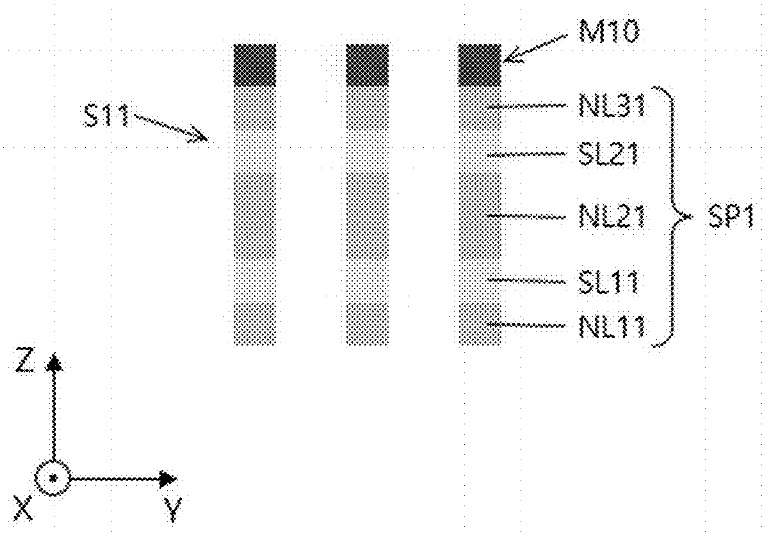

Referring to FIG. 2A to FIG. 2C, the stack (S10 in FIG. 1A) may be patterned to form a patterned stack S11 having at least one pattern portion SP1. The pattern portion SP1 may have a shape extending in a first direction, for example, the X-axis direction, and empty spaces may be provided on both sides of the pattern portion SP1 along a second direction perpendicular to the first direction, for example, the Y-axis direction. A plurality of pattern portions SP1 may be spaced apart in the Y-axis direction and arranged side by side in the X-axis direction. In this step, remaining regions except for the region extending from a channel region to be formed later may be removed by patterning.

The pattern portion SP1 may include a patterned first insulating layer NL11, a patterned first sacrificial layer SL11, a patterned second insulating layer NL21, a patterned second sacrificial layer SL21, and a patterned third insulating layer NL31. Here, the patterned first sacrificial layer SL11 may be referred to as the first sacrificial layer pattern SL11 obtained from the first sacrificial layer (SL10 in FIG. 1A). Furthermore, the patterned second sacrificial layer SL21 may be referred to as the second sacrificial layer pattern SL21 obtained from the second sacrificial layer (SL20 in FIG. 1A). A plurality of first sacrificial layer patterns SL11 may be spaced apart from each other in the Y-axis direction and extend parallel to each other in the X-axis direction. Similarly, a plurality of second sacrificial layer patterns SL21 may be spaced apart from each other in the Y-axis direction, and may extend side by side in the X-axis direction. Each of the first sacrificial layer patterns SL11 and the second sacrificial layer patterns SL21 may have a line shape.

A first mask pattern M10 disposed on the stack (S10 in FIG. 1A) may be used for a patterning process of FIG. 2A to FIG. 2C. The first mask pattern M10 may have a predetermined pattern structure. The first mask pattern M10 may be, for example, a photoresist pattern. After the patterning process, the first mask pattern M10 may be removed.

Figure 3A:
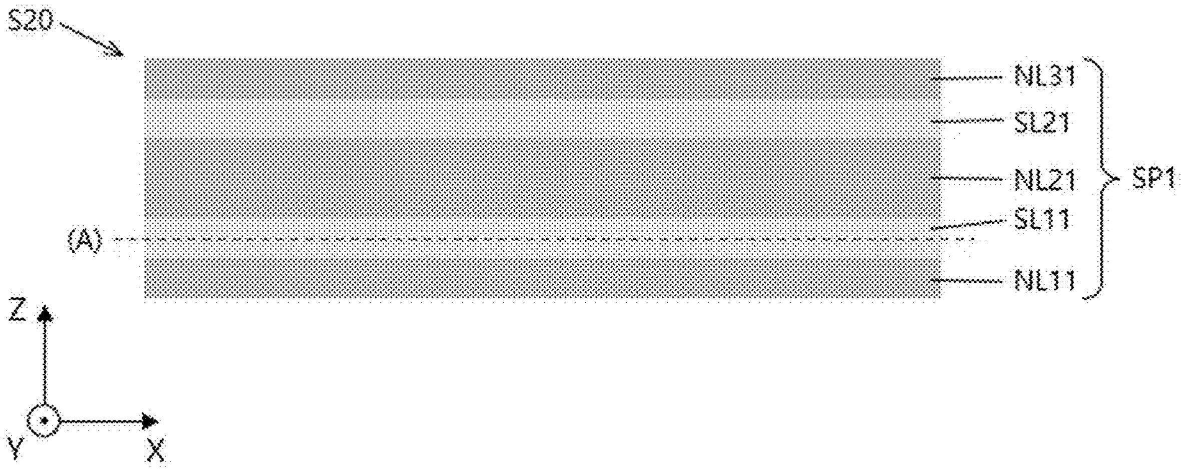
Figure 3B:
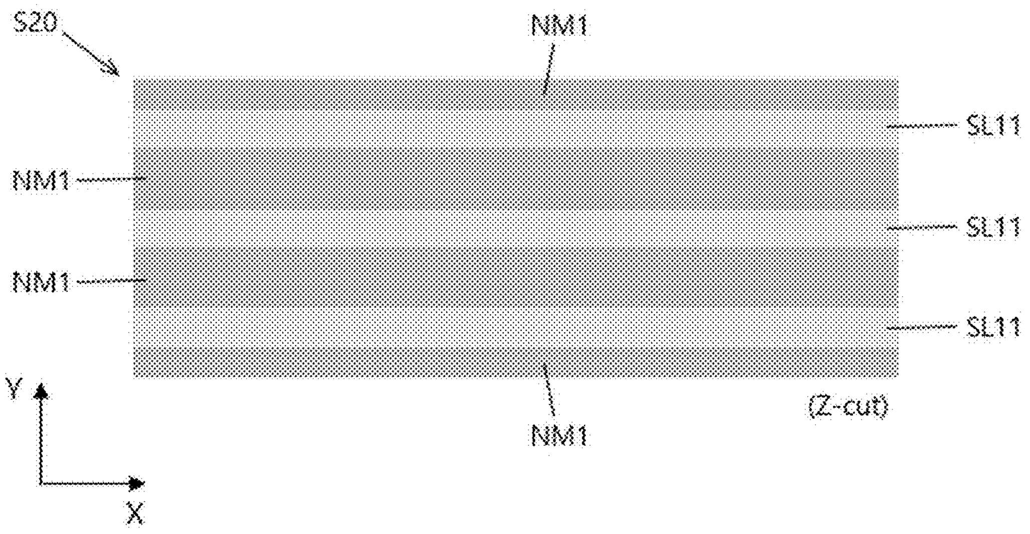
Figure 3C:
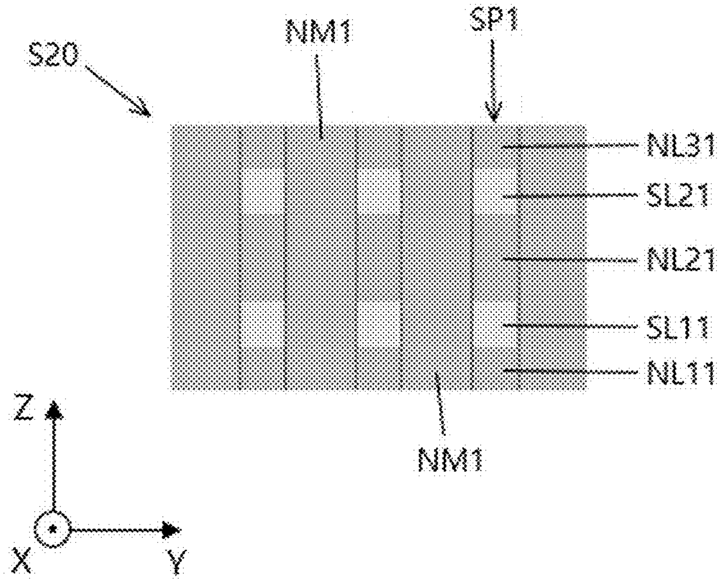

Referring to FIG. 3A to FIG. 3C, a structure S20 including the patterned stack (S11 in FIG. 2A) and an insulating material NM1 may be formed by filling the empty spaces on both sides of at least one pattern portion SP1 with the insulating material NM1. Here, FIG. 3B may be a cross-sectional view taken along line (A) of FIG. 3A.

The insulating material NM1 may be referred to as an 'insulating material layer' or an 'insulating material layer pattern', and may have the same (or substantially the same) height as the pattern portion SP1. The insulating material NM1 may be formed of the same material as the first to third insulating layers NL11, NL21, and NL31. For example, the insulating material NM1 may include a silicon nitride (e.g., $SiN_x$) or may be formed of a silicon nitride (e.g., $SiN_x$). Accordingly, a plurality of first sacrificial layer patterns SL11 and a plurality of second sacrificial layer patterns SL21 formed of a second material may be disposed in a matrix material layer formed of a first material, and the second material may have an etching selectivity with respect to the first material.

Figure 4A:
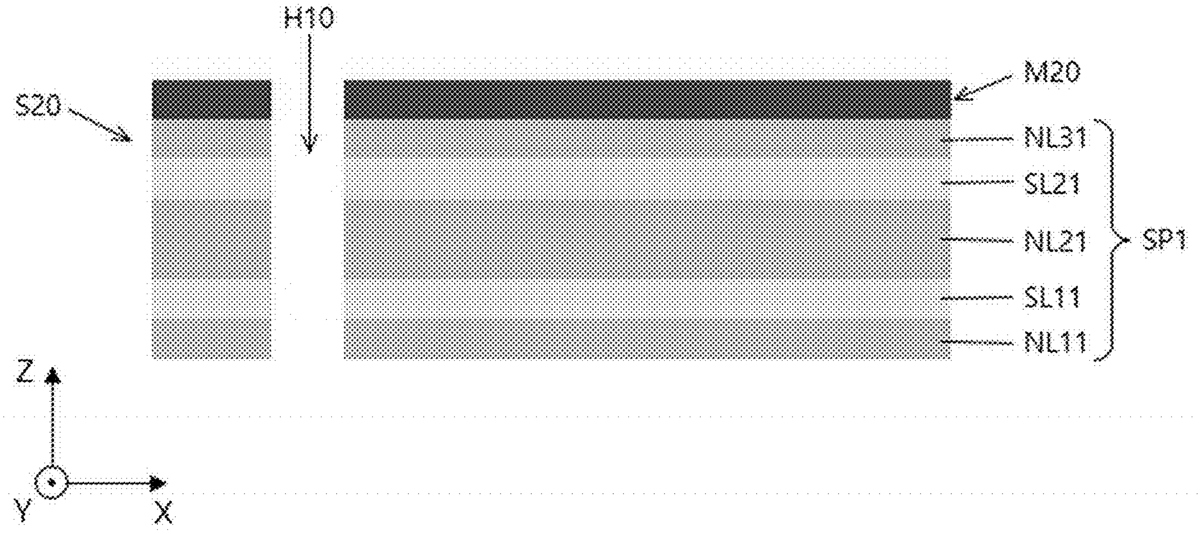
Figure 4B:
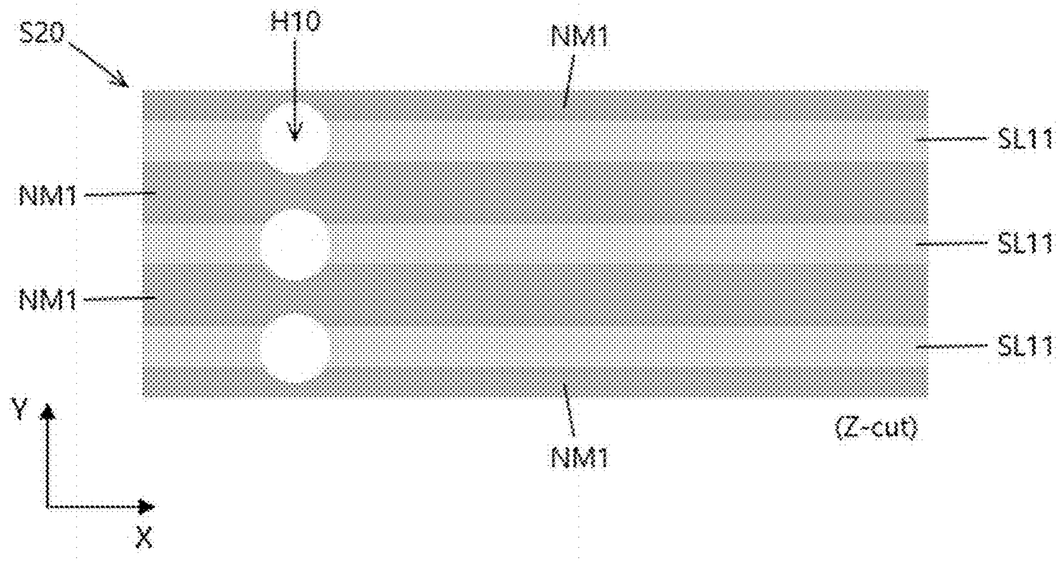
Figure 4C:
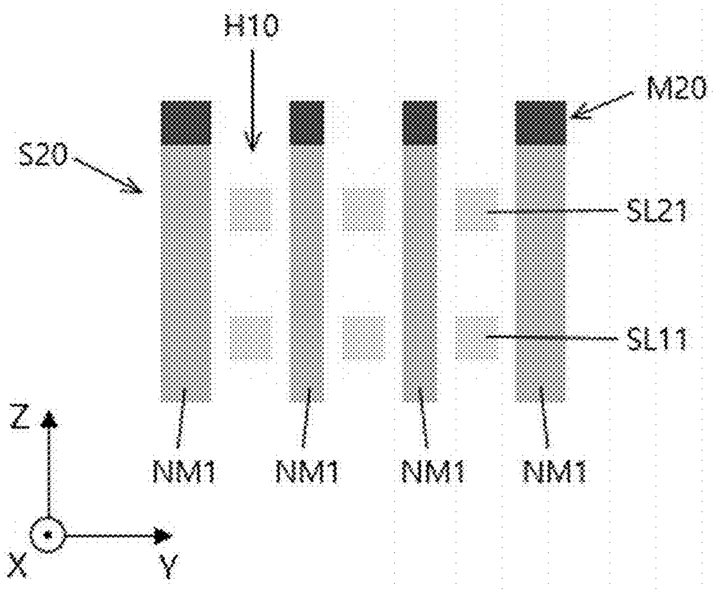

Referring to FIG. 4A to 4C, a first vertical hole H10 penetrating the first sacrificial layer pattern SL11 of the pattern portion SP1 may be formed in the structure S20. The first vertical hole H10 may be formed to penetrate through the second sacrificial layer pattern S21 and the first sacrificial layer pattern S11. The first vertical hole H10 may be formed to penetrate from the third insulating layer NL31 to the first insulating layer NL11 of the pattern portion SP1 in a predetermined region of the structure S20. The first vertical hole H10 may correspond to a region where a bit line will be formed later. The first vertical hole H10 may be formed in a region of the structure S20 where a transistor will be formed, that is, a transistor formation region (a transistor formation planned region). A plurality of first vertical holes H10 may be formed to be spaced apart from each other in the Y-axis direction. As the first vertical hole H10 is formed, the side surfaces of the first sacrificial layer pattern S11 and the second sacrificial layer pattern S21 may be exposed.

A second mask pattern M20 may be used to form the first vertical hole H10. The second mask pattern M20 may have a predetermined opening pattern. The second mask pattern M20 may be, for example, a photoresist pattern. The second mask pattern M20 may be removed after forming the first vertical hole H10.

Figure 5A:
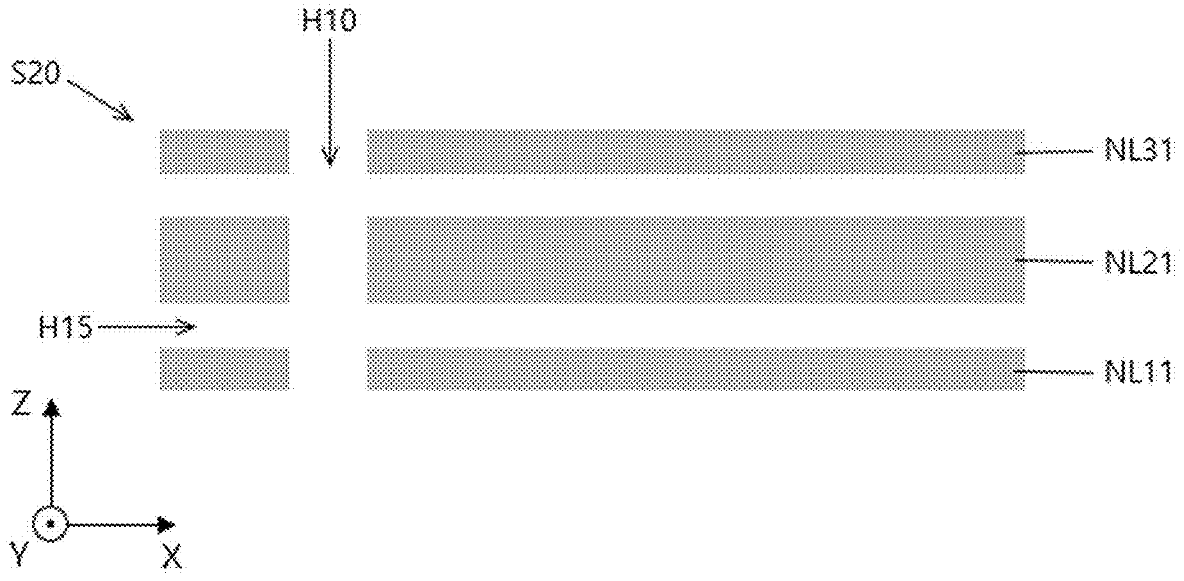
Figure 5B:
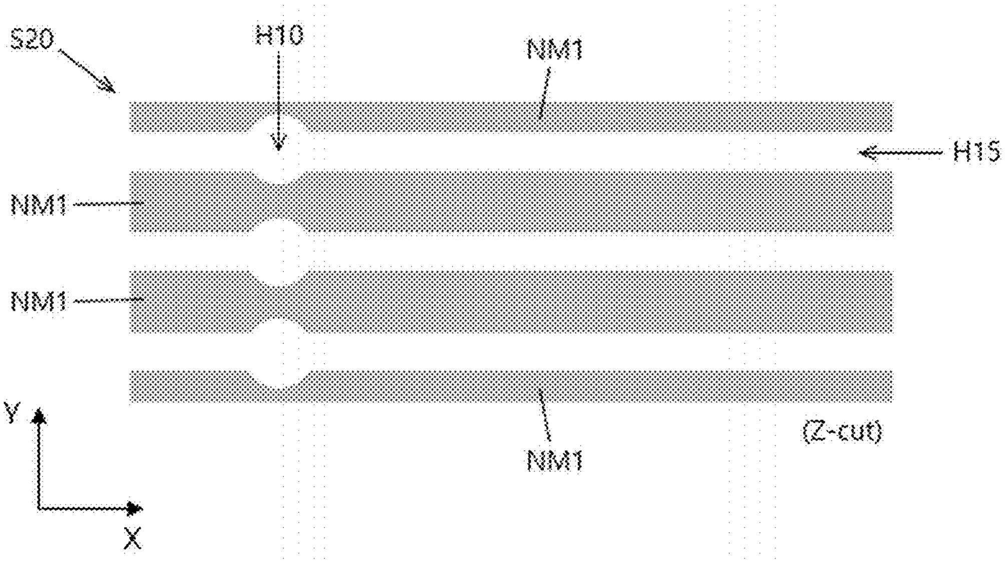
Figure 5C:
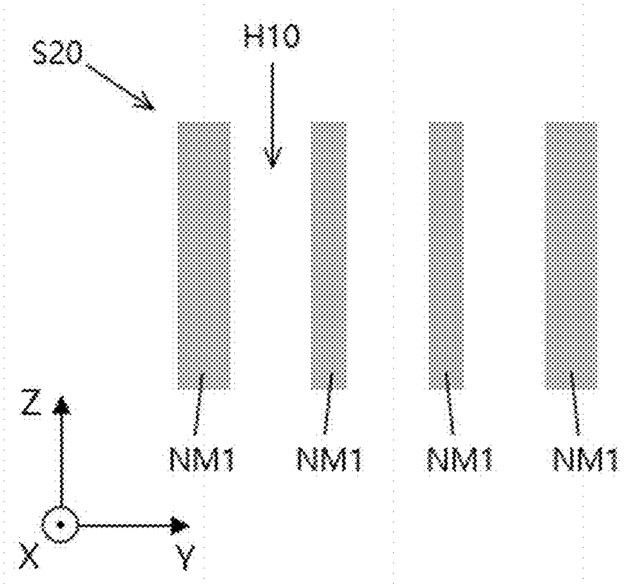

Referring to FIG. 5A to FIG. 5C, a horizontal hole H15 extending in the first direction, for example, the X-axis direction, may be formed by removing the first sacrificial layer pattern (SL11 in FIG. 4A) and the second sacrificial layer pattern (SL21 in FIG. 4A) exposed by the first vertical hole H10. The first sacrificial layer (SL11 in FIG. 4A) and the second sacrificial layer pattern (SL21 in FIG. 4A) may be selectively removed by using a wet etching process using a wet etchant having etching selectivity for the first sacrificial layer pattern (SL11 in FIG. 4A) and the second sacrificial layer pattern (SL21 in FIG. 4A). The horizontal hole H15 formed by removing the first sacrificial layer pattern (SL11 in FIG. 4A) may be referred to as a first horizontal hole, and the horizontal hole H15 formed by removing the second sacrificial layer pattern (SL21 in FIG. 4A) may be referred to as a second horizontal hole. The horizontal hole H15 may have a line shape extending in the X-axis direction.

According to one embodiment, in the step for forming the horizontal hole H15, the entire first sacrificial layer pattern (SL11 in FIG. 4A) may be removed. Furthermore, in the step for forming the horizontal hole H15, the entire second sacrificial layer pattern (SL21 in FIG. 4A) may be removed. Accordingly, the horizontal hole H15 may be formed to extend not only to a region where a transistor will be formed (i.e., a transistor formation region) but also to a region where a capacitor will be formed (i.e., a capacitor formation region). In this step, when the entire first sacrificial layer pattern (SL11 in FIG. 4A) and the entire second sacrificial layer pattern (SL21 in FIG. 4A) are removed, an effect that the process is simplified may be obtained in connection with this removal.

Figure 6A:
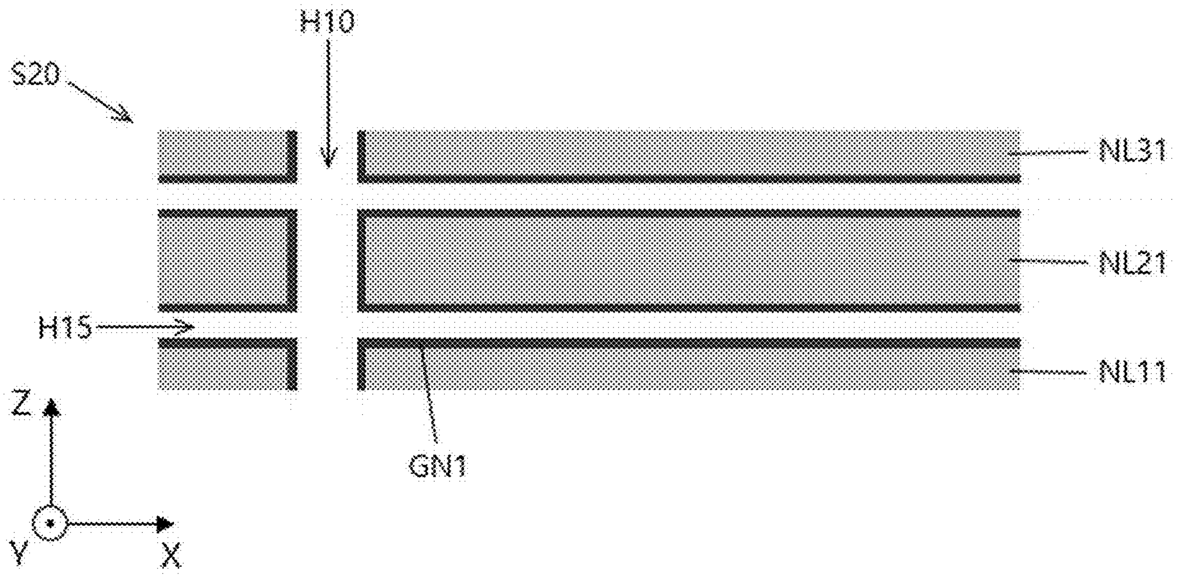
Figure 6B:
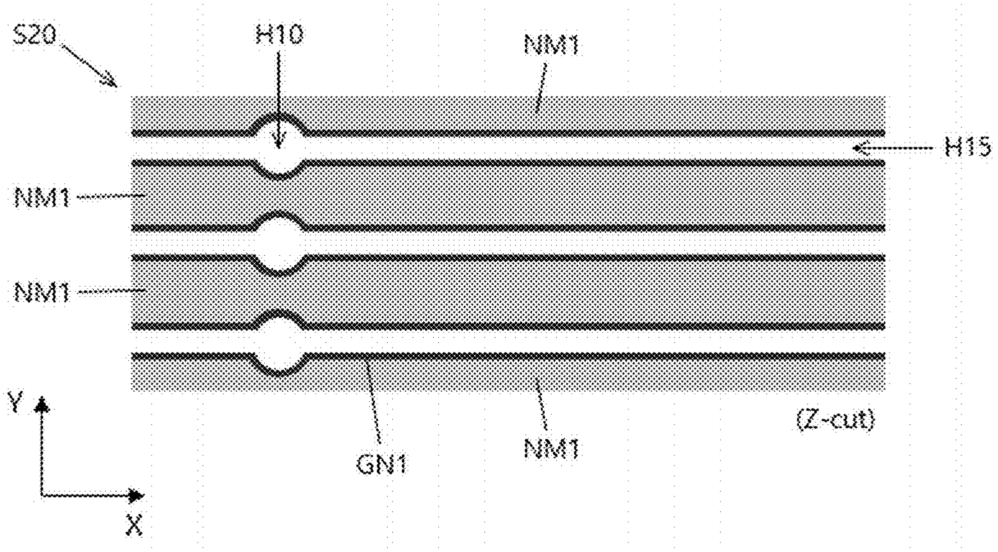
Figure 6C:
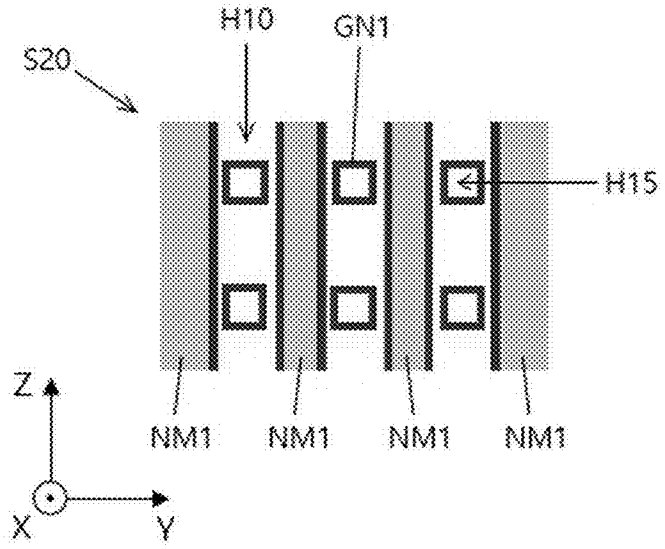

Referring to FIG. 6A to FIG. 6C, a gate insulating material layer GN1 may be formed on inner surfaces of the first vertical hole H10 and the first horizontal hole H15. The gate insulating material layer GN1 may be formed conformally according to the shape of the inner surfaces of the first vertical hole H10 and the horizontal hole H15. The gate insulating material layer GN1 may be formed, for example, through an atomic layer deposition (ALD) process. The gate insulating material layer GN1 may be formed to include at least any one selected from a silicon oxide, a silicon nitride, a silicon oxynitride, and a high-k material. Here, the high-k material may be a material with a higher dielectric constant than that of a silicon nitride. The specific material of the gate insulating material layer GN1 is not limited to the above and may vary in various ways. The gate insulating material layer GN1 may be formed so thin that it may not fill the interior of the first vertical hole H10 and the horizontal hole H15. In the steps of FIG. 6A to FIG. 6C, since the gate insulating material layer GN1 may be formed without a patterning process by dry etching, the effects that etching damage and property deterioration for the gate insulating material layer GN1 are prevented or suppressed may be obtained.

Figure 7A:
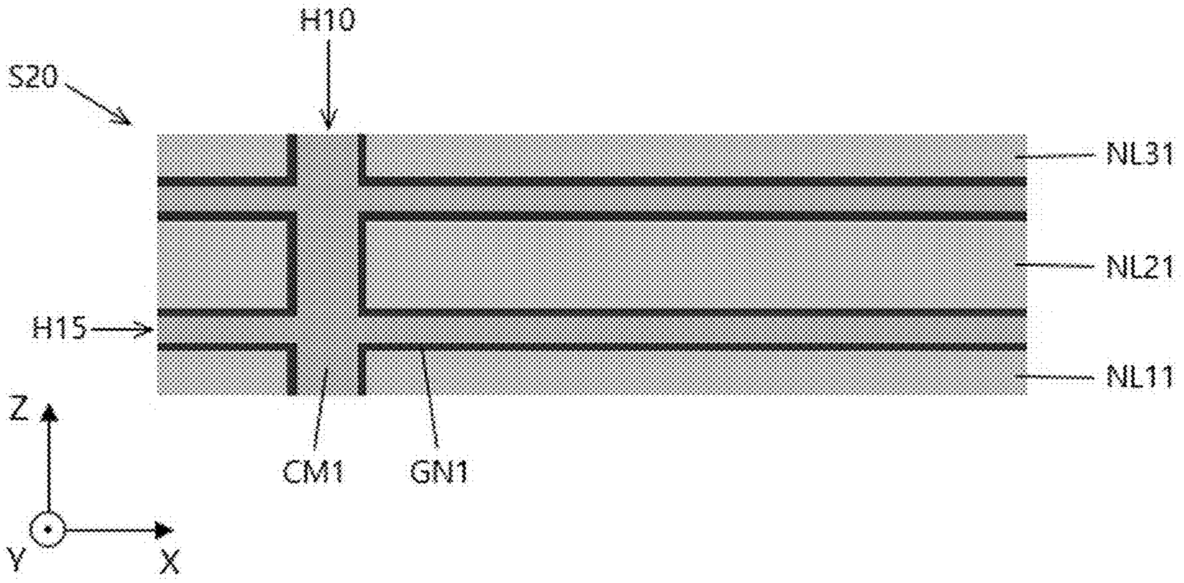
Figure 7B:
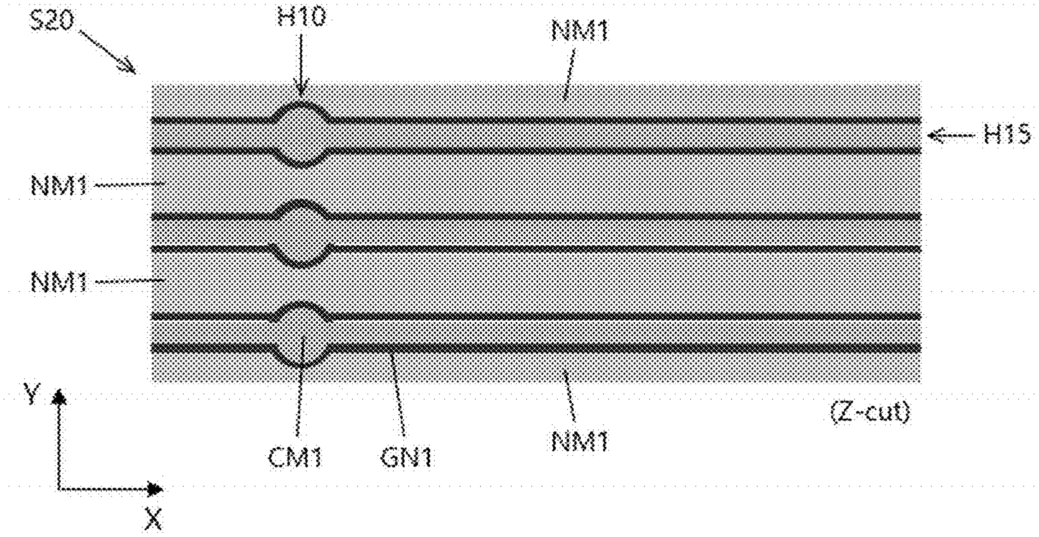
Figure 7C:
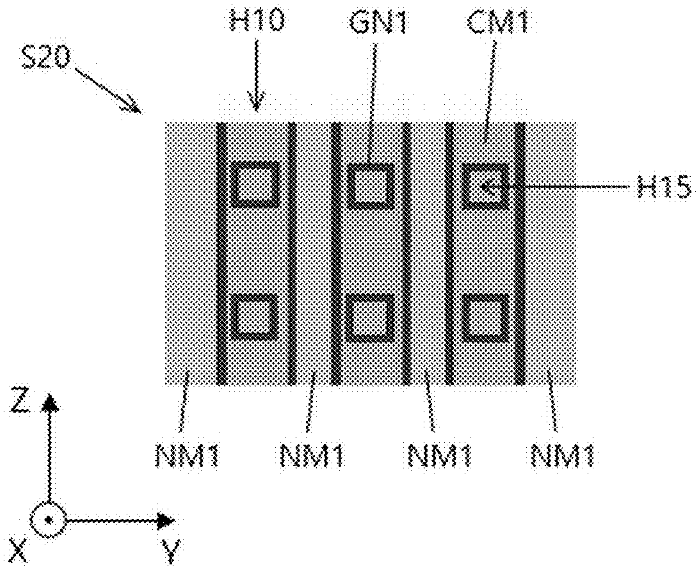

Referring to FIG. 7A to FIG. 7C, a channel material layer CM1 filling the first vertical hole H10 and the horizontal hole H15 may be formed on the gate insulating material layer GN1. The channel material layer CM1 may be formed, for example, through an ALD process. The channel material layer CM1 may include at least one of various semiconductor materials. The channel material layer CM1 may include an oxide semiconductor or a non-oxide semiconductor. The oxide semiconductor may include an amorphous oxide semiconductor (AOS). For example, the oxide semiconductor may include at least any one selected from the group consisting of indium gallium zinc oxide (IGZO), zinc tin oxide (ZTO), and indium tin oxide (ITO). However, the specific material of the channel material layer CM1 is not limited to the above and may vary in various ways. The channel material layer CM1 may be a single layer or a multilayer.

When the channel material layer CM1 is formed of the oxide semiconductor, the effects that high mobility characteristics and low off-current characteristics are secured may be obtained. However, since oxide semiconductors have a disadvantage that it is vulnerable to etching damage, in a general semiconductor device manufacturing process, etching damage occurs in the oxide semiconductor due to the patterning process, which causes the characteristics of the semiconductor device to deteriorate and become unstable. In particular, the oxide semiconductors may be vulnerable to dry etching. However, in an embodiment of the present invention, after forming the patterned horizontal hole H15 by using the sacrificial layer pattern (SL11, SL21 in FIG. 3A), the channel material layer CM1 is formed by filling the patterned horizontal hole H15 with a channel material. Thus, the channel material layer CM1 may be formed without a patterning process such as dry etching. Therefore, even if an oxide semiconductor is applied to the channel material layer CM1, etching damage due to dry etching/patterning may be prevented or suppressed, and as a result, a memory device with excellent characteristics may be implemented.

In addition, even in the process for forming the gate insulating material layer GN1 described above with reference to FIG. 6A to 6C, the gate insulating material layer GN1 may be formed without a patterning process by dry etching. Therefore, the effect that etching damage and property deterioration for the gate insulating material layer GN1 are prevented or suppressed may be obtained.

Figure 8A:
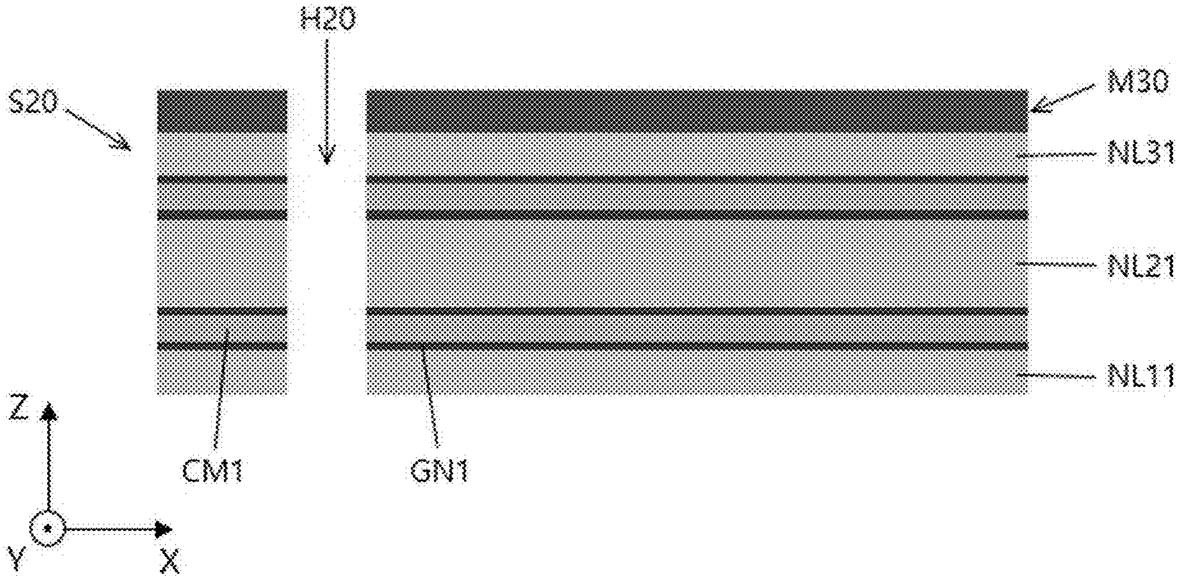
Figure 8B:
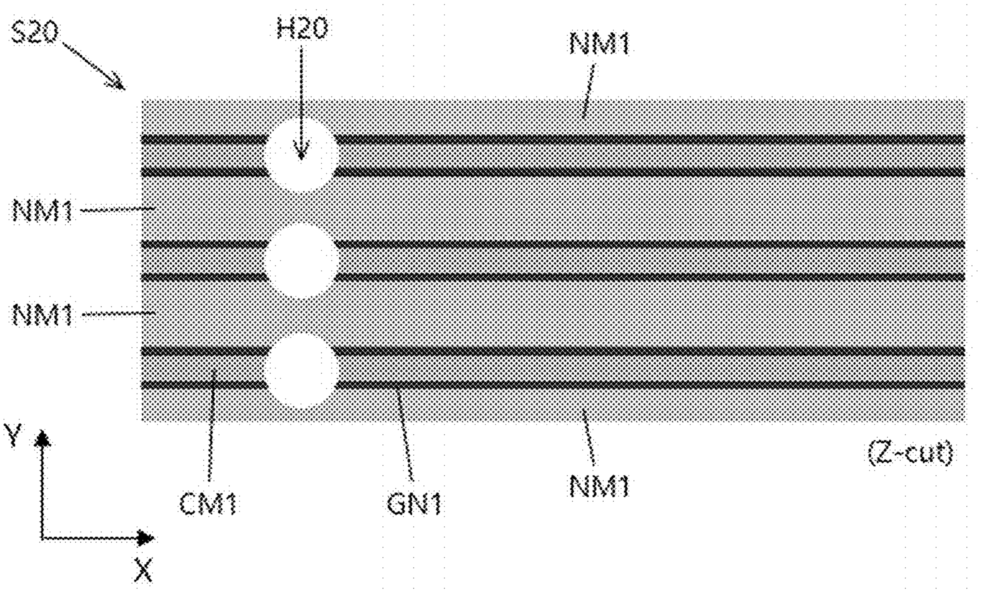
Figure 8C:
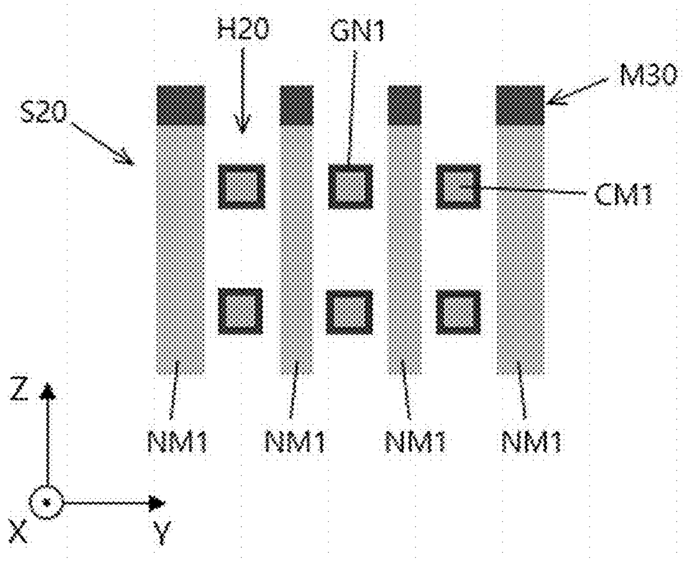

Referring to FIG. 8A to 8C, in the structure S20 in which the gate insulating material layer GN1 and the channel material layer CM1 are formed, a second vertical hole H20 may be formed in a region corresponding to the first vertical hole (H10 in FIG. 7A). The second vertical hole H20 may be formed to penetrate from the third insulating layer NL31 to the first insulating layer NL11.

A third mask pattern M30 may be used to form the second vertical hole H20. The third mask pattern M30 may have a predetermined opening pattern. The third mask pattern M30 may be, for example, a photoresist pattern. The third mask pattern M30 may be removed after forming the second vertical hole H20.

Figure 9A:
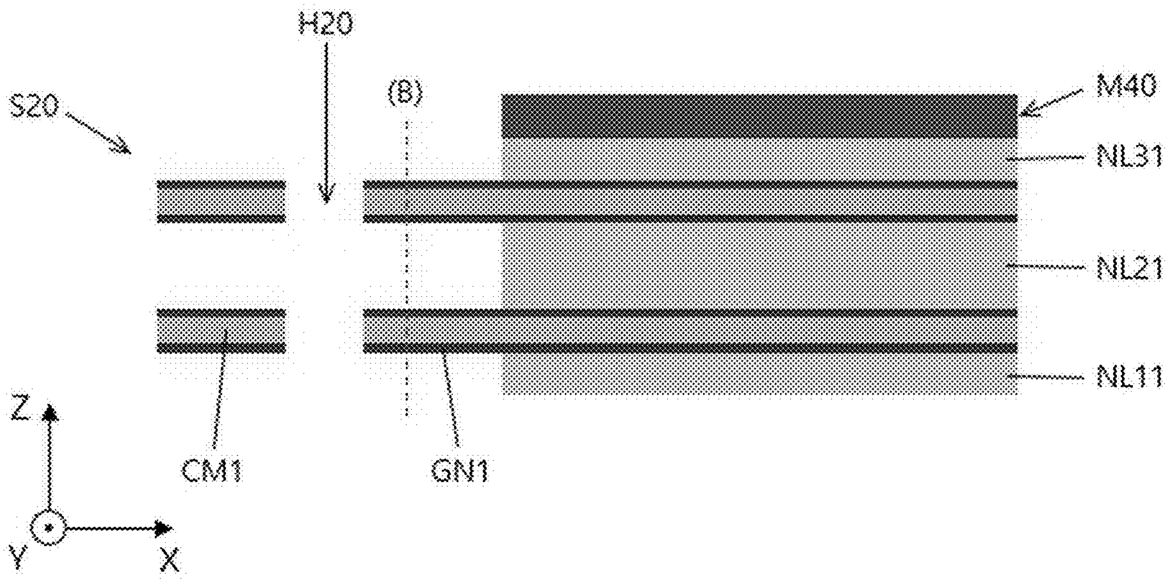
Figure 9B:
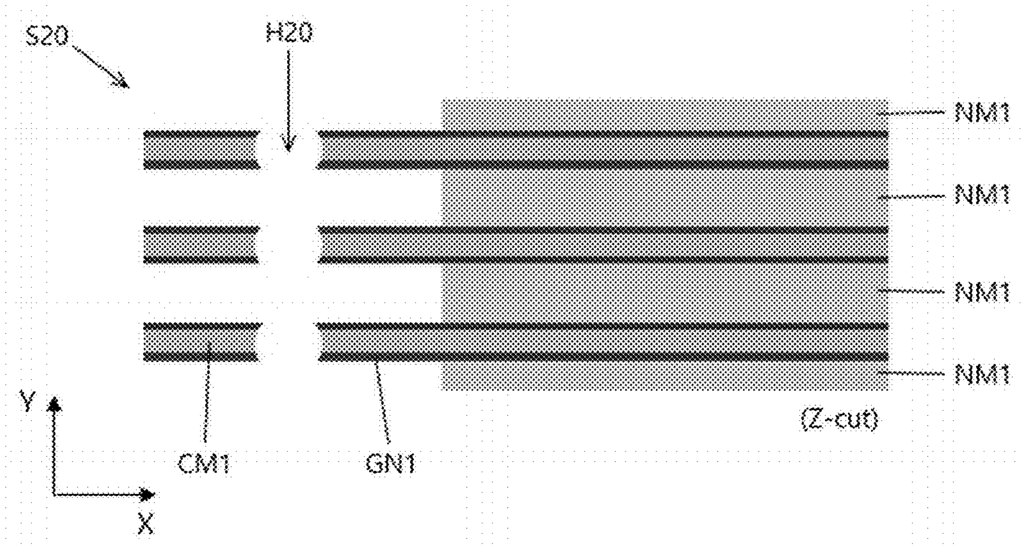
Figure 9C:
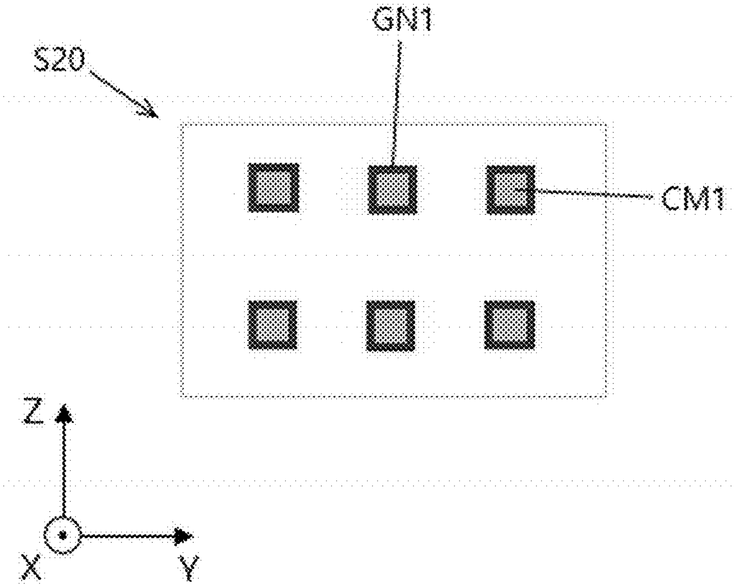

Referring to FIG. 9A to FIG. 9C, the gate insulating material layer GN1 may be exposed by removing the first to third insulating layers NL11, NL21, and NL31 and the insulating material NM1 in the transistor formation region (transistor formation planned region) around the second vertical hole H20 of the structure S20. At this time, a fourth mask pattern M40 may be formed on a capacitor formation region (capacitor formation planned region) adjacent to the transistor formation region (transistor formation planned region), and the fourth mask pattern M40 may be formed to expose the transistor formation region. The first to third insulating layers NL11, NL21, and NL31 and the insulating material NM1 may be etched and removed from the transistor formation region by using the fourth mask pattern M40 as an etching mask. Then, the fourth mask pattern M40 may be removed. FIG. 9C may be a cross-sectional diagram cut along line (B) of FIG. 9A.

Then, by using the method as illustrated in FIG. 10A to FIG. 15C, a word line (WL1 in FIG. 15A) surrounding the exposed portion of the gate insulating material layer GN1 may be formed in the transistor formation region. Therefore, a transistor including the word line may be defined.

Figure 10A:
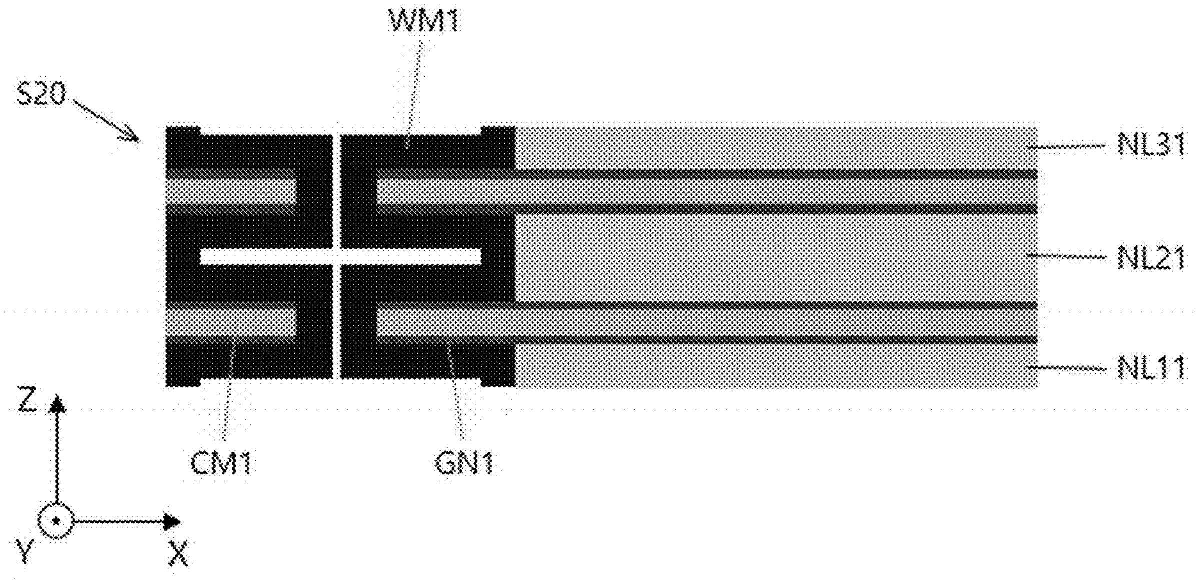
Figure 10B:
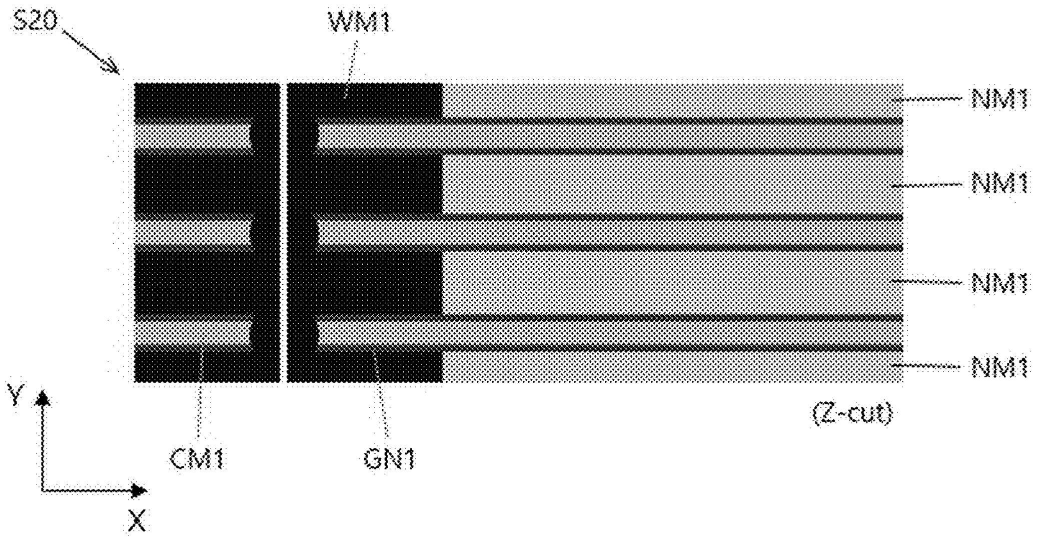
Figure 10C:
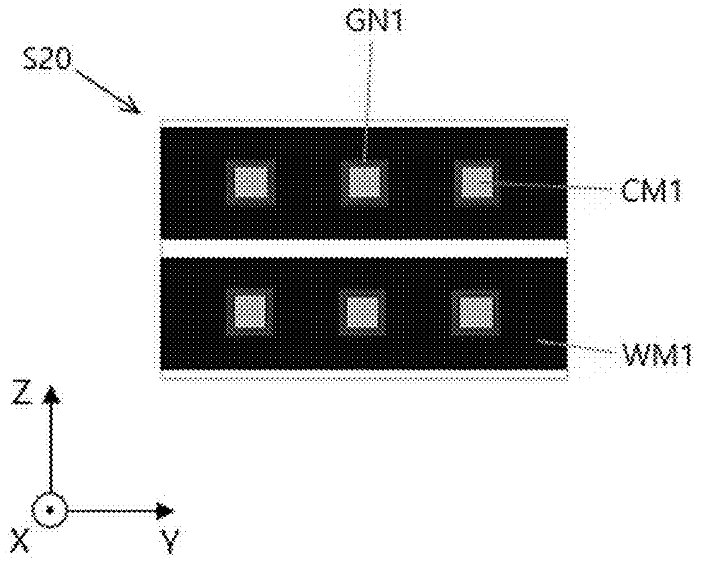

Referring to FIG. 10A to FIG. 10C, a word line material layer WM1 surrounding the exposed portion of the gate insulating material layer GN1 may be formed in the transistor formation region. The word line material layer WM1 may be formed substantially conformally according to the shape of the surface regions exposed in the transistor formation region. The word line material layer WM1 may be formed through, for example, an ALD process. At this time, as shown in FIG. 10A and FIG. 10C, the gap in the Z-axis direction between the lower and upper channel material layers CM1 may be wider than about twice the thickness of the word line material layer WM1. Furthermore, the gap in the Z-axis direction between the lower and upper gate insulating material layers GN1 may be greater than about twice the thickness of the word line material layer WM1. Meanwhile, as shown in FIG. 10B, the gap in the Y-axis direction between the two channel material layers CM1 spaced apart in the Y-axis direction may be less than about twice the thickness of the word line material layer WM1. Furthermore, the gap in the Y-axis direction between the two gate insulating material layers GN1 spaced apart in the Y-axis direction may be less than about twice the thickness of the word line material layer WM1.

The word line material layer WM1 may be formed to surround each channel material layer CM1 in the transistor formation region. Furthermore, the word line material layer WM1 may have a line shape extending in the Y-axis direction.

Figure 11A:
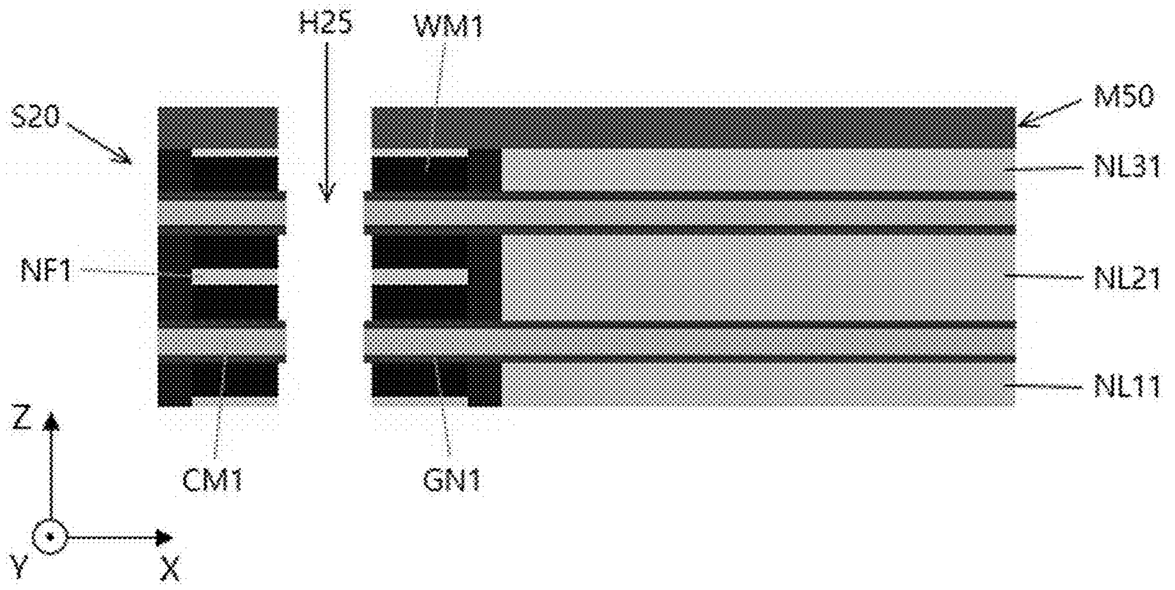
Figure 11B:
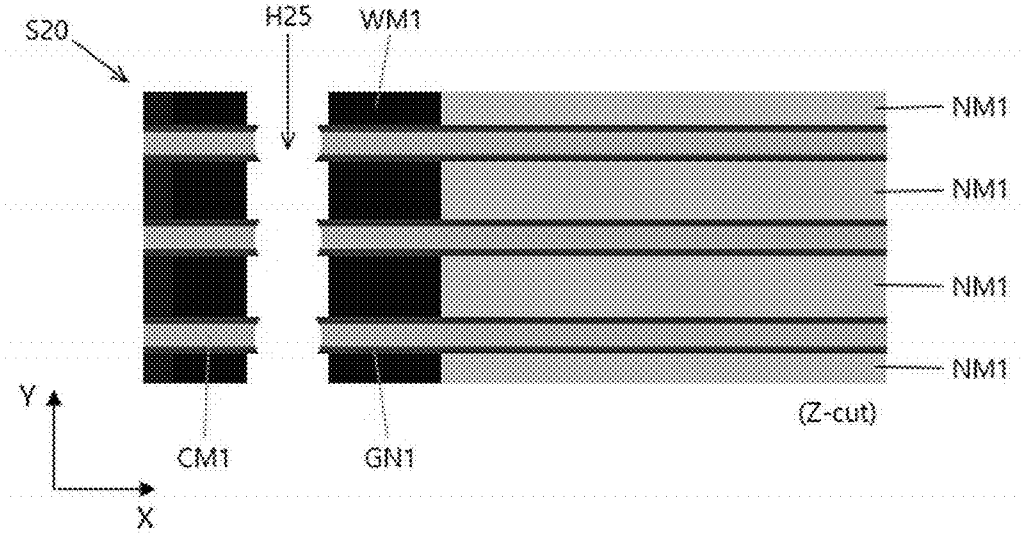
Figure 11C:
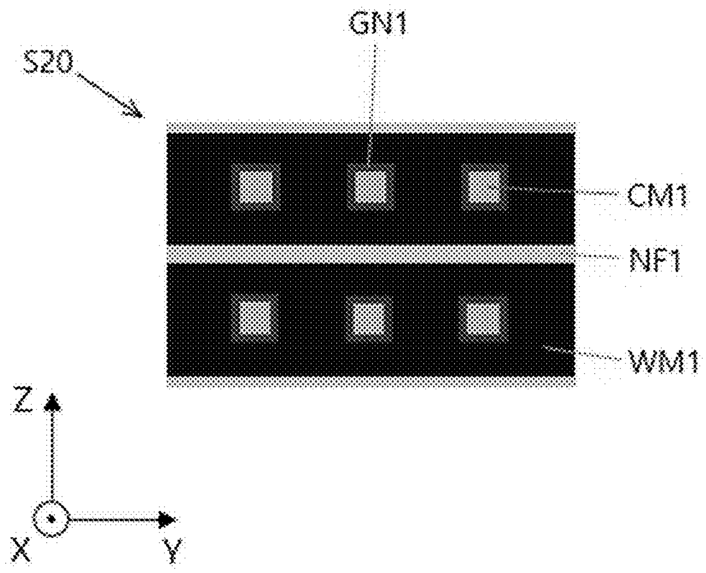

Referring to FIG. 11A to FIG. 11C, a through hole H25 may be formed by etching a region corresponding to the second vertical hole (H20 in FIG. 8A) in the word line material layer WM1. The through hole H25 may be a vertical hole. A fifth mask pattern M50 may be used to form the through hole H25. The fifth mask pattern M50 may have a predetermined opening pattern. The fifth mask pattern M50 may be, for example, a photoresist pattern.

Next, a filling insulating layer NF1 may be formed to fill an empty space of the curved portion (bent portion) of the word line material layer WM1. The filling insulating layer NF1 may be a type of gap fill material layer. The filling insulating layer NF1 may be formed of an insulating oxide or another insulating material. Then, the through hole H25 may be formed through hole etching once again.

Then, a portion of the word line material layer WM1 exposed through the through hole H25 may be recessed, so that one end of the channel material layer CM1 may protrude toward the through hole H25 rather than the word line material layer WM1. Accordingly, a portion of the word line material layer WM1 may be etched around the through hole H25, and a trench structure extending in the Y-axis direction may be formed. It may be considered that the through hole H25 is included in the trench structure.

Figure 12A:
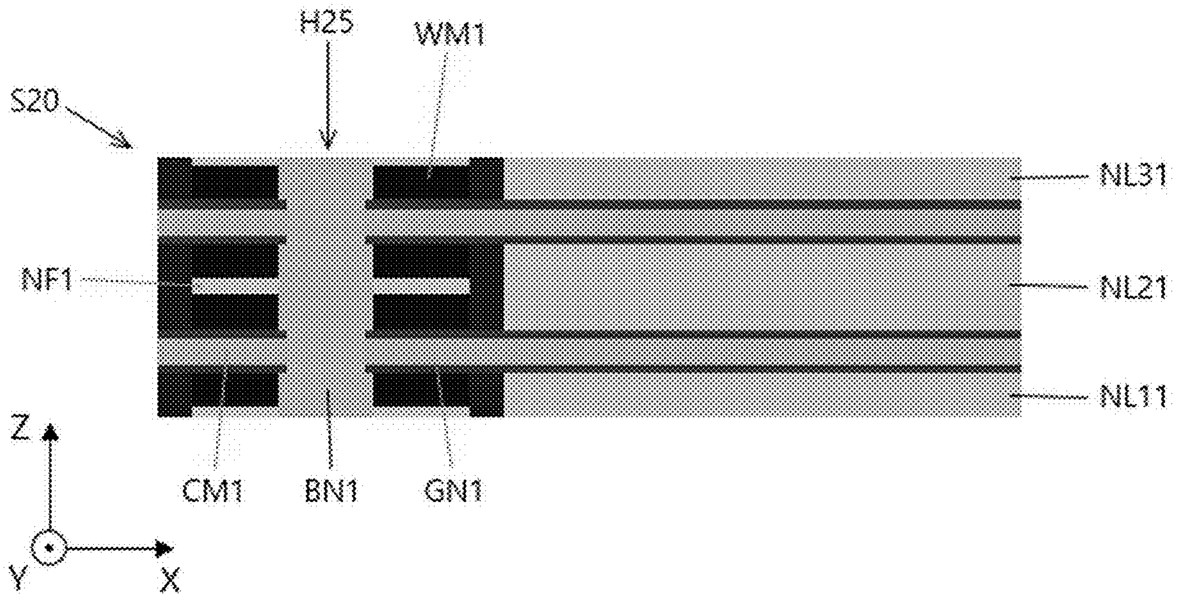
Figure 12B:
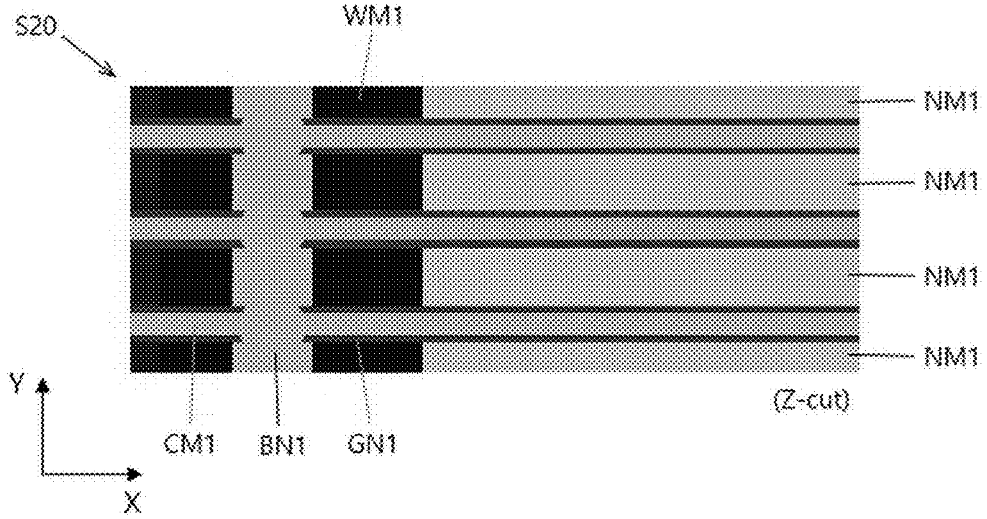
Figure 12C:
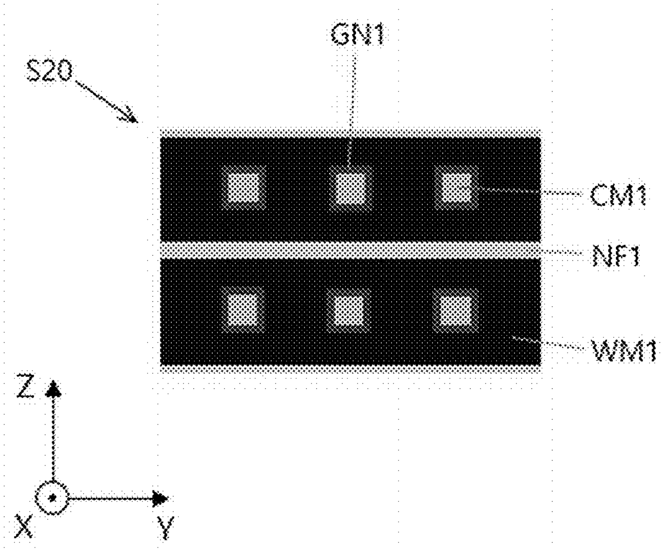

Referring to FIG. 12A to FIG. 12C, a body insulating layer BN1 may be formed to fill the through hole H25 and the trench structure around it. The body insulating layer BN1 may be formed of an insulating oxide or another insulating material. The body insulating layer BN1 may be formed of the same material as the filling insulating layer NF1 or may be formed of a different material.

Figure 13A:
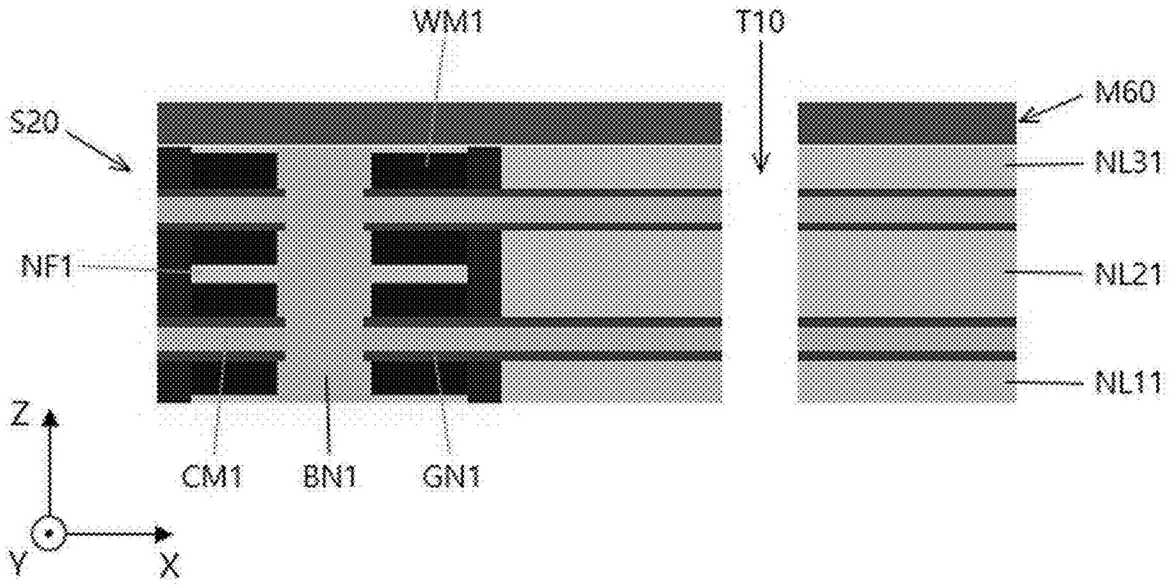
Figure 13B:
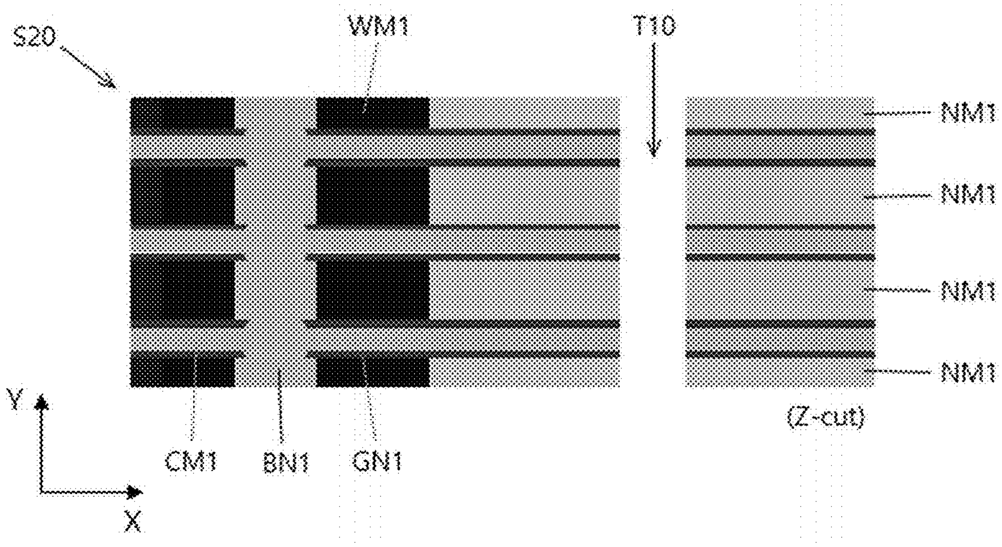
Figure 13C:
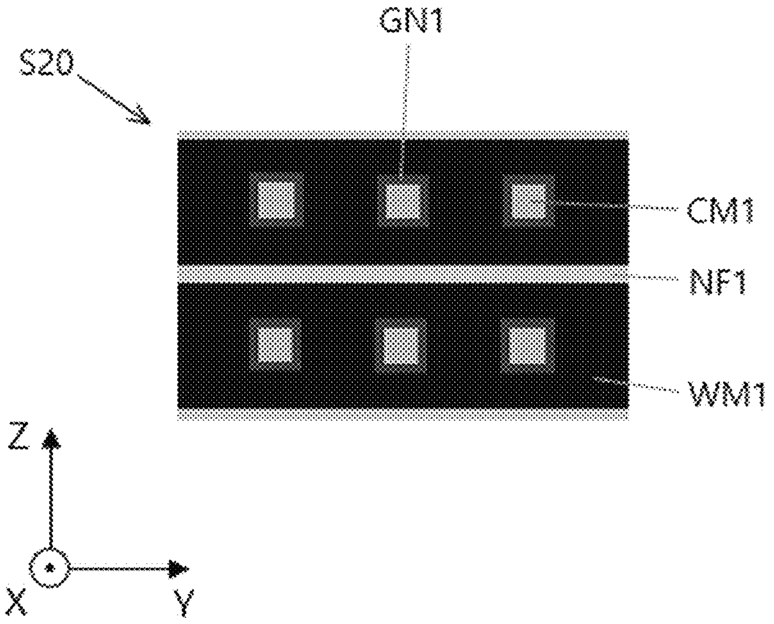

Referring to FIG. 13A to 13C, a first trench T10 may be formed in the capacitor formation region adjacent to the transistor formation region of the structure S20. The first trench T10 may be disposed to be spaced apart from the word line material layer WM1, may be formed to penetrate from the third insulating layer NL31 to the first insulating layer NL11, and may have a shape extending in the Y-axis direction.

A sixth mask pattern M60 may be used to form the first trench T10. The sixth mask pattern M60 may have a predetermined opening area. The sixth mask pattern M60 may be, for example, a photoresist pattern. The sixth mask pattern M60 may be removed after forming the first trench T10.

Figure 14A:
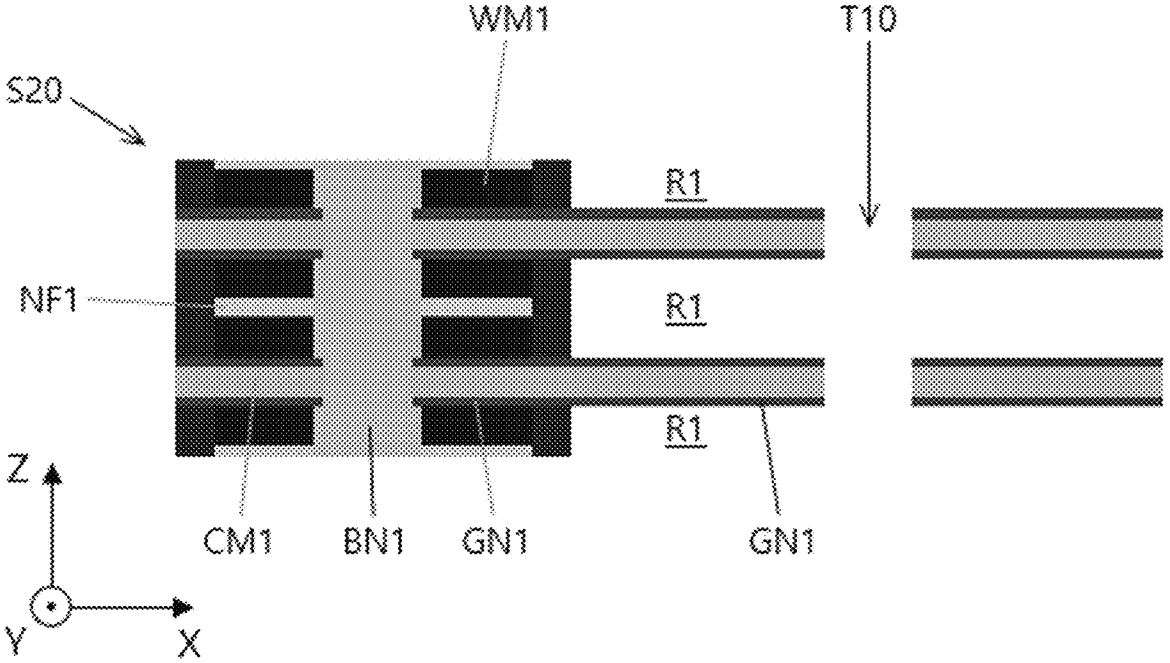
Figure 14B:
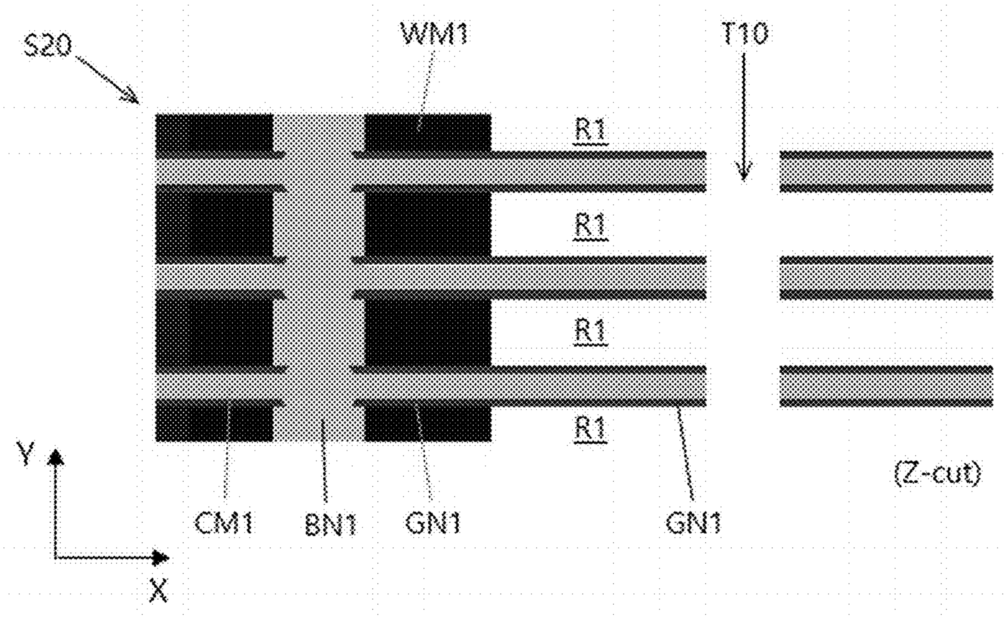
Figure 14C:
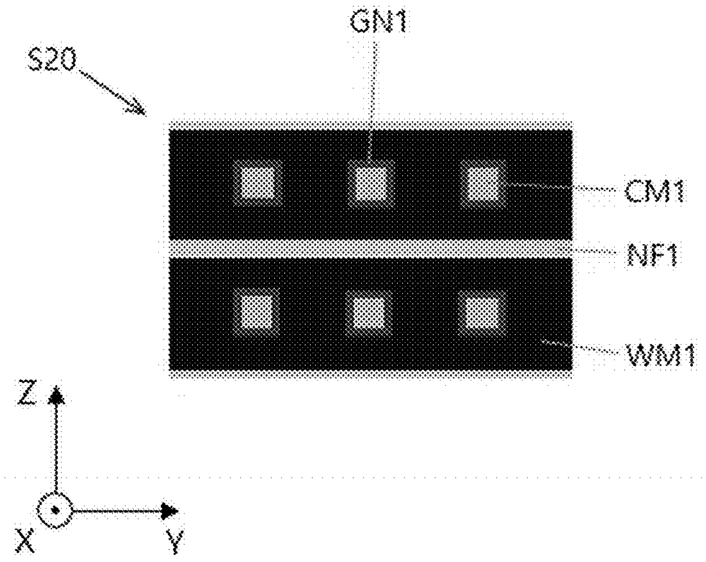

Referring to FIG. 14A to FIG. 14C, a first recess (first recess portion) R1 exposing the gate insulating material layer GN1 may be formed by removing (etching) the first to the third insulating layers (NL11, NL21, and NL31 in FIG. 13A) and the insulating material (NM1 in FIG. 13B) exposed by the first trench T10 in the capacitor formation region. Since the first to third insulating layers (NL11, NL21, and NL31 in FIG. 13A) and the insulating material (NM1 in FIG. 13B) may be the same material, they may be easily removed by using an etching method with etching selectivity.

Figure 15A:
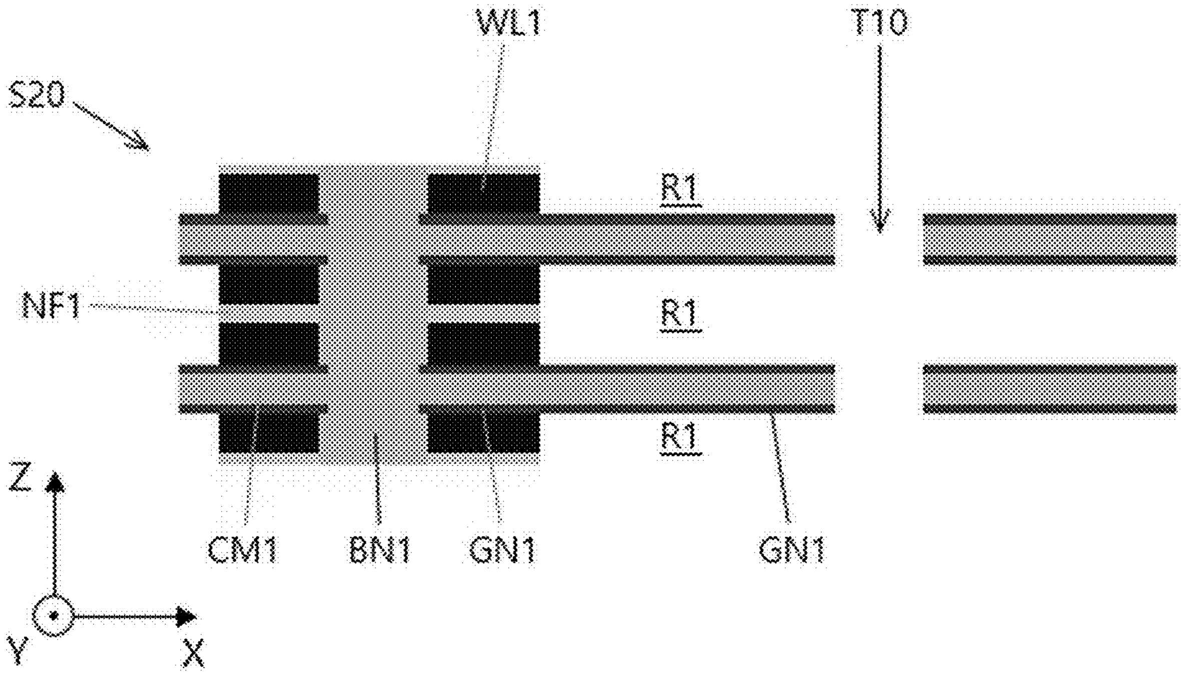
Figure 15B:
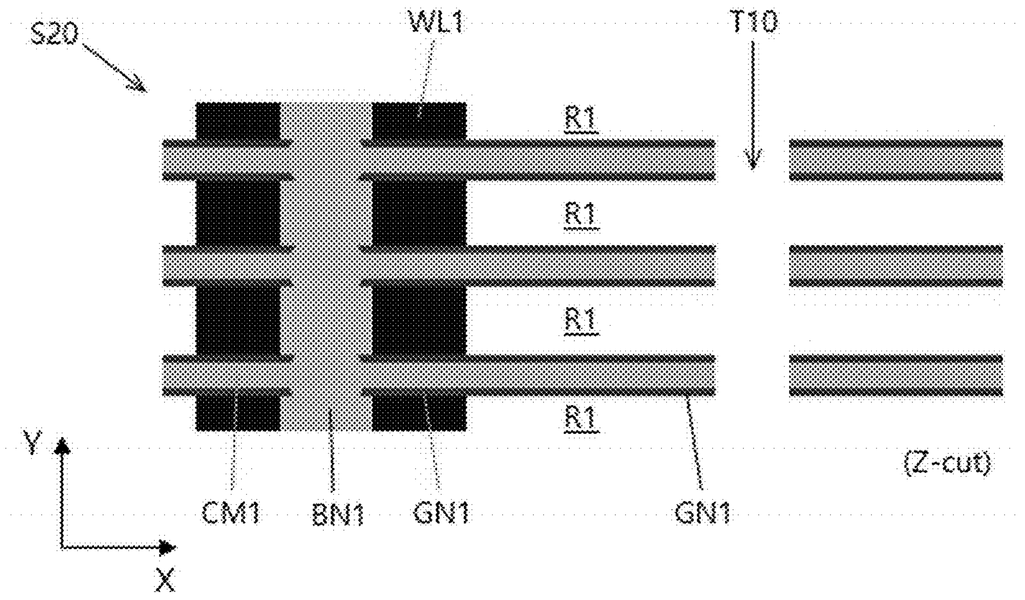
Figure 15C:
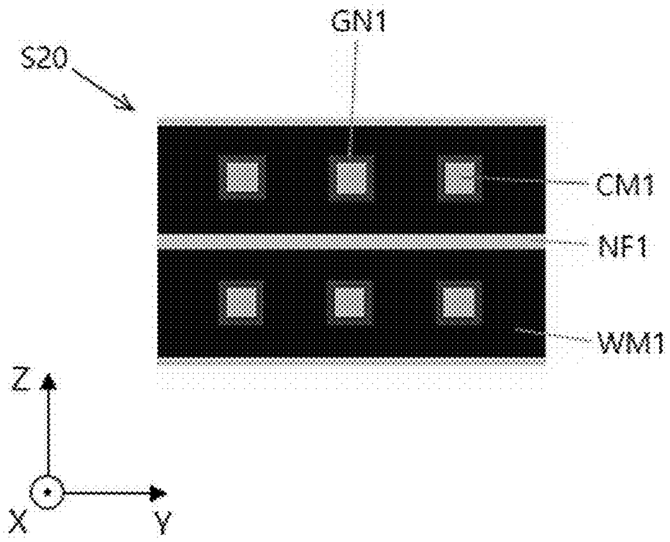

Referring to FIG. 15A to 15C, after forming the first recess R1 in the capacitor formation region, a portion of the word line material layer (WM1 in FIG. 14A) exposed by the first recess R1 may be recessed. In other words, a portion of the word line material layer (WM1 in FIG. 14A) exposed toward the capacitor formation region may be recessed. As a result, the word line material layer portion surrounding the lower channel material layer CM1 and the word line material layer portion surrounding the upper channel material layer CM1 may be separated from each other. Here, the separated word line material layer portion may be referred to as the word line WL1.

Although the method of forming the word line WL1 has been described in detail with reference to FIG. 10A to FIG. 15C, this is merely an example, and the method for forming the word line WL1 may vary depending on the cases.

Figure 16A:
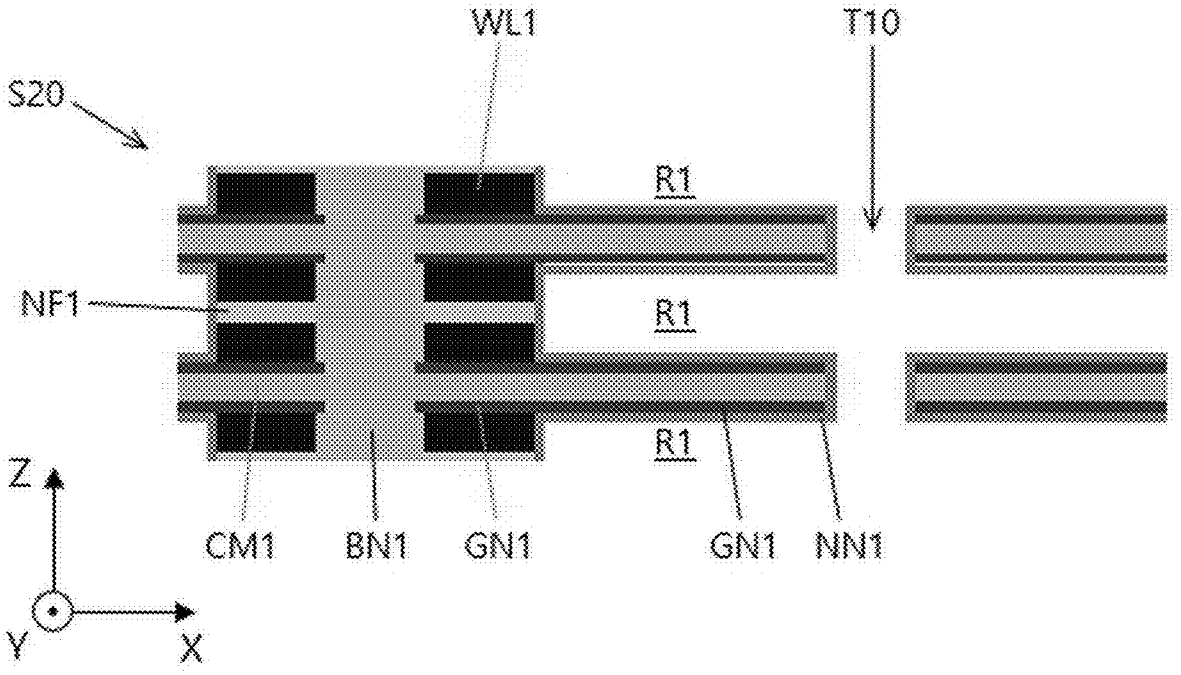
Figure 16B:
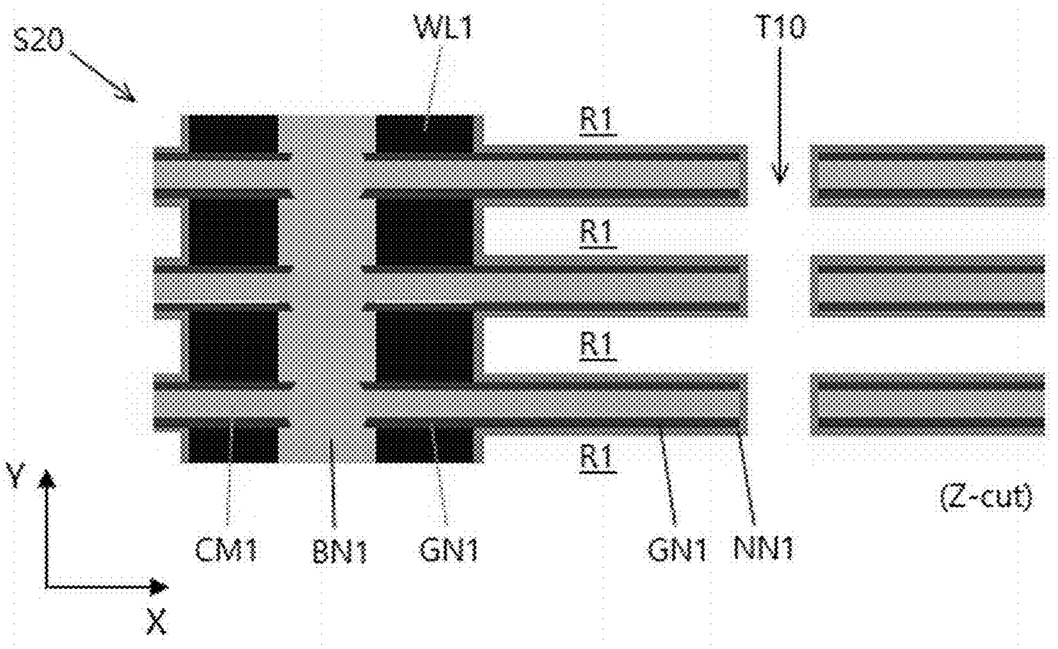
Figure 16C:
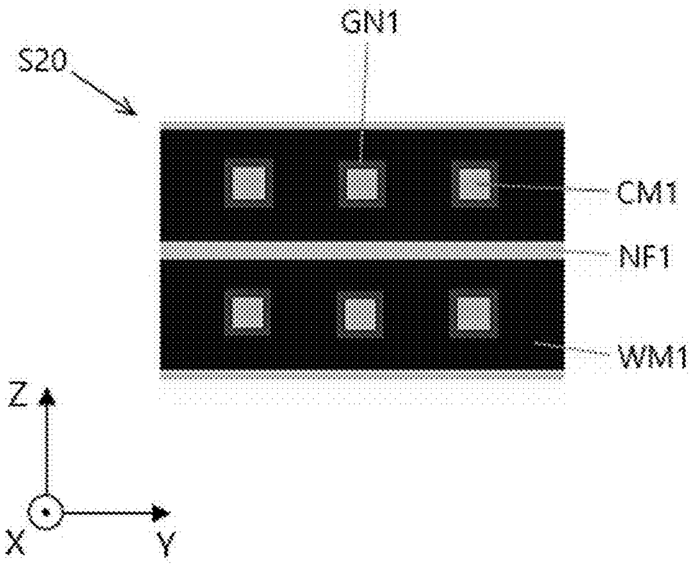

Referring to FIG. 16A to 16C, an insertion insulating layer NN1 surrounding the exposed portion of the gate insulating material layer GN1 may be formed in the capacitor formation region after forming the first recess R1 in the capacitor formation region. The insertion insulating layer NN1 may be conformally formed on the surface area exposed to the first recess R1. The insertion insulating layer NN1 may be formed to cover surfaces of the gate insulating material layer GN1, the channel material layer CM1, and the word line WL1 exposed in the capacitor formation region. The insertion insulating layer NN1 may be formed through, for example, an ALD process. The thickness of the insertion insulating layer NN1 may be as thin as several tens of nm or less. The insertion insulating layer NN1 may be formed of an insulating oxide or another insulating material.

Figure 17A:
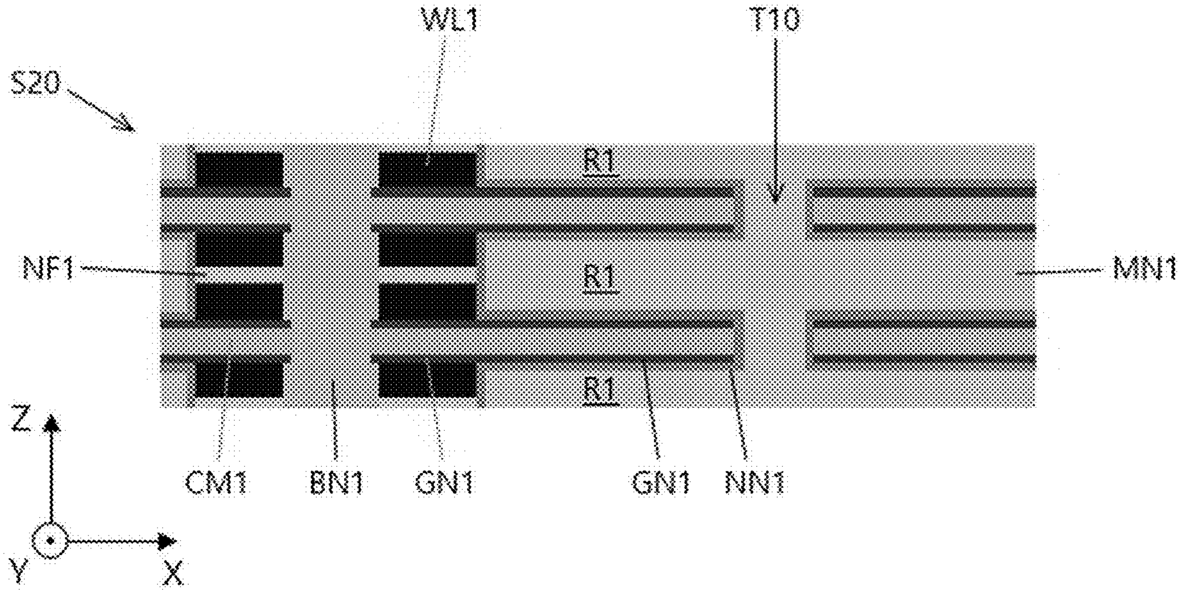
Figure 17B:
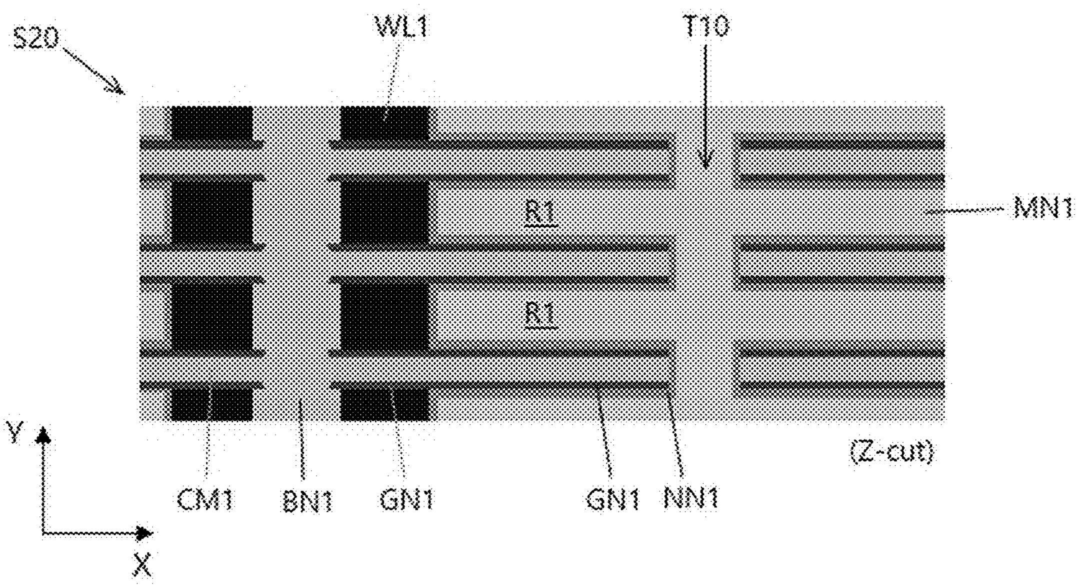
Figure 17C:
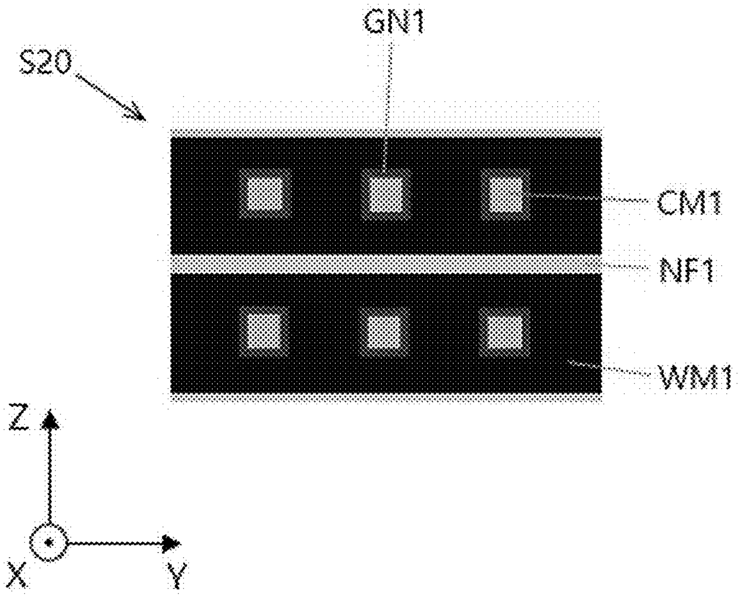

Referring to FIG. 17A to FIG. 17C, a mold insulating layer MN1 filling the first recess R1 may be formed. The mold insulating layer MN1 may be formed to fill the first recess R1 and the first trench T10 on the insertion insulating layer NN1. The mold insulating layer MN1 may include, for example, a silicon nitride (e.g., $SiN_x$) or may be formed of a silicon nitride (e.g., $SiN_x$). When forming the mold insulating layer MN1, after depositing an insulator for the mold insulating layer MN1, a planarization process may be further performed on its upper surface and surrounding area.

Figure 18A:
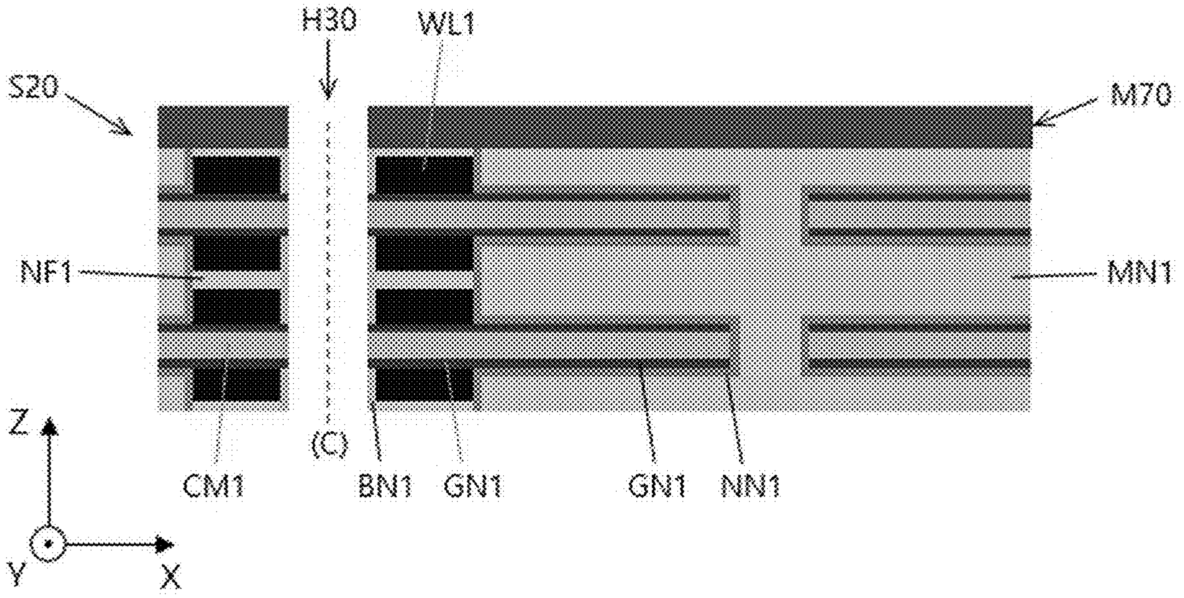
Figure 18B:
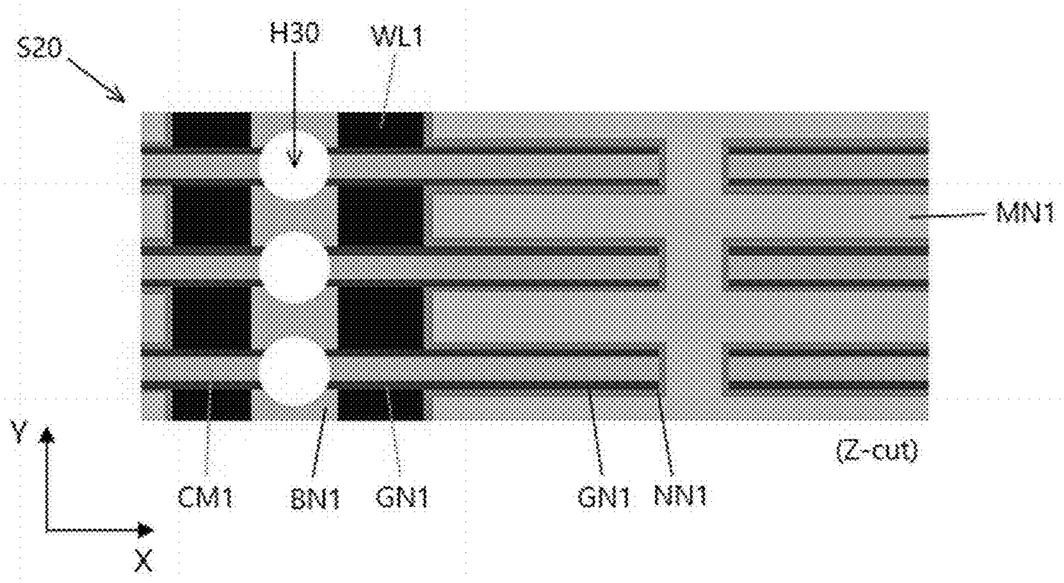
Figure 18C:
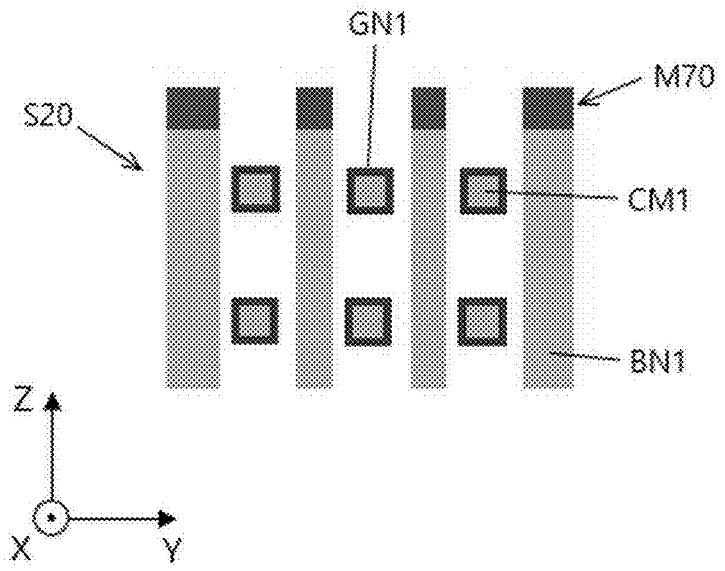

Referring to FIG. 18A to FIG. 18C, a third vertical hole H30 may be formed in a region corresponding to the second vertical hole (H20 in FIG. 8A) of the body insulating layer BN1. A seventh mask pattern M70 may be used to form the third vertical hole H30. The seventh mask pattern M70 may have a predetermined opening pattern. The seventh mask pattern M70 may be, for example, a photoresist pattern. The seventh mask pattern M70 may be removed after forming the third vertical hole H30. FIG. 18C may be a cross-sectional diagram observed from a cross-sectional area along line (C) of FIG. 18A.

Figure 19A:
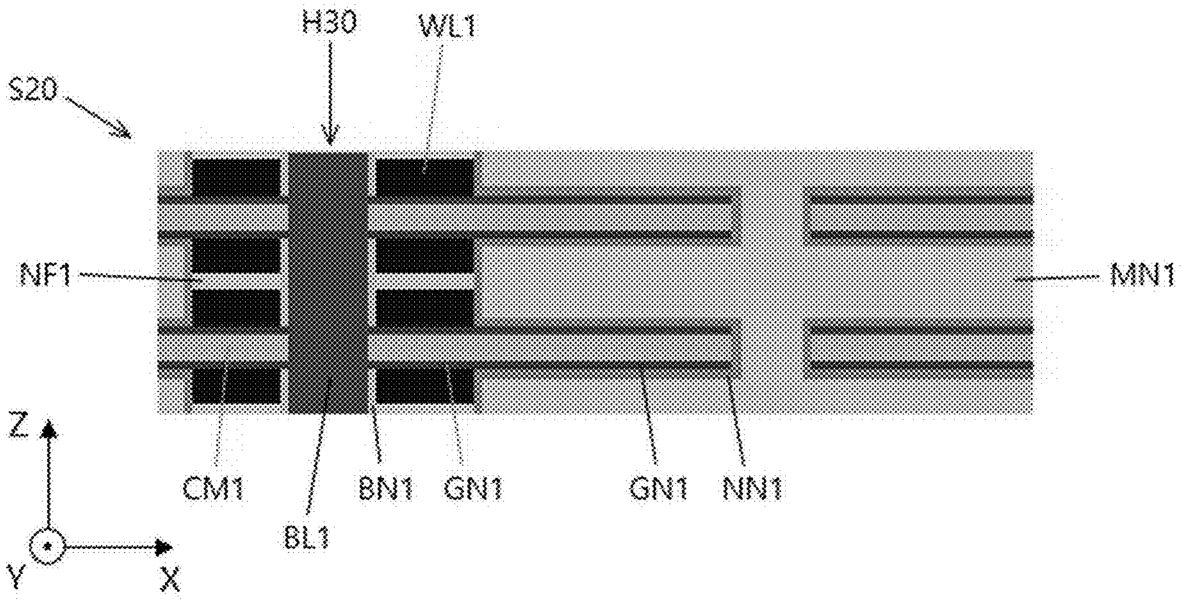
Figure 19B:
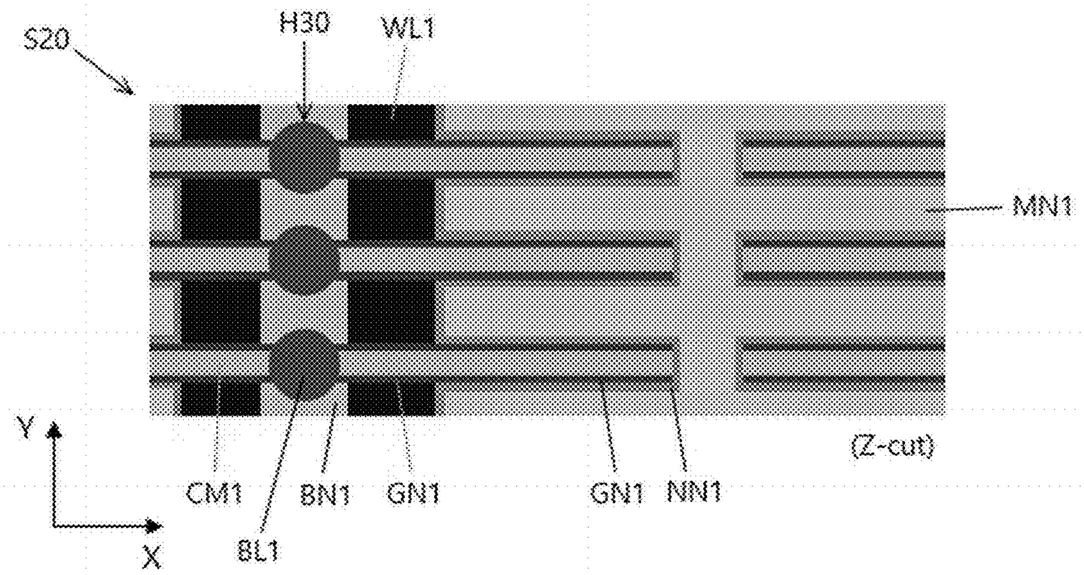
Figure 19C:
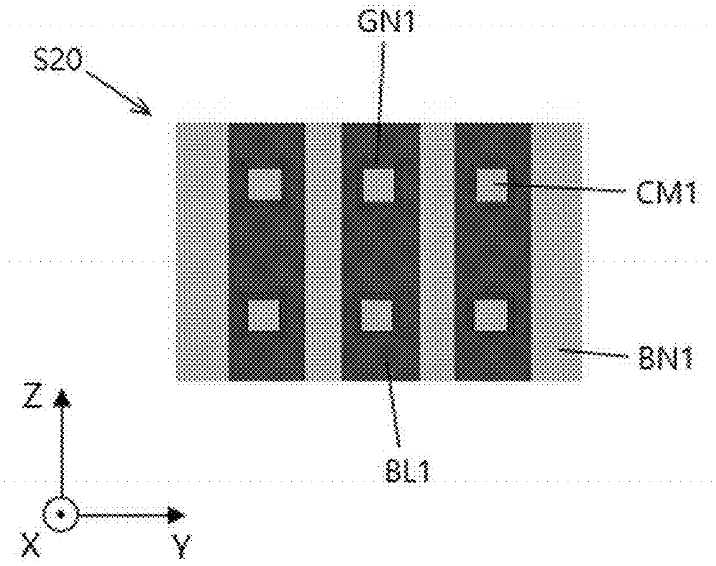

Referring to FIG. 19A to FIG. 19C, a bit line BL1 may be formed in the third vertical hole H30. The bit line BL1 may be connected (contacted) to one end of the channel material layer CM1. Accordingly, the bit line BL1 may be formed to be connected to (contact) one end of the channel material layer CM1 in a region corresponding to the second vertical hole (H20 in FIG. 8A) in the transistor formation region. The bit line BL1 may have a pillar shape penetrating through the structure S20 in the vertical direction. The bit line BL1 may be electrically connected to one end of the channel material layer CM1 in a lateral direction. A plurality of bit lines BL1 connected to a plurality of channel material layers CM1 may be formed.

Although not shown, if there is a conductive material of the bit line BL1 deposited above the third vertical hole H30, it may be removed through, for example, an etch back process.

Figure 20A:
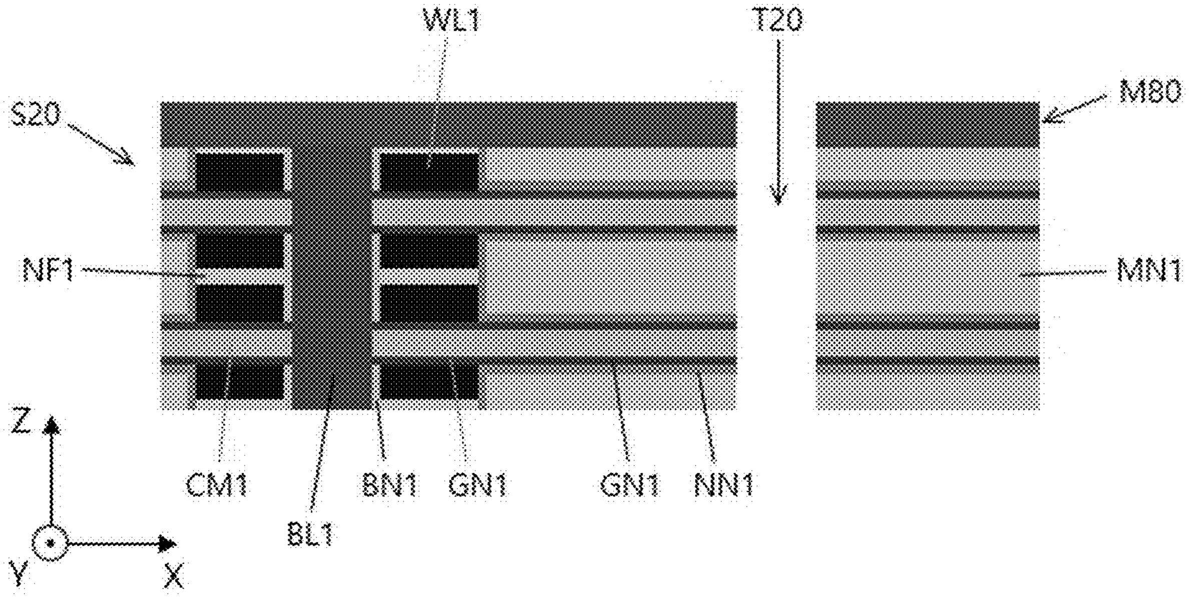
Figure 20B:
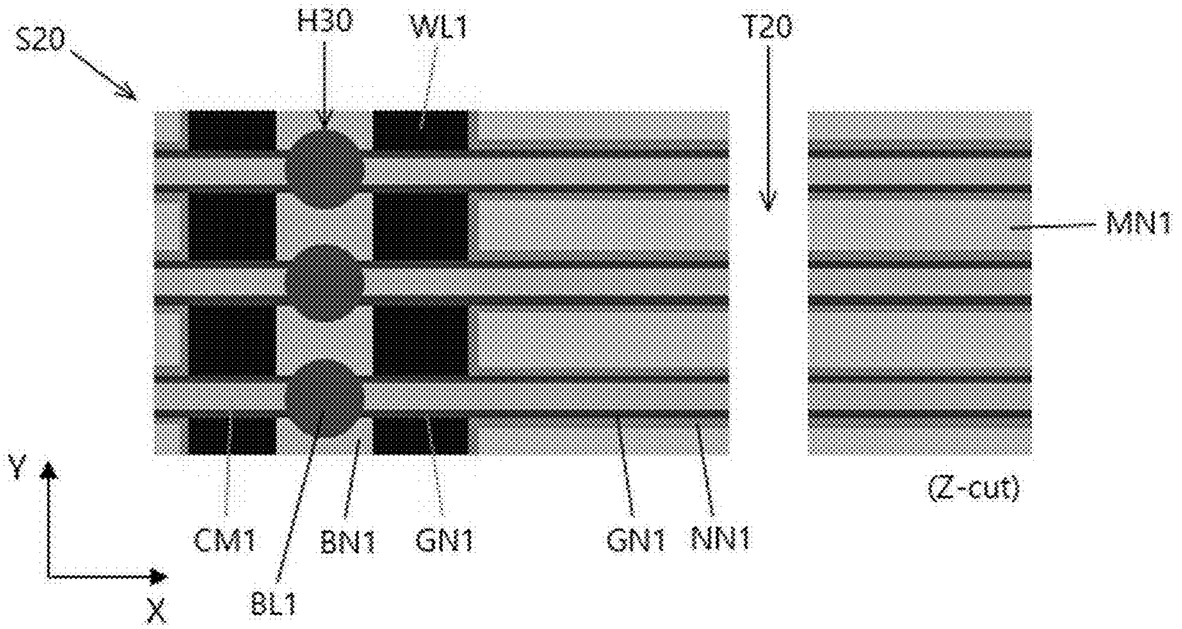

Referring to FIG. 20A and FIG. 20B, a second trench T20 may be formed in a region corresponding to the first trench (T10 in FIG. 13A) in the mold insulating layer MN1. The second trench T20 may be formed by etching a portion of the mold insulating layer MN1 and a portion of the insertion insulating layer NN1. Accordingly, an end of the gate insulating material layer GN1 and an end of the channel material layer CM1 may be exposed toward the second trench T20. The second trench T20 may have a line shape extending in the Y-axis direction.

An eighth mask pattern M80 may be used to form the second trench T20. The eighth mask pattern M80 may have a predetermined opening area. The eighth mask pattern M80 may be, for example, a photoresist pattern. The eighth mask pattern M80 may be removed after forming the second trench T20.

Figure 21A:
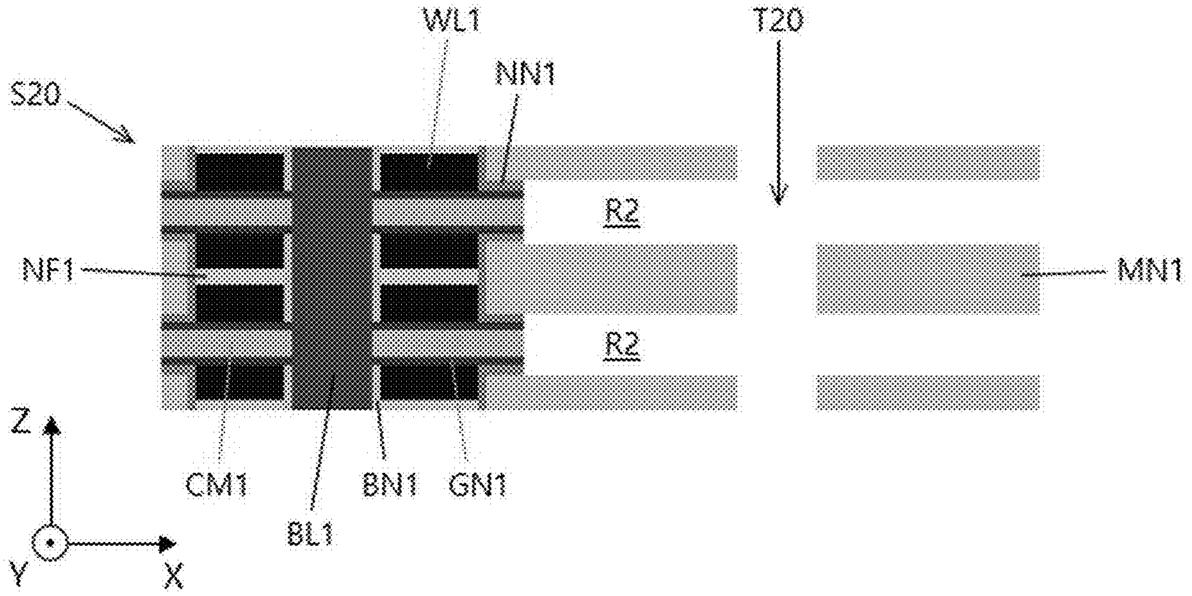
Figure 21B:
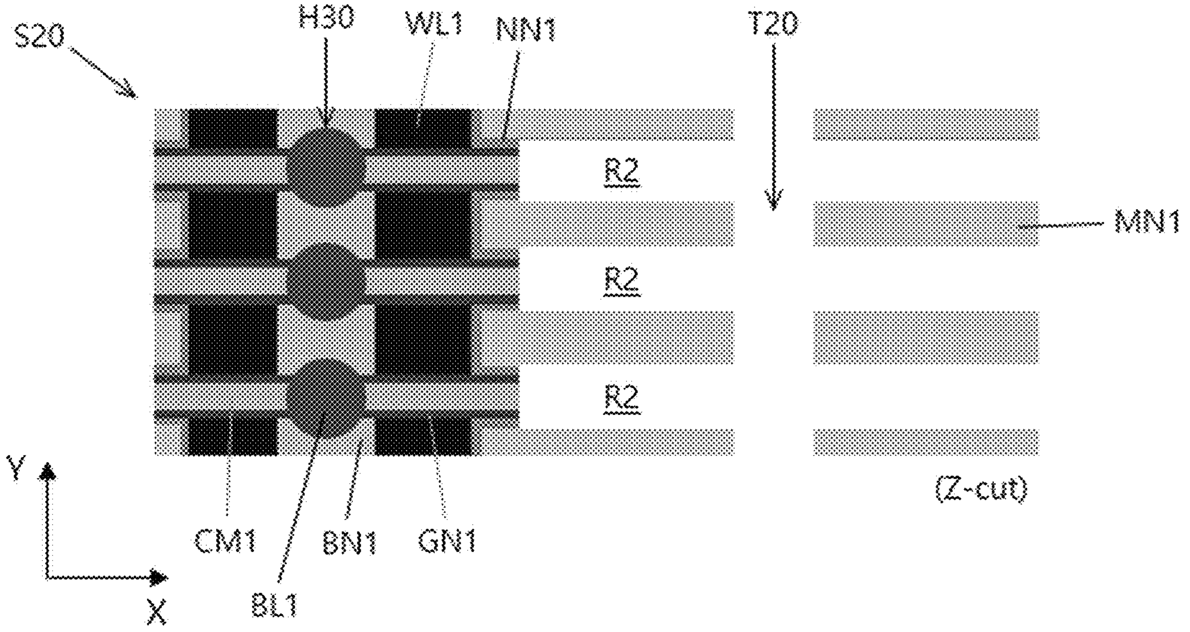

Referring to FIG. 21A and FIG. 21B, a second recess (second recess portion) R2 may be formed by etching the channel material layer CM1, the gate insulating material layer GN1, and the insertion insulating layer NN1 exposed by the second trench T20. The channel material layer CM1, the gate insulating material layer GN1, and the insertion insulating layer NN1 may be etched by injecting a predetermined wet etchant, that is, a wet etching solution through the second trench T20. At this time, one or more wet etchants may be used. The second recess R2 may be formed to a region somewhat spaced apart from the word line WL1. The etching range of the channel material layer CM1, the gate insulating material layer GN1, and the insertion insulating layer NN1 may be controlled by adjusting the conditions of the etching process.

When the insertion insulating layer NN1 is removed in the step of FIG. 21A after forming the insertion insulating layer NN1 in the previous step of FIG. 16A, the second recess R2 may be formed to have a larger width than that of the remaining gate insulating material layer GN1. Accordingly, a width of the second recess R2 in the Z-axis direction may be larger than a width of the remaining gate insulating material layer GN1 in the Z-axis direction. Furthermore, a width of the second recess R2 in the Y-axis direction may be larger than a width of the remaining gate insulating material layer GN1 in the Y-axis direction. As a result, the process margin for forming a capacitor in a subsequent process may be increased. It may be desirable to form the insertion insulating layer NN1 in order to secure a process margin, and the like. However, the formation of the above-described insertion insulating layer NN1 may be optional and may be omitted in some cases.

Meanwhile, in the step of FIG. 21A, since the channel material layer CM1 may be removed by an etching method using a wet etching process in the capacitor formation region, this wet etching hardly causes etching damage to the channel material layer CM1, or may cause to a fairly limited level.

Figure 22A:
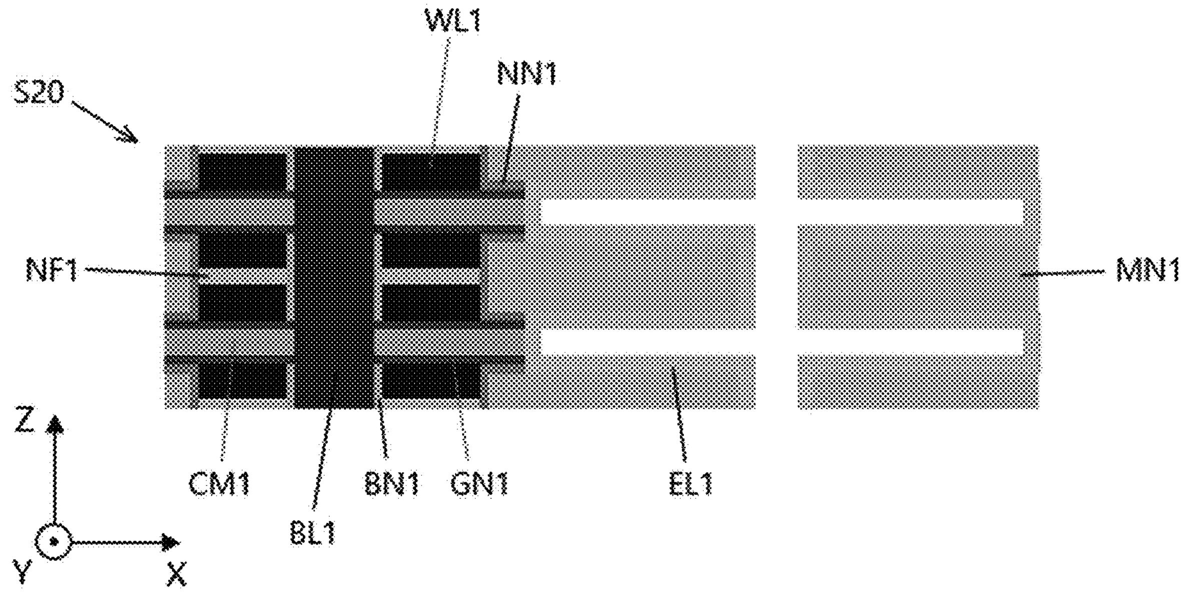
Figure 22B:
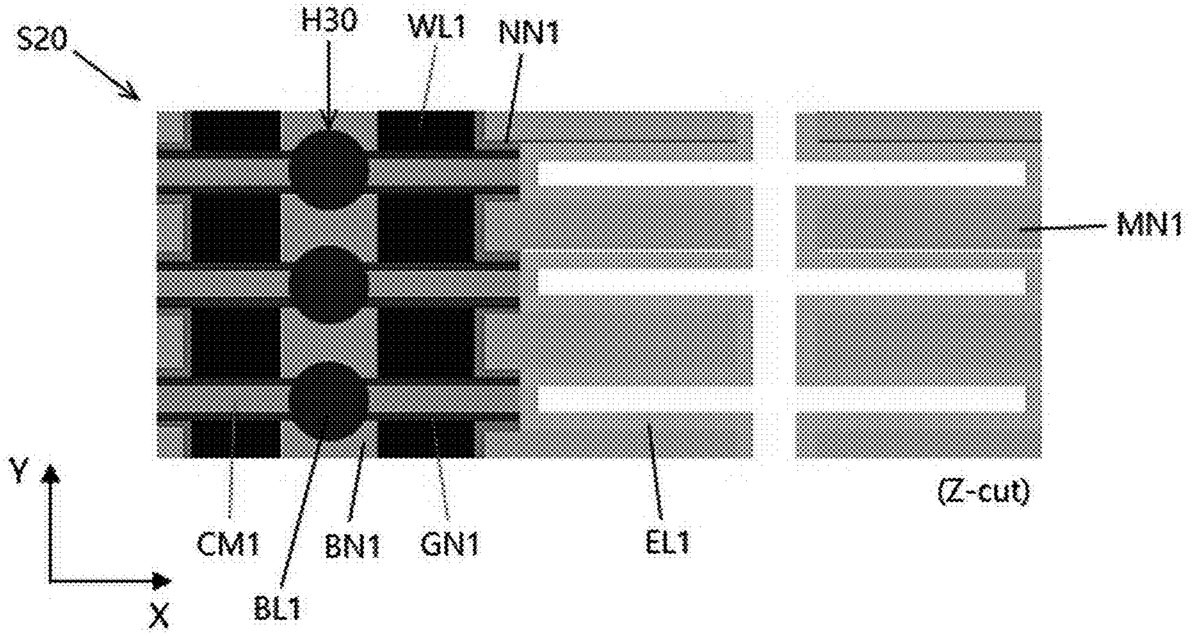

Referring to FIGS. 22A and 22B, an electrode member EL1 connected to the other end of the channel material layer CM1 may be formed on an inner surface of the second recess (R2 in FIG. 21A). The electrode member EL1 may be said to be an electrode layer (first electrode layer) for a capacitor. The electrode member EL1 may be conformally formed along the surface shape of the mold insulating layer MN1. The electrode member EL1 may be formed, for example, through an ALD process.

Figure 23A:
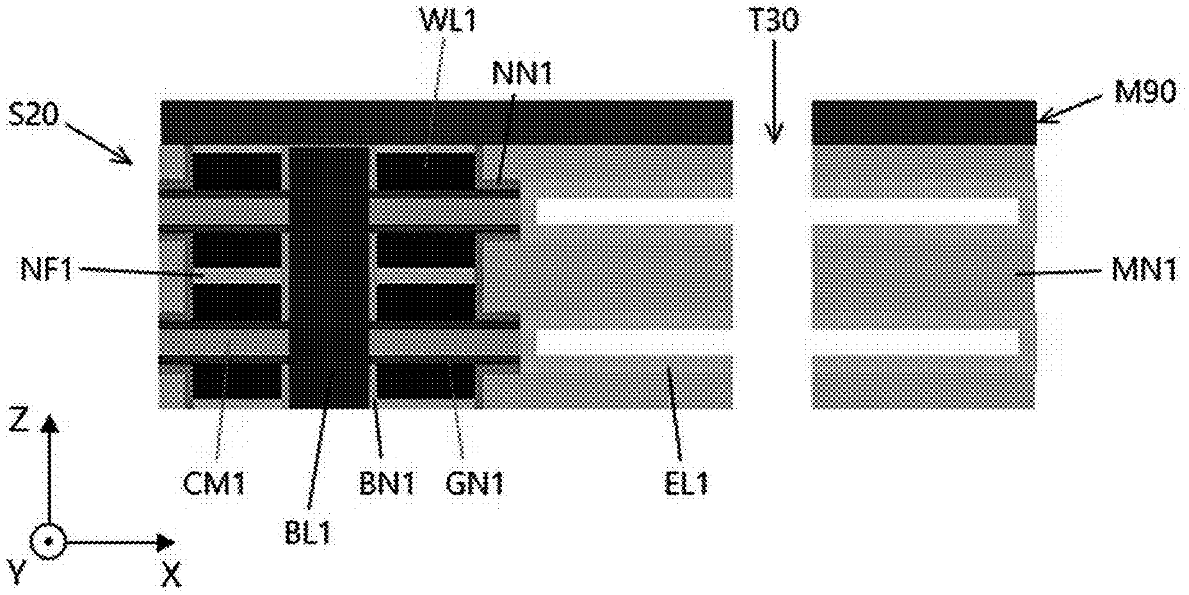
Figure 23B:
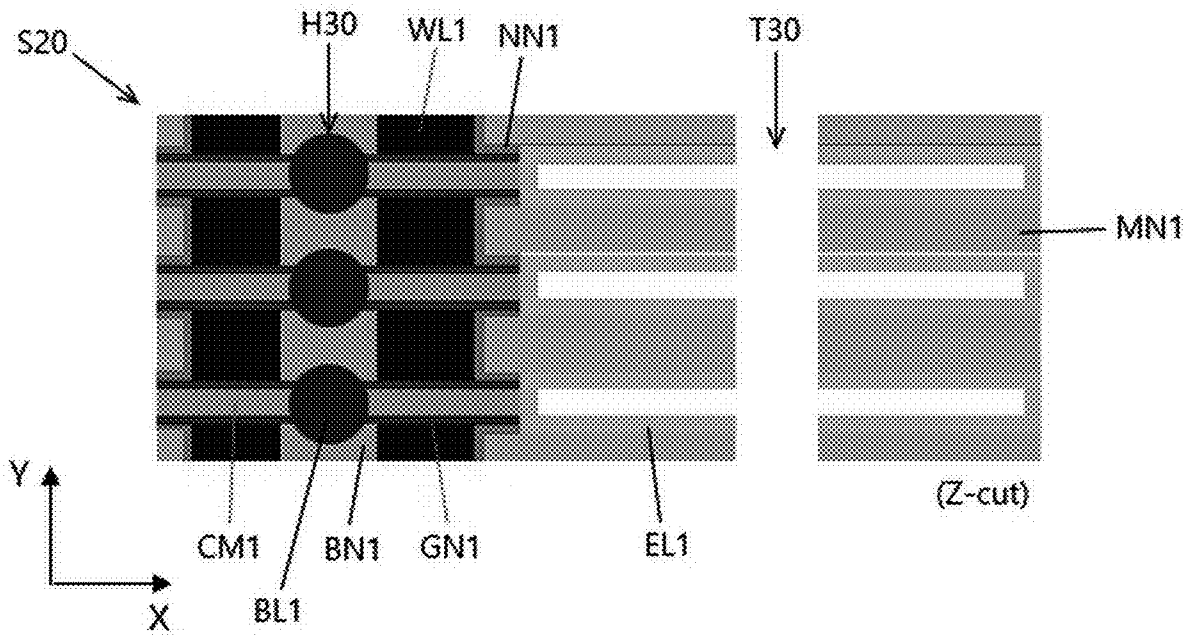

Referring to FIGS. 23A and 23B, a third trench T30 may be formed in a region corresponding to the second trench (T20 in FIG. 20A) in the capacitor formation region. The third trench T30 may be formed by etching a portion of the electrode member EL1. The third trench T30 may have a line shape extending in the Y-axis direction. The electrode member EL1 may be separated into individual capacitor regions through this process. In other words, the electrode member EL1 may be separated into a unit cell region.

A ninth mask pattern M90 may be used to form the third trench T30. The ninth mask pattern M90 may have a predetermined opening area. The ninth mask pattern M90 may be, for example, a photoresist pattern. The ninth mask pattern M90 may be removed after forming the third trench T30.

Figure 24A:
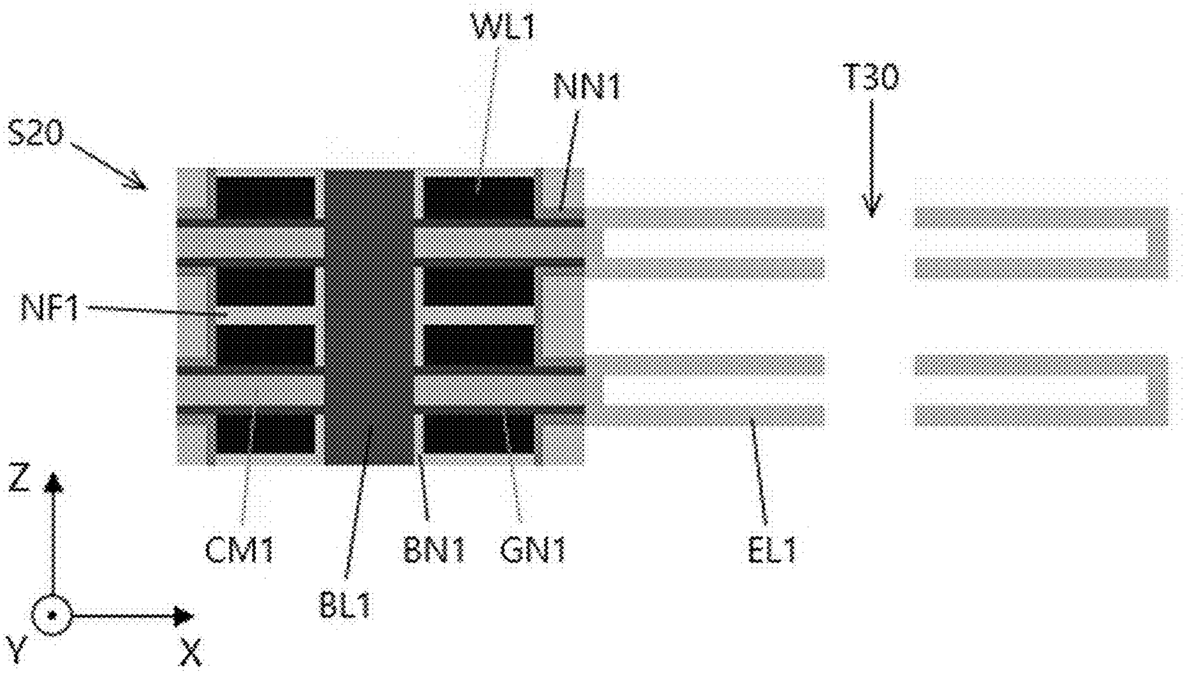
Figure 24B:
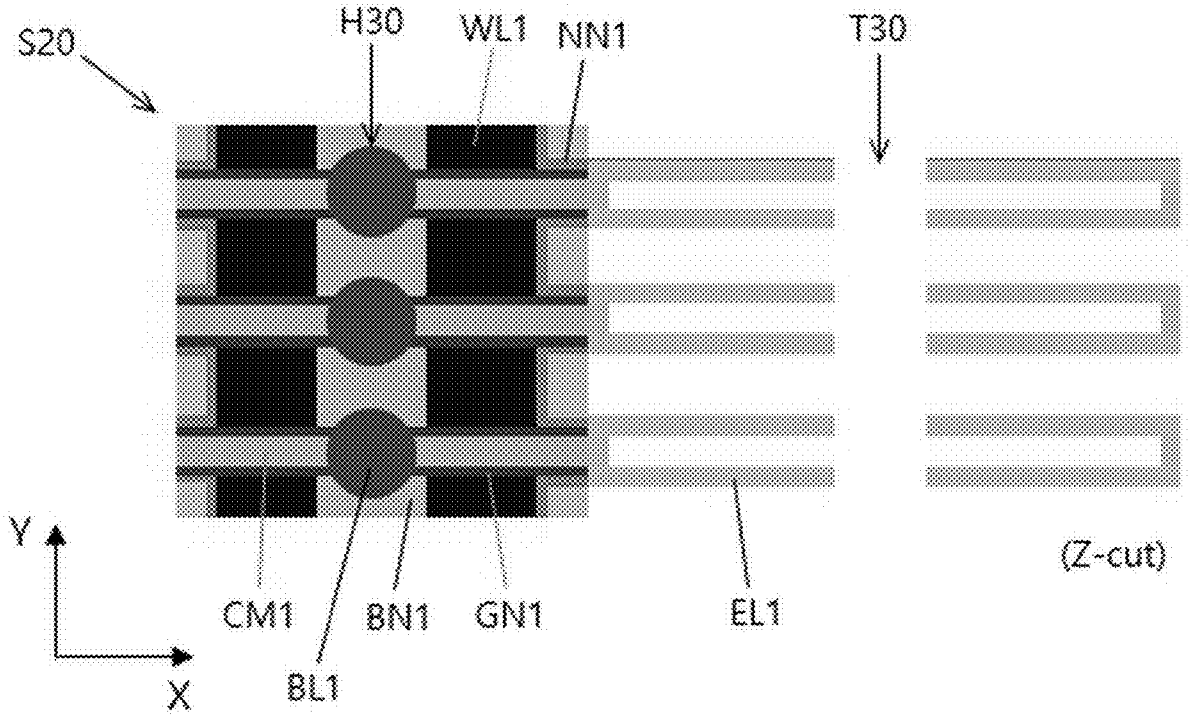

Referring to FIGS. 24A and 24B, an outer surface of the electrode member EL1 may be exposed by etching the mold insulating layer (MN1 in FIG. 23A) after forming the electrode member EL1. At this time, the etching range of the mold insulating layer (MN1 in FIG. 23A) may be appropriately adjusted. As a method of adjusting the etching range, at least a portion of the ninth mask pattern (M90 in FIG. 23A) may be temporarily maintained, or a separate hard mask (not shown) may be used. If necessary, a portion of the mold insulating layer (MN1 in FIG. 23A) adjacent to the insertion insulating layer NN1 may be remained without being etched. However, in some cases, the entire mold insulating layer (MN1 in FIG. 23A) may be removed to expose the insertion insulating layer NN1 in this step.

Figure 25A:
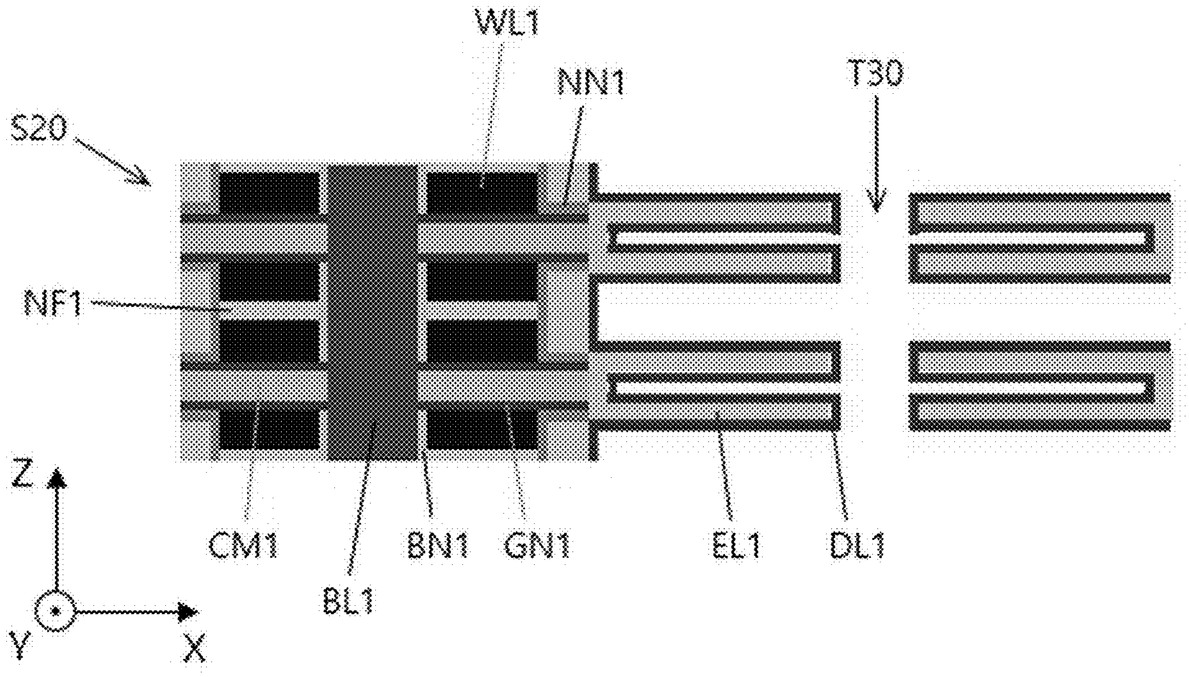
Figure 25B:
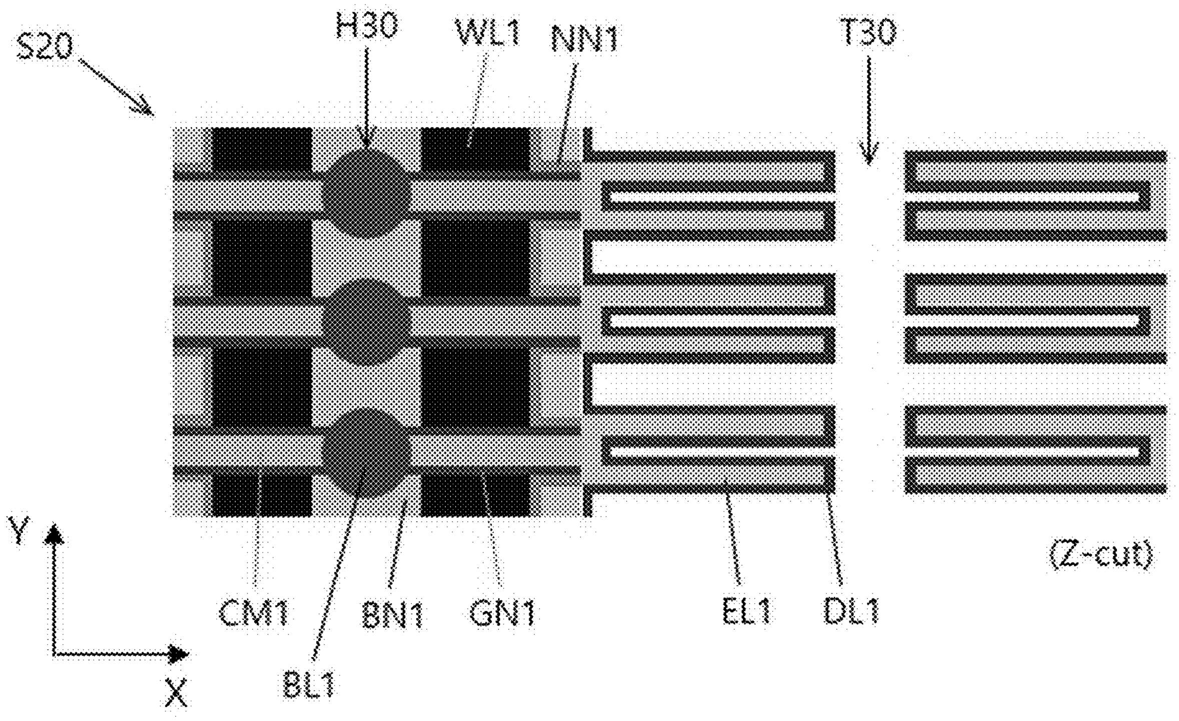

Referring to FIG. 25A and FIG. 25B, a dielectric layer DL1 may be formed on the electrode member EL1 in the capacitor formation region. The dielectric layer DL1 may be a dielectric layer for a capacitor. The dielectric layer DL1 may be formed conformally according to the surface shape of the electrode member EL1. The dielectric layer DL1 may be formed (deposited) through, for example, an ALD process. The dielectric layer DL1 may be formed to include at least one of various dielectric materials. For example, the dielectric layer DL1 may include a high-k material with a higher dielectric constant than that of a silicon nitride. The specific material of the dielectric layer DL1 may vary.

Figure 26A:
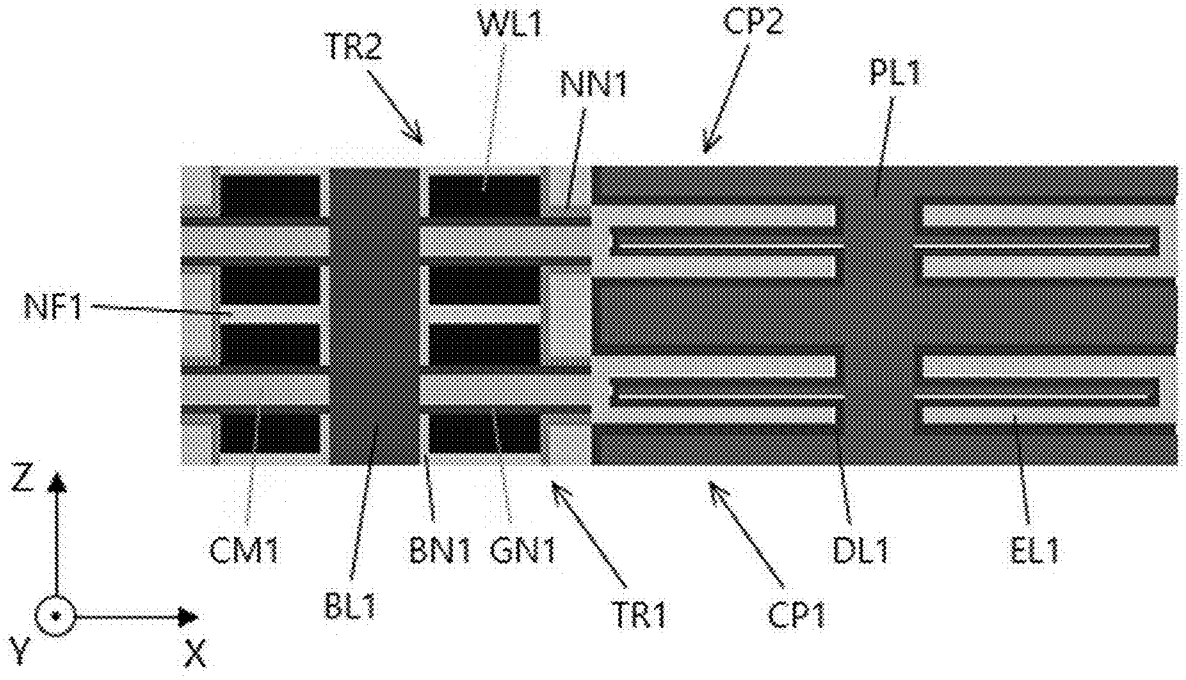
Figure 26B:
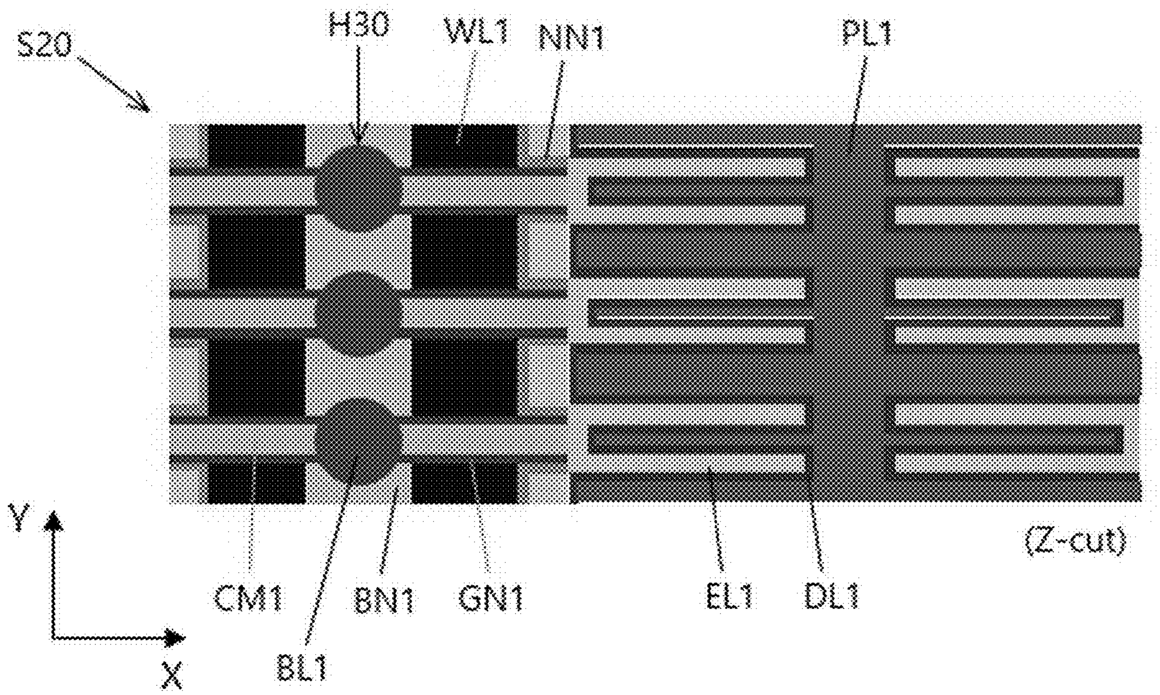

Referring to FIG. 26A and FIG. 26B, a plate electrode PL1 may be formed on the dielectric layer DL1 in the capacitor formation region. The plate electrode PL1 may be said to be an electrode layer (second electrode layer) for a capacitor. The plate electrode PL1 may be formed to fill the third trench (T30 in FIG. 25A), the inside of the electrode member EL1, and the space between the electrode members EL1. The plate electrode PL1 may be formed to include one or more of various electrode materials used in semiconductor device processing. The plate electrode PL1 may have a type of line shape. Therefore, the plate electrode PL1 may be said to be a plate electrode line. The electrode member EL1, the dielectric layer DL1, and the plate electrode PL1 may form a capacitor.

FIG. 22A to FIG. 26B illustrate and describe the method of forming the capacitor by giving examples, but in some cases, the method for forming the capacitor and the specific structure of the capacitor may vary.

In the device structure of FIG. 26A, the lower channel material layer CM1, the word line WL1 surrounding it, and the gate insulating material layer GN1 between them may constitute a first transistor TR1. In addition, the lower electrode member EL1 electrically connected to the first transistor TR1 on the lateral side of the first transistor TR1, and the dielectric layer DL1 in contact with the lower electrode member EL1 and the plate electrode PL1 may constitute a first capacitor CP1. Furthermore, the first transistor TR1 and the first capacitor CP1 may constitute one memory cell (a lower memory cell). The first transistor TR1 and the first capacitor CP1 may be arranged in a horizontal direction.

Furthermore, the upper channel material layer CM1, the word line WL1 surrounding it, and the gate insulating material layer GN1 between them may constitute a second transistor TR2. In addition, the upper electrode member EL1 electrically connected to the second transistor TR2 on the lateral side of the second transistor TR2 and the dielectric layer DL1 in contact with the upper electrode member EL1 and the plate electrode PL1 may constitute a second capacitor CP2. Furthermore, the second transistor TR2 and the second capacitor CP2 constitute one memory cell (an upper memory cell). The second transistor TR2 and the second capacitor CP2 may be arranged in a horizontal direction. The second transistor TR2 may be disposed on the first transistor TR1, and the second capacitor CP2 may be disposed on the first capacitor CP1.

Although not shown, device structures such as those of FIGS. 26A and 26B may be repeatedly arranged in the Z-axis direction, may be repeatedly arranged in the X-axis direction, and may be repeatedly arranged in the Y-axis direction. According to these embodiments of the present invention, it is possible to implement a memory device which may remarkably improve integration degree and have excellent performance and operation characteristics. The memory device may be a stack-type memory device of a gate-all-around (GAA) type having a horizontal arrangement and a stacked structure. Furthermore, the memory device according to an embodiment of the present invention may be a vertical DRAM device or a three-dimensional DRAM device.

Hereinafter, a memory device according to an embodiment of the present invention will be additionally described with reference to FIG. 26A and FIG. 26B.

Referring to FIG. 26A and FIG. 26B, a memory device according to an embodiment of the present invention may include a plurality of memory cells stacked in a vertical direction. Each of the plurality of memory cells may include a transistor and a capacitor electrically connected to the transistor in a lateral direction. The transistor may correspond to TR1 and TR2, and the capacitor may correspond to CP1 and CP2. The transistor may include a channel material layer CM1, a word line WL1 surrounding the channel material layer CM1, and a gate insulating layer GN1 disposed between them. The capacitor may include an electrode member EL1 electrically connected to the transistor, a dielectric layer DL1 disposed on a surface of the electrode member EL1, and a plate electrode PL1 disposed on a surface of the dielectric layer DL1.

Furthermore, the memory device may include a bit line BL1 connected to a plurality of transistors of the plurality of memory cells. The bit line BL1 may extend in the vertical direction. A body insulating layer BN1 surrounding at least a portion of the outer surface of the bit line BL1 may be disposed between the bit line BL1 and the word line WL1. A filling insulating layer NF1 which is a separate material layer from the body insulating layer BN1 may be disposed between two adjacent word lines WL1 of the plurality of transistors.

In an embodiment of the present invention, the transistor may have a gate-all-around (GAA) structure. In this regard, the transistor and the memory device including it may have excellent characteristics.

The body insulating layer BN1 may have a line shape extending in the same direction as the word line WL1 when observed from above direction, as shown in FIG. 26B. Within the body insulating layer BN1, a plurality of bit lines BL1 may be arranged to be spaced apart from each other in the horizontal direction, that is, the horizontal direction in which the word line WL1 extends.

In addition, the memory device may further include an insertion insulating layer NN1 extending to cover a side surface of the word line WL1 while surrounding a portion (an end portion) of the gate insulating layer GN1 adjacent to the electrode member EL1. The insertion insulating layer NN1 may be a separate material layer from the body insulating layer BN1 and the filling insulating layer NF1. The insertion insulating layer NN1 may be, for example, an atomic layer deposition (ALD) material layer.

According to one embodiment, the body insulating layer BN1 may be in contact with a first side surface (first end) of the filling insulating layer NF1, and the insertion insulating layer NM1 may be in contact with a second side surface (second end) of the filling insulating layer NF1. A portion of the insertion insulating layer NN1 may be contact with the electrode member EL1.

Furthermore, according to one embodiment, a side surface of the insertion insulating layer NN1 may not be in planar contact with a side surface of the dielectric layer DL1. A remaining mold insulating layer (MN1 in FIG. 23B) may be disposed between the insertion insulating layer NN1 and the dielectric layer DL1. The remaining mold insulating layer (MN1 in FIG. 23B) may be disposed between the word line WL1 and the dielectric layer DL1, and the insertion insulating layer NN1 may be disposed between the mold insulating layer (MN1 in FIG. 23B) and the word line WL1, and between the mold insulation layer (MN1 in FIG. 23B) and the gate insulation layer GN1. However, it is not limited to this structure and may be modified.

A memory device according to an embodiment of the present invention may have structural features as shown in FIG. 26A and FIG. 26B. For example, the memory device may have a stacked structure and may have features in the structures of the body insulating layer BN1, the filling insulating layer NF1, the insertion insulating layer NN1 and their peripheral portions, and the transistor and the capacitor.

According to the embodiments of the present invention described above, a stack-type memory device which may improve integration degree and have excellent performance and operation characteristics may be implemented. In particular, according to embodiments of the present invention, after patterning a sacrificial layer according to a given method, a semiconductor material (e.g., oxide semiconductor material) may be later formed in a region (space) from which the pattern of the sacrificial layer was removed. Thus, a manufacturing method of a stack-type memory device which may suppress/prevent property deterioration due to etch damage of a semiconductor material (e.g., oxide semiconductor material) may be implemented. According to one example, the stack-type memory device may be configured to include a dynamic random access memory (DRAM) device. However, at least some of the device structures and the manufacturing methods thereof according to embodiments of the present invention may be applied not only for DRAM devices, but also for other memory devices (e.g., PRAM, RRAM, SRAM, flash memory, MRAM, FRAM, etc.) or a field of technology which implements logic devices with integrated logic circuits, and the like.

FIG. 27A to FIG. 55B are diagrams for explaining an example of a manufacturing method of a memory device (stack-type memory device) according to an embodiment of the present invention.

The same numbers (e.g., FIG. 27 in FIGS. 27A, 27B, and 27C) in FIG. 27A to FIG. 55B represent the same steps. FIGS. 27A, 28A, 29A, 30A, 31A, 32A, 33A, 34A, 35A, 36A, 37A, 38A, 39A, 40A, 41A, 42A, 43A, 44A, 45A, 46A, 47A, 48A, 49A, 50A, 51A, 52A, 53A, 54A, and 55A are cross-sectional diagrams cut along the X-Z plane. FIGS. 27B, 28B, 29B, 30B, 31B, 32B, 33B, 34B, 35B, 36B, 37B, 38B, 39B, 40B, 41B, 42B, 43B, 44B, 45B, 46B, 47B, 48B, 49B, 50B, 51B, 52B, 53B, 54B, and 55B are plan diagrams (i.e. top-view) or a cross-sectional diagrams cut in a plane (i.e. Z-cut view). FIGS. 27C, 28C, 29C, 30C, 31C, 32C, 33C, 34C, 35C, 36C, 37C, and 38C are cross-sectional diagrams cut along the Y-Z plane.

Figure 27A:
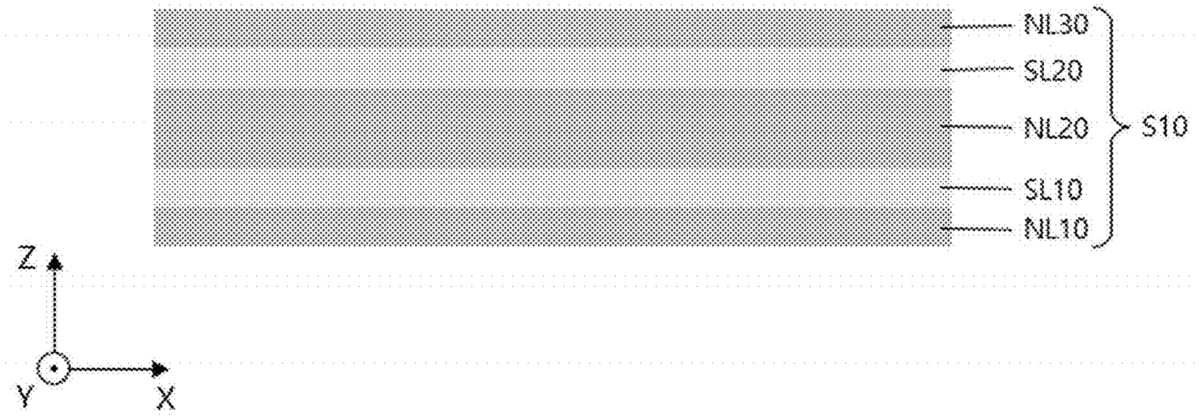
FIGS. 27A, 28A, 29A, 30A, 31A, 32A, 33A, 34A, 35A, 36A, 37A, 38A, 39A, 40A, 41A, 42A, 43A, 44A, 45A, 46A, 47A, 48A, 49A, 50A, 51A, 52A, 53A, 54A, and 55A are cross-sectional diagrams for explaining an example of a manufacturing method of a memory device according to an embodiment of the present invention.
Figure 27B:
FIGS. 27B, 28B, 29B, 30B, 31B, 32B, 33B, 34B, 35B, 36B, 37B, 38B, 39B, 40B, 41B, 42B, 43B, 44B, 45B, 46B, 47B, 48B, 49B, 50B, 51B, 52B, 53B, 54B and 55B are diagrams for explaining an example of a manufacturing method of a memory device according to an embodiment of the present invention.
Figure 27C:
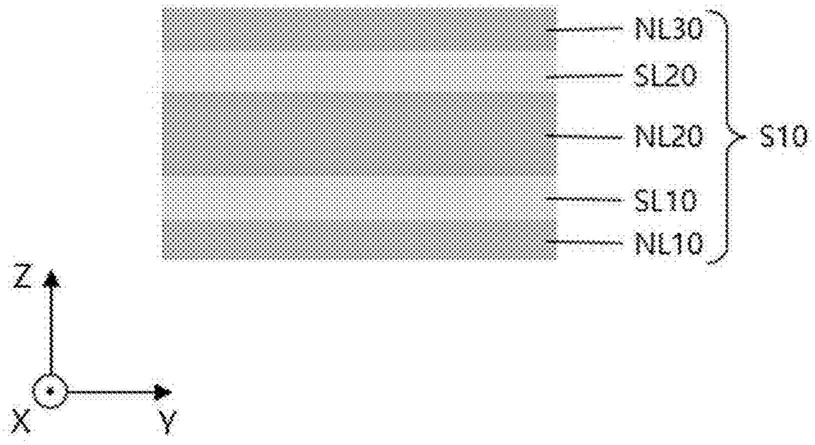
FIGS. 27C, 28C, 29C, 30C, 31C, 32C, 33C, 34C, 35C, 36C, 37C and 38C are cross-sectional diagrams for explaining an example of a manufacturing method of a memory device according to an embodiment of the present invention.

Referring to FIG. 27A to 27C, a stack S10 may be formed on a predetermined substrate (not shown). The material of the substrate may be selected from a variety of materials. The substrate may include a semiconductor material or an insulating material. The substrate may include a semiconductor wafer. The substrate may include a bulk silicon substrate, a silicon-on-insulator (SOI) substrate, a germanium substrate, or a germanium-on-insulator (GOI) substrate, a silicon-germanium substrate, or a substrate formed by an epitaxial growth process.

The stack S10 may be formed on the substrate. The stack S10 may include a first insulating layer NL10, and a first sacrificial layer SL10 and a second insulating layer NL20 which are sequentially stacked on the first insulating layer NL10. As a non-limiting example, the first insulating layer NL10 and the second insulating layer NL20 may include a silicon nitride (e.g., $SiN_x$) or may be formed of a silicon nitride (e.g., $SiN_x$). As a non-limiting example, the first sacrificial layer SL10 may include a silicon oxide (e.g., $SiO_2$) or may be formed of a silicon oxide (e.g., $SiO_2$). The first insulating layer NL10 and the first sacrificial layer SL10 may have an etching selectivity, and similarly, the second insulating layer NL20 and the first sacrificial layer SL0 may have an etching selectivity. The first insulating layer NL10, first sacrificial layer SL10, and second insulating layer NL20 may be formed through a deposition process.

Furthermore, according to one embodiment, the stack S10 may further include a second sacrificial layer SL20 and a third insulating layer NL30 sequentially stacked on the second insulating layer NL20. In this case, the stack S10 may have a vertically symmetrical structure with respect to the second insulating layer NL20. The second sacrificial layer SL20 may be formed of the same material as the first sacrificial layer SL10, and the third insulating layer NL30 may be formed of the same material as the first insulating layer NL10 and/or the second insulating layer NL20. The second sacrificial layer SL20 and the third insulating layer NL30 may be formed through a deposition process.

The second insulating layer NL20 may have a thickness greater than that of each of the first insulating layer NL10, the third insulating layer NL30, the first sacrificial layer SL10, and the second sacrificial layer SL20. For example, the second insulating layer NL20 may have a thickness which is about 1.5 times to about 2.5 times greater than that of each of the first insulating layer NL10, the third insulating layer NL30, the first sacrificial layer SL10, and the second sacrificial layer SL20. It is possible to secure a gap between upper and lower cells to be formed later by forming the second insulating layer NL20 relatively thick. The first insulating layer NL10 and the third insulating layer NL30 may have the same thickness or substantially the same thickness. The first sacrificial layer SL10 and the second sacrificial layer SL20 may have the same thickness or substantially the same thickness. The first insulating layer NL10, the third insulating layer NL30, the first sacrificial layer SL10, and the second sacrificial layer SL20 may have the same thickness or substantially the same thickness.

Figure 28A:
Figure 28B:
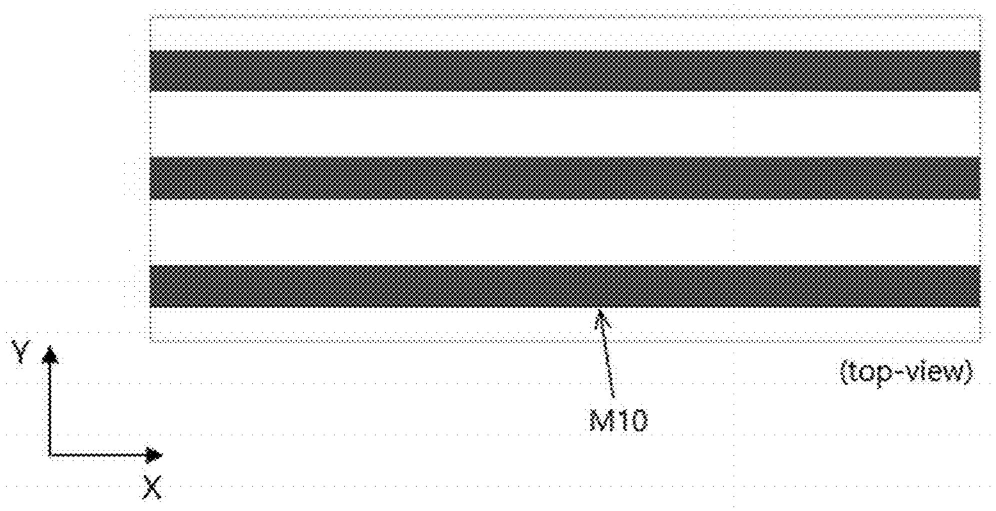
Figure 28C:
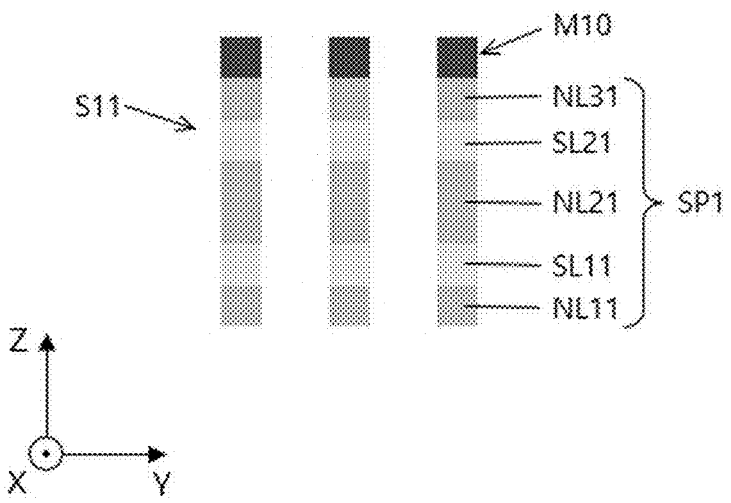

Referring to FIG. 28A to 28C, a patterned stack S11 having at least one pattern portion SP1 may be formed by patterning the stack (S10 in FIG. 27A). The pattern portion SP1 may have a shape extending in a first direction, for example, X-axis direction, and empty spaces may be provided on both sides of the pattern portion SP1 along the second direction perpendicular to the first direction, for example, the Y-axis direction. A plurality of pattern portions SP1 may be spaced apart in the Y-axis direction and arranged side by side in the X-axis direction. In this step, remaining regions except for the region extending from a channel region to be formed later may be removed by patterning. In other words, in this step, the remaining regions except for a region to be a channel and a region extended therefrom may be removed.

The pattern portion SP1 may include a patterned first insulating layer NL11, a patterned first sacrificial layer SL11, a patterned second insulating layer NL21, a patterned second sacrificial layer SL21, and a patterned third sacrificial layer NL31. Here, the patterned first sacrificial layer SL11 may be referred to as the first sacrificial layer pattern SL11 obtained from the first sacrificial layer (SL10 in FIG. 27A). Also, the patterned second sacrificial layer SL21 may be referred to as the second sacrificial layer pattern SL21 obtained from the second sacrificial layer (SL20 in FIG. 27A). A plurality of first sacrificial layer patterns SL11 may be spaced apart from each other in the Y-axis direction and extend parallel to each other in the X-axis direction. Similarly, a plurality of second sacrificial layer patterns SL21 may be spaced apart from each other in the Y-axis direction, and may extend parallel to each other in the X-axis direction. Each of the first sacrificial layer patterns SL11 and the second sacrificial layer patterns SL21 may have a line shape.

A first mask pattern M10 disposed on the stack (S10 in FIG. 27A) may be used for the patterning process of FIG. 28A to FIG. 28C. The first mask pattern M10 may have a predetermined pattern structure. The first mask pattern M10 may be, for example, a photoresist pattern. The first mask pattern M10 may be removed after the patterning process.

Figure 29A:
Figure 29B:
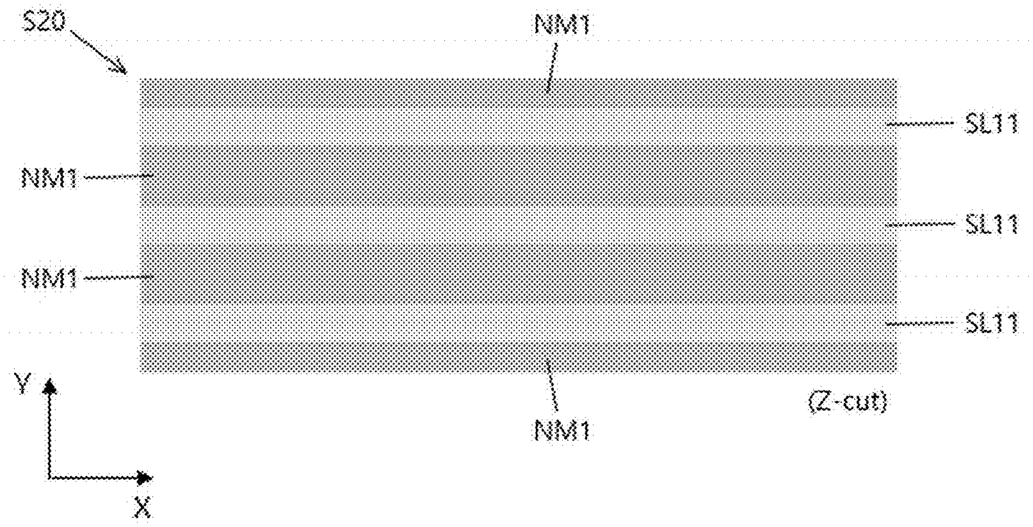
Figure 29C:
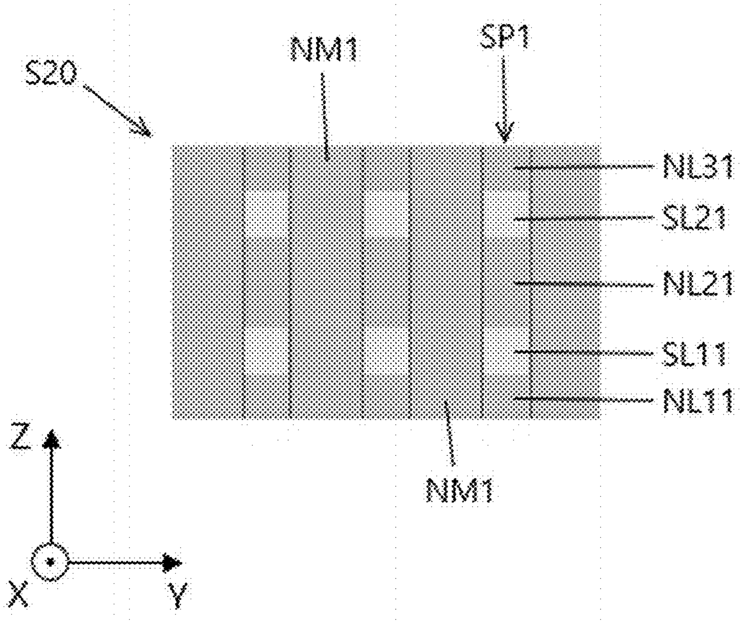

Referring to FIG. 29A to FIG. 29C, a structure S20 including the patterned stack (S11 in FIG. 28*a*) and an insulating material NM1 may be formed by filling the empty spaces on both sides of at least one pattern portion SP1 with the insulating material NM1. Here, FIG. 29B may be a cross-sectional diagram observed along line (A) of FIG. 29A.

The insulating material NM1 may be referred to as an 'insulating material layer' or an 'insulating material layer pattern', and may have the same (or substantially the same) height as the pattern portion SP1. The insulating material NM1 may be formed of the same material as the first to third insulating layers NL11, NL21, and NL31. For example, the insulating material NM1 may include a silicon nitride (e.g., $SiN_x$) or may be formed of a silicon nitride (e.g., $SiN_x$). Accordingly, a plurality of first sacrificial layer patterns SL11 and a plurality of second sacrificial layer patterns SL21 formed of a second material may be disposed in a matrix material layer formed of a first material, and the second material may have an etching selectivity with respect to the first material.

Figure 30A:
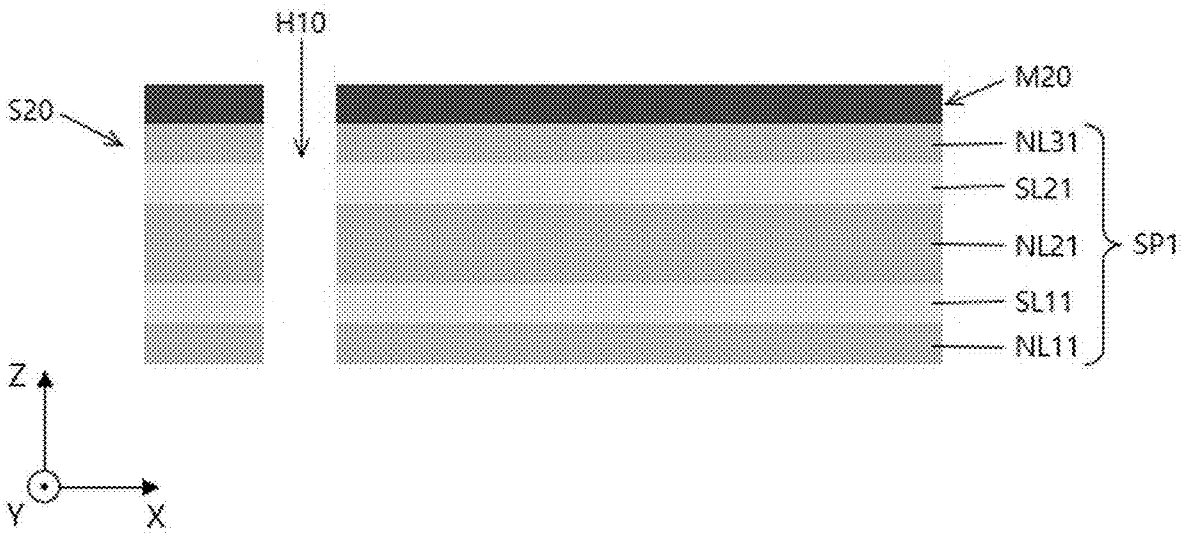
Figure 30B:
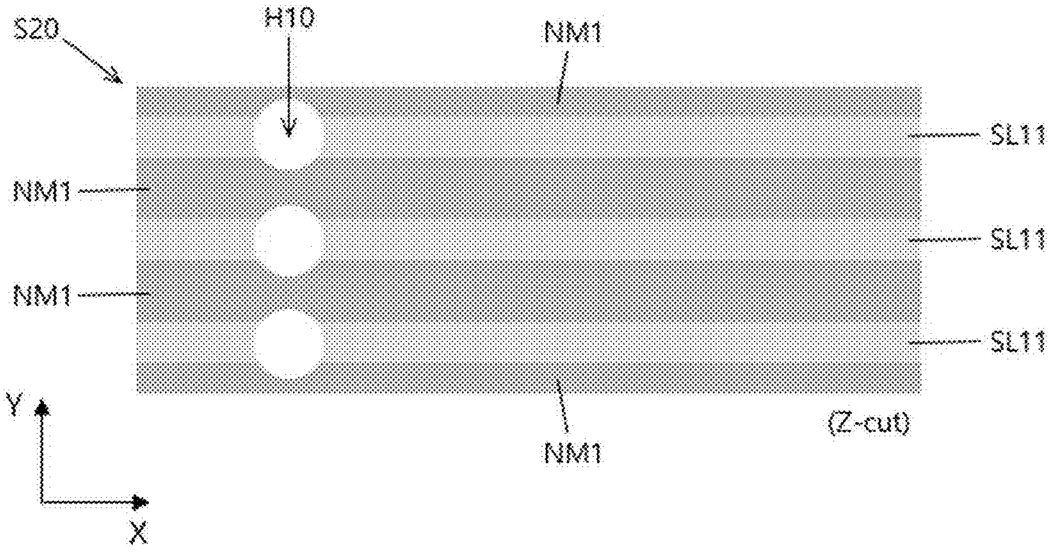
Figure 30C:
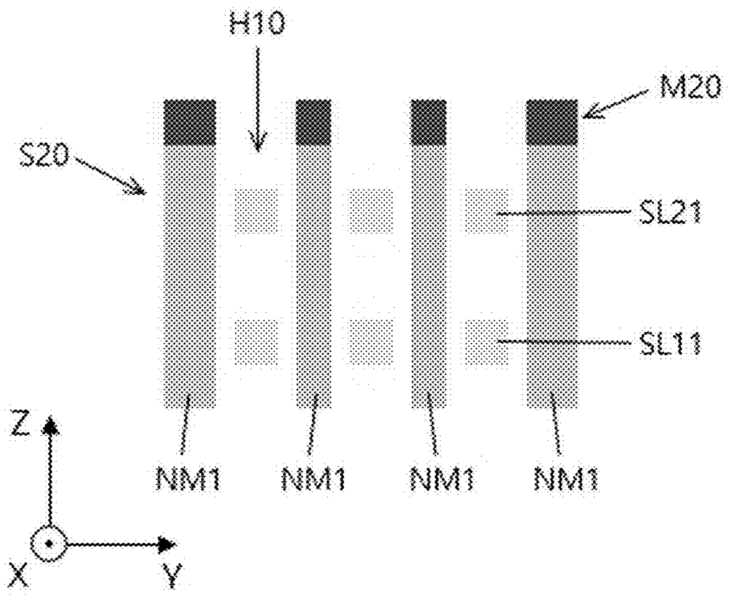

Referring to FIG. 30A to FIG. 30C, a first vertical hole H10 penetrating through the first sacrificial layer pattern SL11 of the pattern portion SP1 may be formed in the structure S20. The first vertical hole H10 may be formed to penetrate through the second sacrificial layer pattern S21 and the first sacrificial layer pattern S11. The first vertical hole H10 may be formed to penetrate from the third insulating layer NL31 to the first insulating layer NL11 of the pattern portion SP1 in a predetermined region of the structure S20. The first vertical hole H10 may correspond to a region where a bit line will be formed later. The first vertical hole H10 may be formed in a region of the structure S20 where a transistor will be formed, that is, a transistor formation region (transistor formation planned region). A plurality of first vertical holes H10 may be formed to be spaced apart from each other in the Y-axis direction. As the first vertical hole H10 is formed, the side surfaces of the first sacrificial layer pattern S11 and the second sacrificial layer pattern S21 may be exposed.

A second mask pattern M20 may be used to form the first vertical hole H10. The second mask pattern M20 may have a predetermined opening pattern. The second mask pattern M20 may be, for example, a photoresist pattern. The second mask pattern M20 may be removed after forming the first vertical hole H10.

Figure 31A:
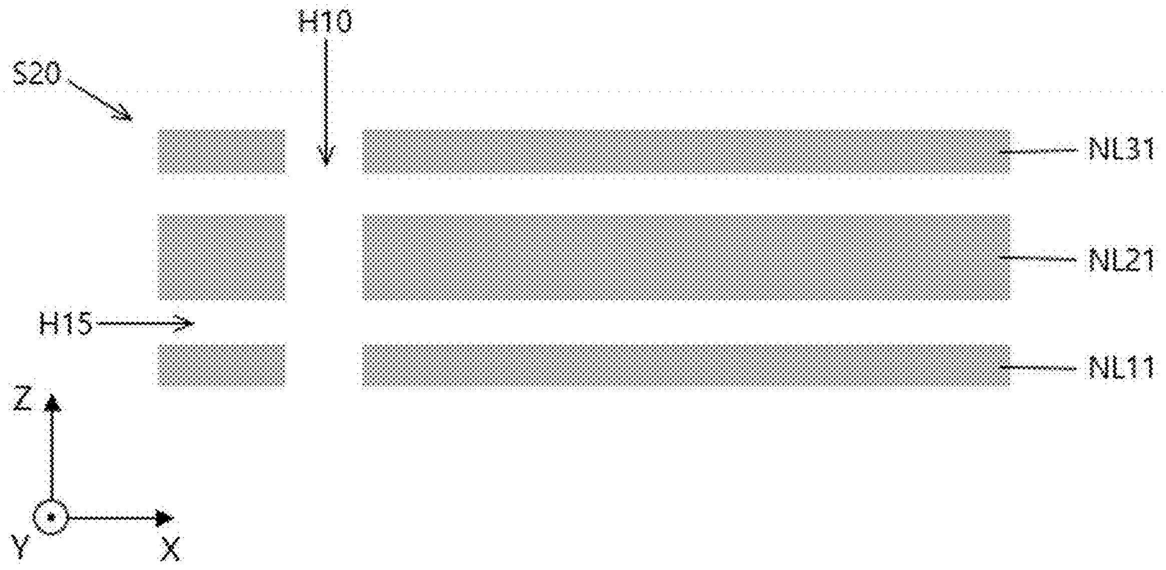
Figure 31B:
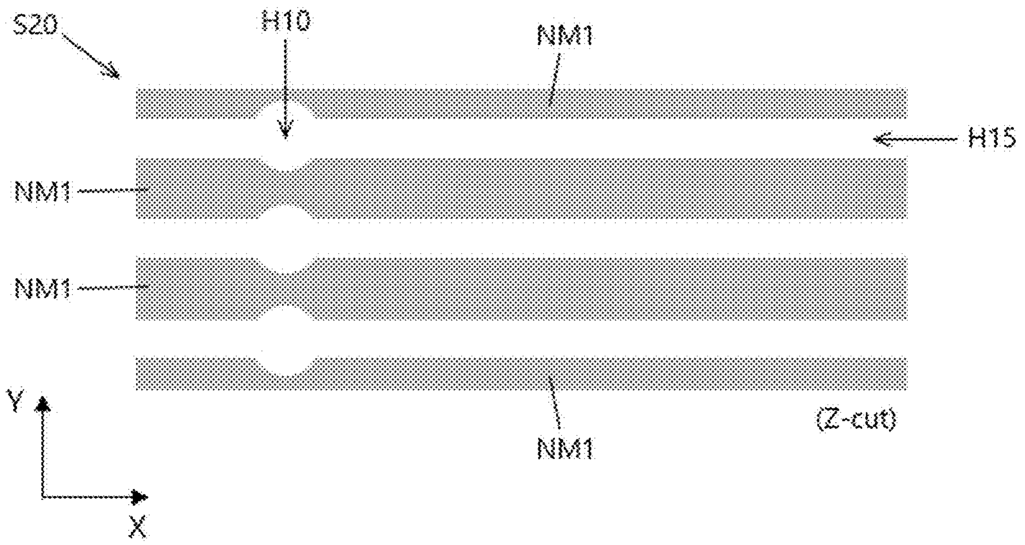
Figure 31C:
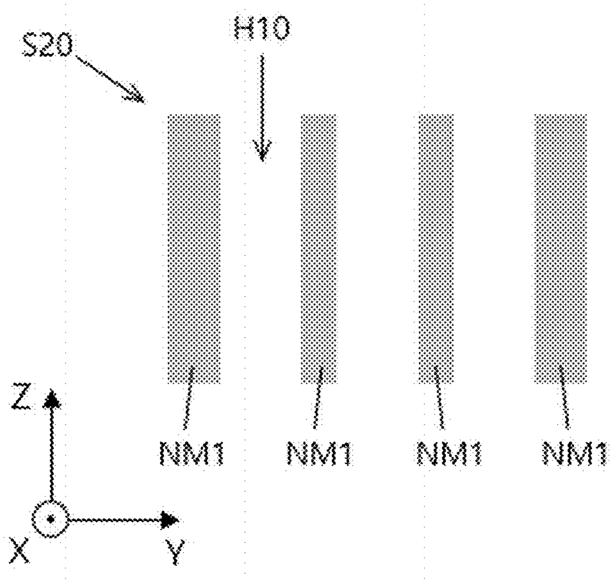

Referring to FIG. 31A to FIG. 31C, a horizontal hole H15 extending in a direction, for example, the X-axis direction may be formed by removing the first sacrificial layer pattern (SL11 in FIG. 30A) and the second sacrificial layer pattern (SL21 in FIG. 30A) exposed by the first vertical hole H10. The first sacrificial layer pattern (SL11 in FIG. 30A) and the second sacrificial layer pattern (SL21 in FIG. 30A) may be selectively removed by using a wet etching process using a wet etchant having etching selectivity for the first sacrificial layer pattern (SL11 in FIG. 30A) and the second sacrificial layer pattern (SL21 in FIG. 30A). The horizontal hole H15 formed by removing the first sacrificial layer pattern (SL11 in FIG. 30A) may be referred to as a first horizontal hole, and the horizontal hole H15 formed by removing the second sacrificial layer pattern (SL21 in FIG. 30A) may be referred to as a second horizontal hole. The horizontal hole H15 may have a line shape extending in the X-axis direction.

According to one embodiment, in the step for forming the horizontal hole H15, the entire first sacrificial layer pattern (SL11 in FIG. 30A) may be removed. Additionally, in the step of forming the horizontal hole H15, the entire second sacrificial layer pattern (SL21 in FIG. 30A) may be removed. Accordingly, the horizontal hole H15 may be formed to extend not only to the region where a transistor will be formed (i.e., transistor formation region) but also to the region where a capacitor will be formed (i.e., capacitor formation region). In this step, when the entire first sacrificial layer pattern (SL11 in FIG. 30A) and the entire second sacrificial layer pattern (SL21 in FIG. 30A) are removed, an effect that the process may be simplified may be obtained in connection with this removal.

Figure 32A:
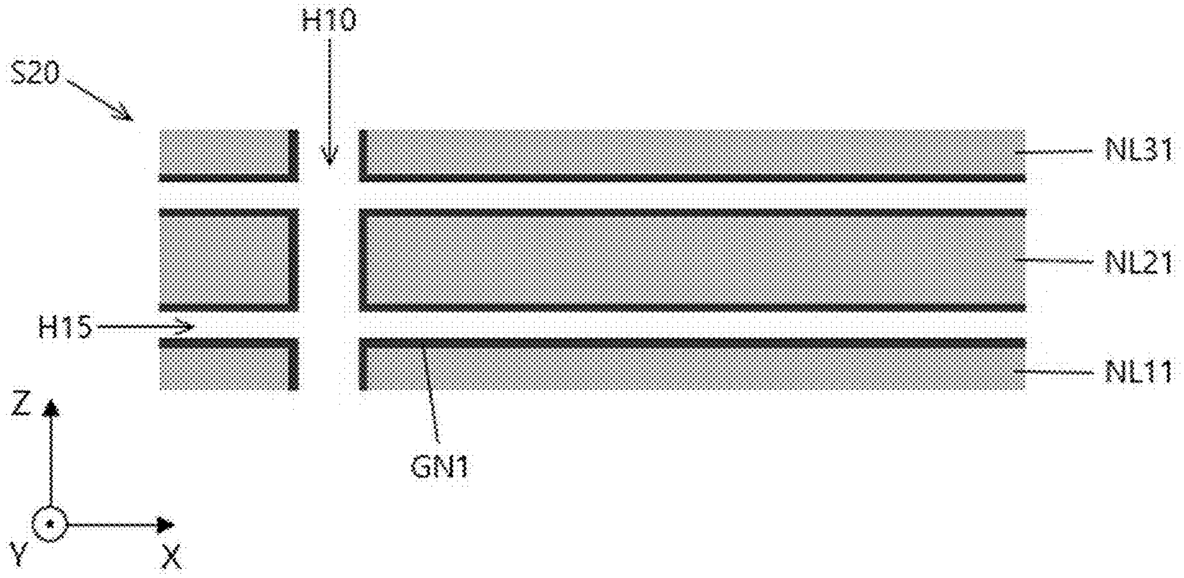
Figure 32B:
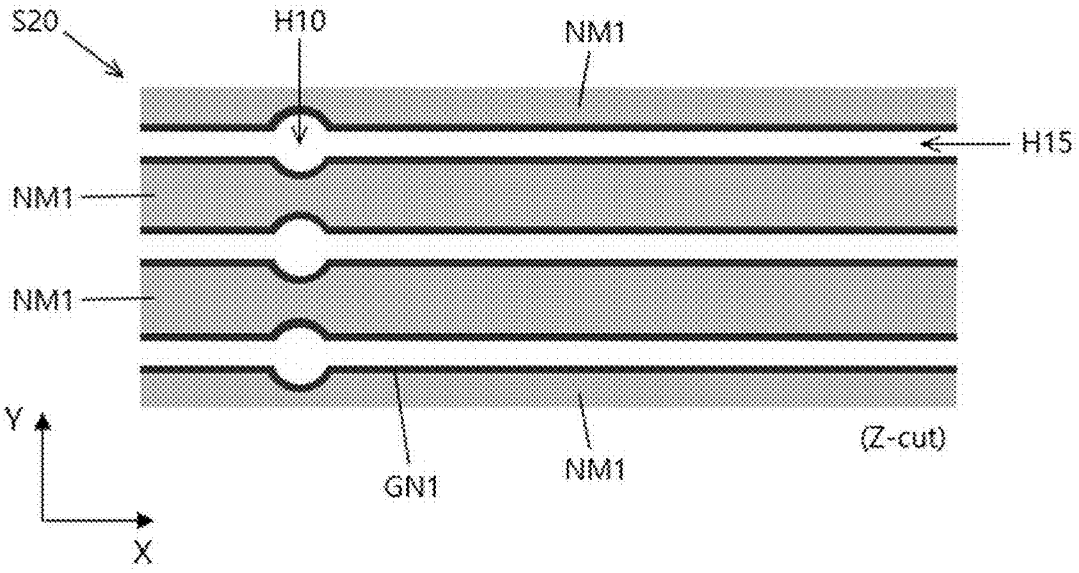
Figure 32C:
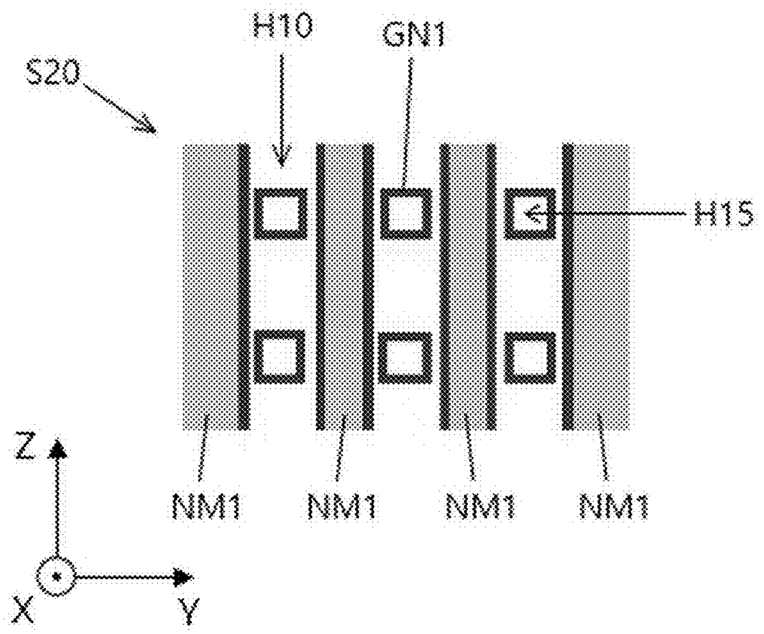

Referring to FIG. 32A to FIG. 32C, a gate insulating material layer GN1 may be formed on inner surfaces of the first vertical hole H10 and the first horizontal hole H15. The gate insulating material layer GN1 may be formed conformally according to the shape of the inner surfaces of the first vertical hole H10 and the horizontal hole H15. The gate insulating material layer GN1 may be formed, for example, through an atomic layer deposition (ALD) process. The gate insulating material layer GN1 may be formed to include at least any one selected from a silicon oxide, a silicon nitride, a silicon oxynitride, and a high-k material. Here, the high-k material may be a material with a higher dielectric constant than that of a silicon nitride. The specific material of the gate insulating material layer GN1 is not limited to the above and may vary in various ways. The gate insulating material layer GN1 may be formed so thin that it may not fill the interior of the first vertical hole H10 and the horizontal hole H15.

In the steps of FIG. 32A to FIG. 32C, since the gate insulating material layer GN1 may be formed without a patterning process by dry etching, an effect that etching damage and characteristic deterioration for the gate insulating material layer GN1 may be prevented or suppressed may be obtained.

Figure 33A:
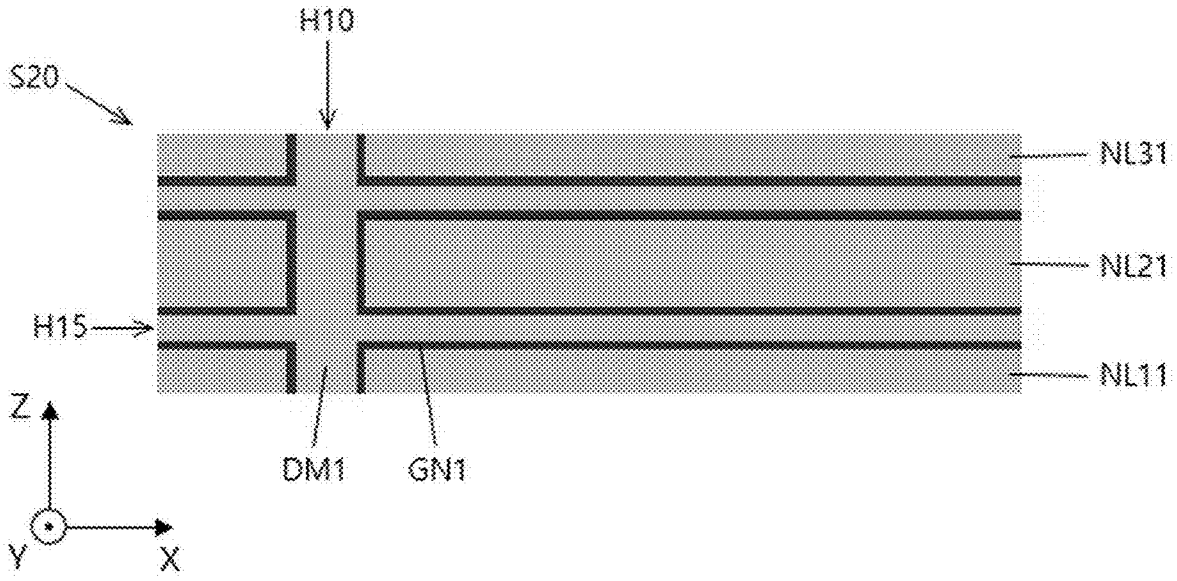
Figure 33B:
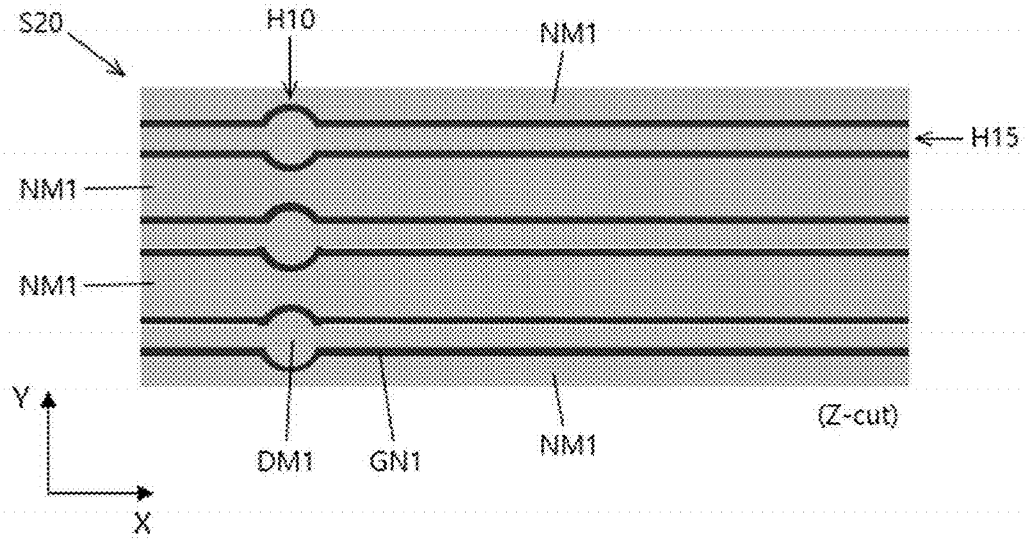
Figure 33C:
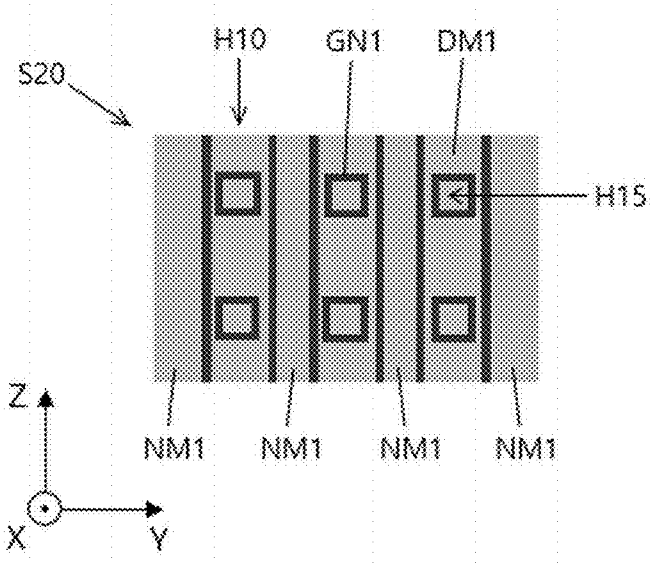

Referring to FIG. 33A to FIG. 33C, a dummy channel material layer DM1 may be formed on the gate insulating material layer GN1 to fill the first vertical hole H10 and the horizontal hole H15. The dummy channel material layer DM1 may be a dummy layer temporarily formed in a region where a channel is to be formed and a region extending therefrom. The dummy channel material layer DM1 may be formed of a certain semiconductor material. For example, the dummy channel material layer DM1 may include poly-silicon (poly-Si) or be formed of poly-silicon (poly-Si). When the dummy channel material layer DM1 includes poly-silicon (poly-Si), formation and selective removal of the dummy channel material layer DM1 may be easy. Since poly-silicon (poly-Si) may have a high etching selectivity for certain insulating layers, it may be advantageous in performing various subsequent processes, and selective removal of the dummy channel material layer DM1 may also be easy. However, the material of the dummy channel material layer DM1 is not limited to poly-silicon (poly-Si) and may vary depending on the cases. For example, the dummy channel material layer DM1 may include an amorphous silicon or another semiconductor material, or in some cases, a non-semiconductor material.

In an embodiment of the present invention, since the dummy channel material layer DM1 is formed by forming the patterned horizontal hole H15 by using the sacrificial layer pattern (SL11, SL21 in FIG. 29A), and then filling the patterned horizontal hole H15 with a dummy material, the dummy channel material layer DM1 may be formed without a patterning process such as dry etching.

Figure 34A:
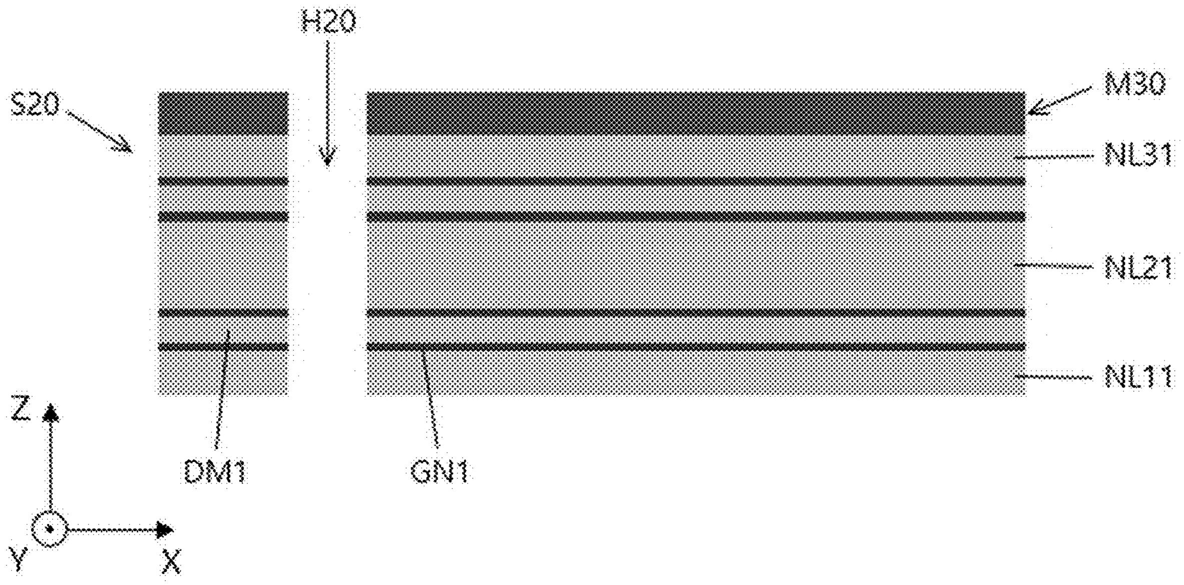
Figure 34B:
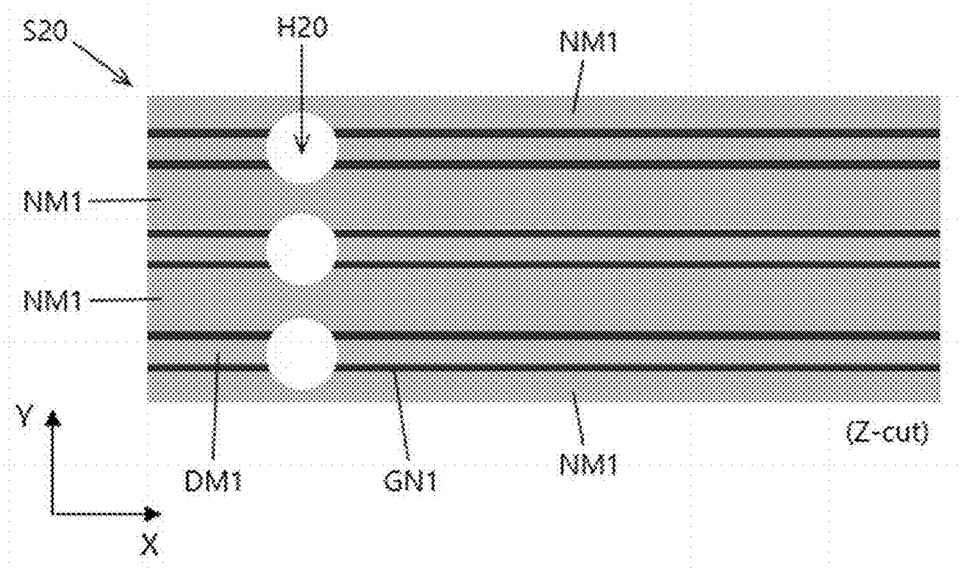
Figure 34C:
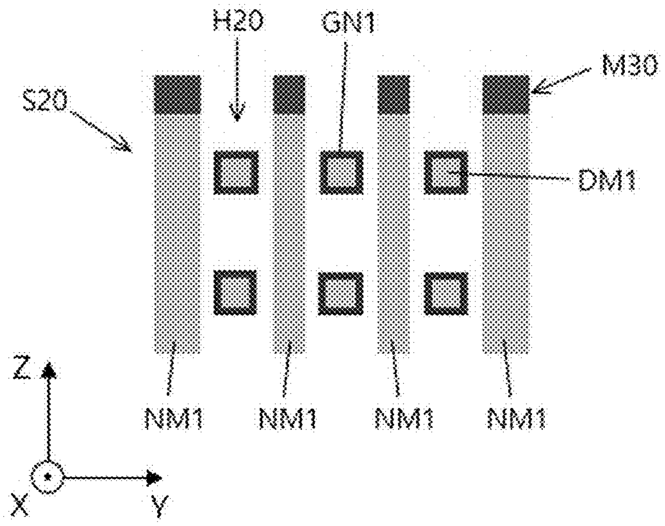

Referring to FIG. 34A to FIG. 34C, in the structure S20 in which the gate insulating material layer GN1 and the dummy channel material layer DM1 are formed, a second vertical hole H20 may be formed in a region corresponding to the first vertical hole (H10 in FIG. 33A). The second vertical hole H20 may be formed to penetrate from the third insulating layer NL31 to the first insulating layer NL11.

A third mask pattern M30 may be used to form the second vertical hole H20. The third mask pattern M30 may have a predetermined opening pattern. The third mask pattern M30 may be, for example, a photoresist pattern. The third mask pattern M30 may be removed after forming the second vertical hole H20.

Figure 35A:
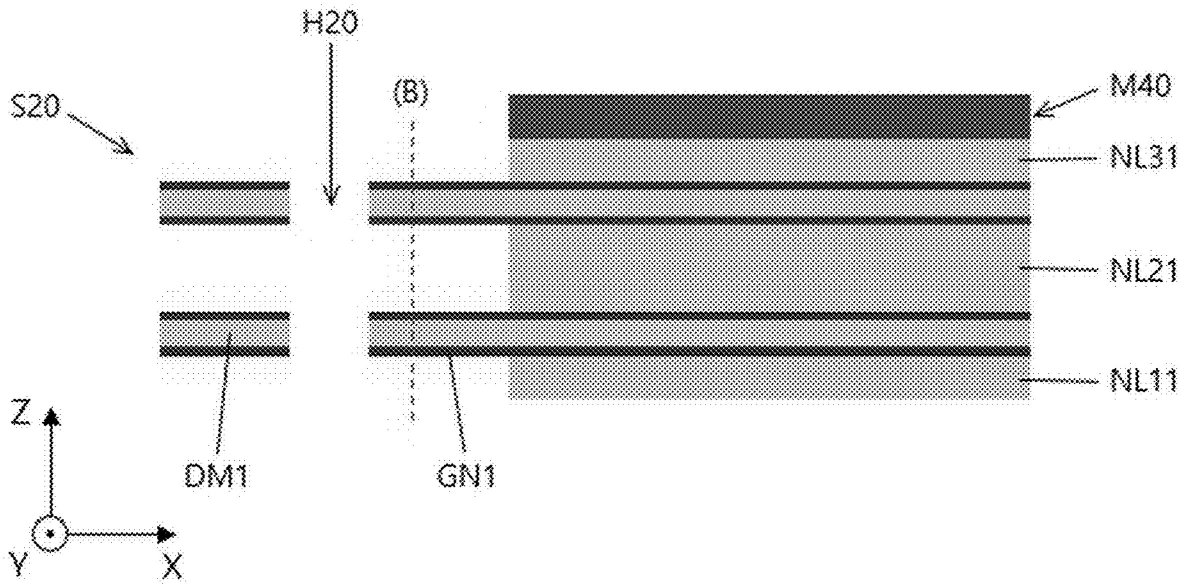
Figure 35B:
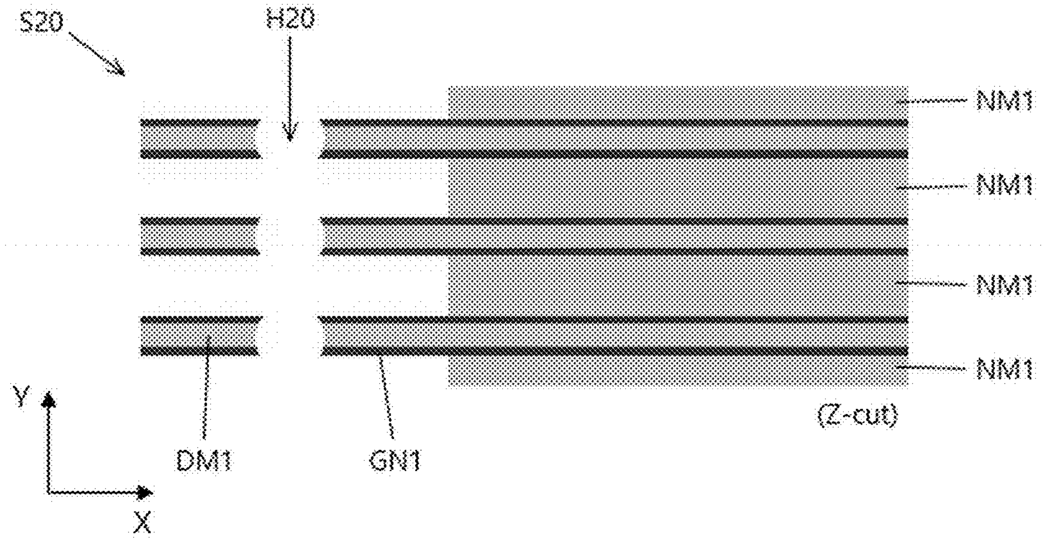
Figure 35C:
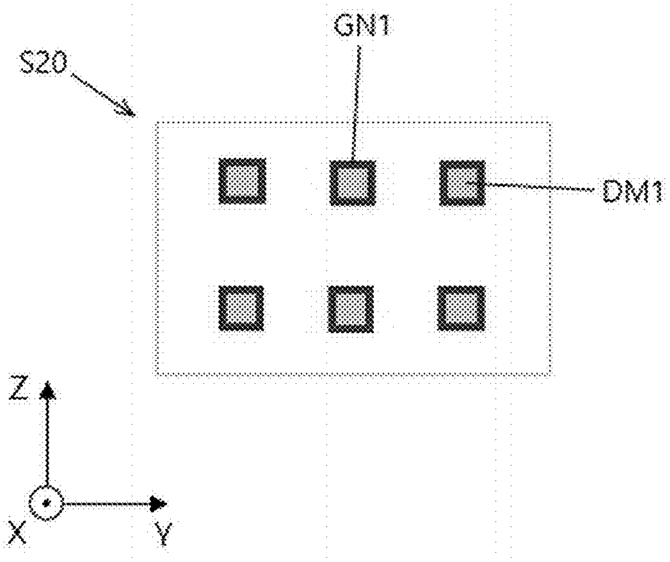

Referring to FIG. 35A to FIG. 35C, the gate insulating material layer GN1 may be exposed by removing the first to the third insulating layers NL11, NL21, and NL31 and the insulating material NM1 in the transistor formation region (transistor formation planned region) around the second vertical hole H20 of the structure S20. At this time, a fourth mask pattern M40 may be formed on a capacitor formation region (capacitor formation planned region) adjacent to the transistor formation region (transistor formation planned region), and the fourth mask pattern M40 may be formed to expose the transistor formation region. The first to the third insulating layers NL11, NL21, and NL31 and the insulating material NM1 may be etched and removed from the transistor formation region by using the fourth mask pattern M40 as an etching mask. Then, the fourth mask pattern M40 may be removed. FIG. 35C may be a cross-sectional view taken along line (B) of FIG. 35A.

Then, a word line (WL1 in FIG. 41A) surrounding the exposed portion of the gate insulating material layer GN1 may be formed by using the method illustrated in FIG. 36A to FIG. 41B in the transistor formation region.

Figure 36A:
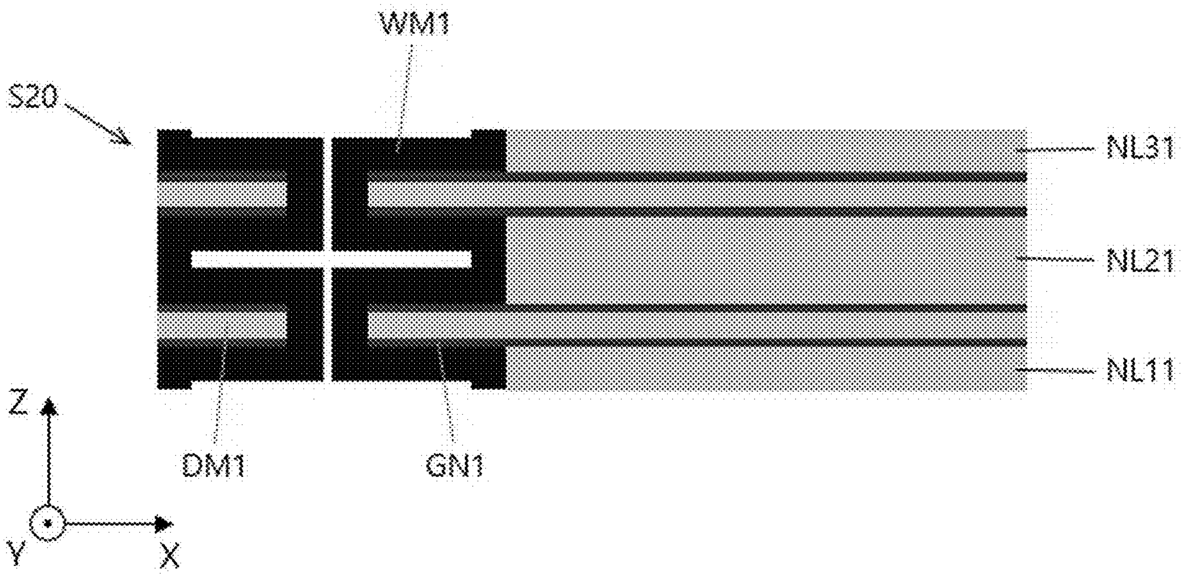
Figure 36B:
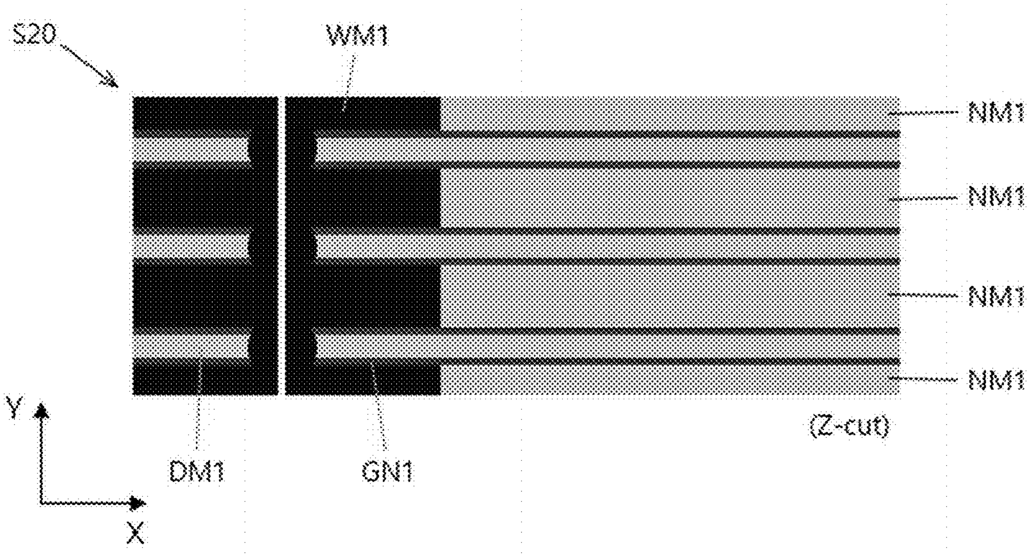
Figure 36C:
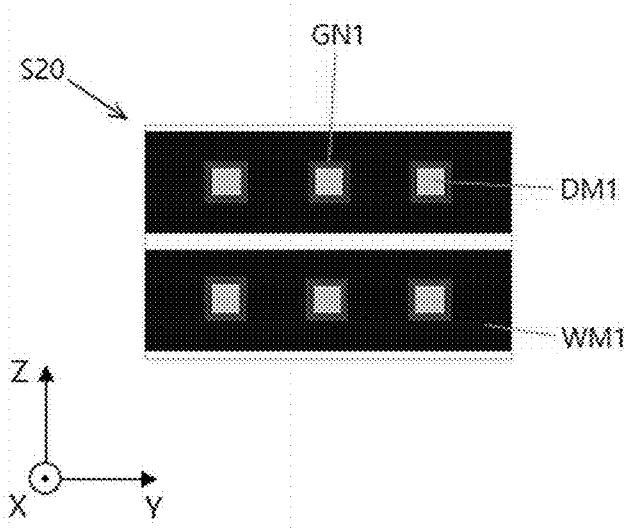

Referring to FIG. 36A to FIG. 36C, a word line material layer WM1 surrounding a portion of the exposed gate insulating material layer GN1 may be formed in the transistor formation region. The word line material layer WM1 may be formed substantially conformally according to the shape of the surface regions exposed in the transistor formation region. The word line material layer WM1 may be formed through, for example, an ALD process. At this time, as shown in FIG. 36A and FIG. 36C, the gap in the Z-axis direction between the lower dummy channel material layer DM1 and the upper dummy channel material layer DM1 may be greater than about twice the thickness of the word line material layer WM1. Furthermore, the gap in the Z-axis direction between the lower gate insulating material layer GN1 and the upper gate insulating material layer GN1 may be larger than about twice the thickness of the word line material layer WM1. Meanwhile, as shown in FIG. 36B, the gap in the Y-axis direction between the two dummy channel material layers DM1 spaced apart in the Y-axis direction may be less than about twice the thickness of the word line material layer WM1. Furthermore, the gap in the Y-axis direction between the two gate insulating material layers GN1 spaced apart in the Y-axis direction may be less than about twice the thickness of the word line material layer WM1.

The word line material layer WM1 may be formed to surround each dummy channel material layer DM1 in the transistor formation region. Furthermore, the word line material layer WM1 may have a line shape extending in the Y-axis direction.

Figure 37A:
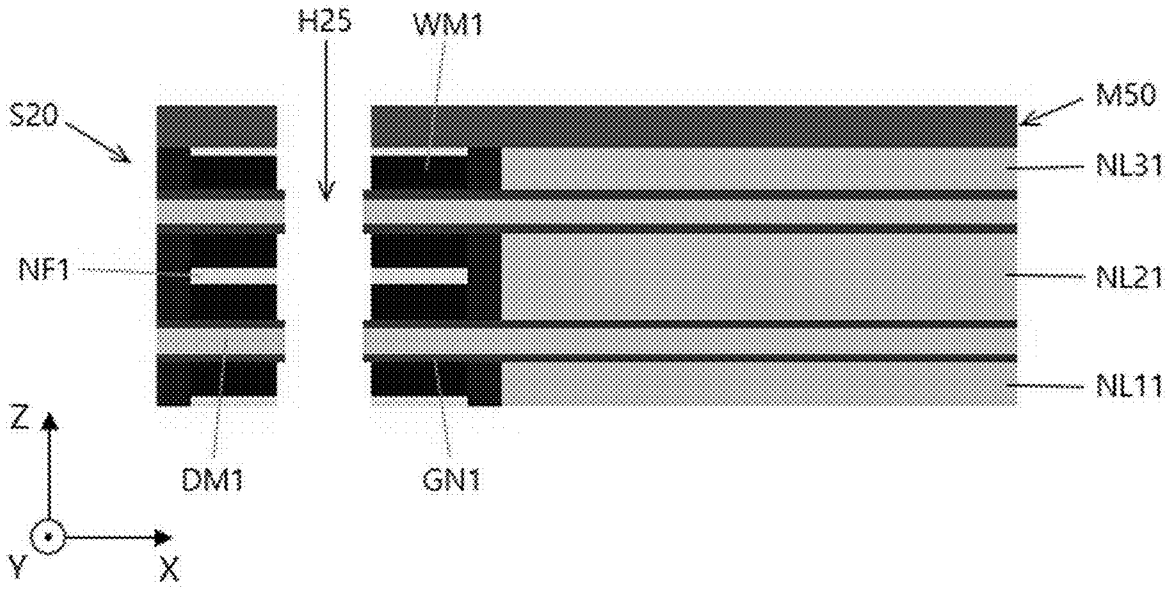
Figure 37B:
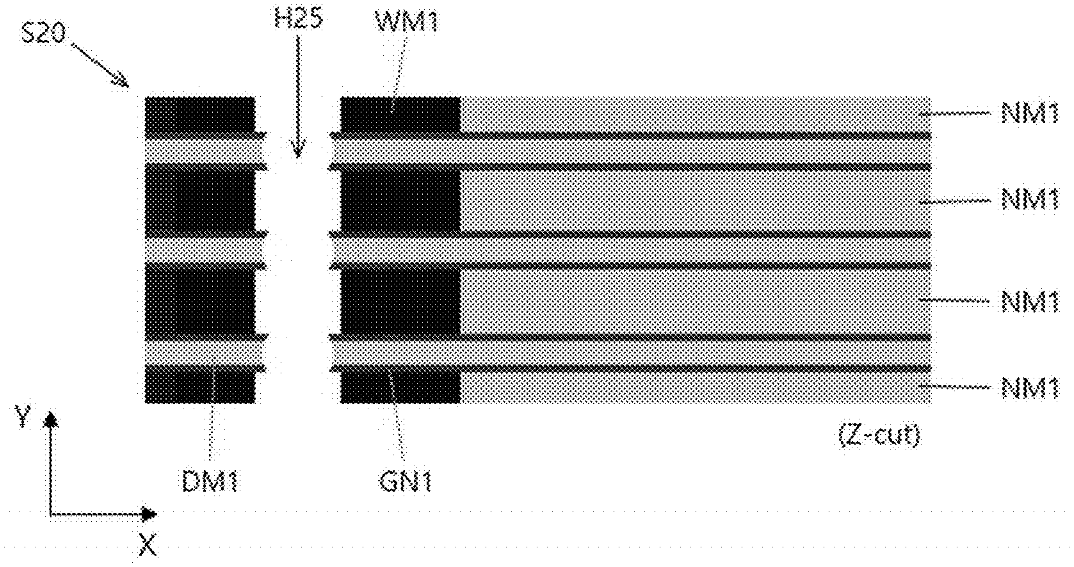
Figure 37C:
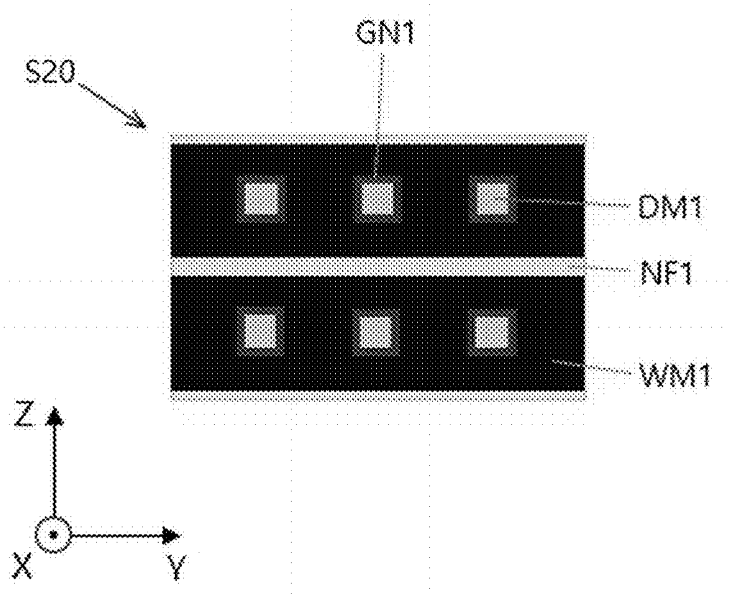

Referring to FIG. 37A to FIG. 37C, a through hole H25 may be formed by etching a region corresponding to the second vertical hole (H20 in FIG. 34A) in the word line material layer WM1. The through hole H25 may be a vertical hole. A fifth mask pattern M50 may be used to form the through hole H25. The fifth mask pattern M50 may have a predetermined opening pattern. The fifth mask pattern M50 may be, for example, a photoresist pattern.

Next, a filling insulating layer NF1 may be formed to fill the empty space of the curved portion (bent portion) of the word line material layer WM1. The filling insulating layer NF1 may be a type of gap fill material layer. The filling insulating layer NF1 may be formed of an insulating oxide or another insulating material. Then, the through hole H25 may be formed through hole etching again.

Then, a portion of the word line material layer WM1 exposed through the through hole H25 may be recessed so that one end of the dummy channel material layer DM1 may protrude toward the through hole H25 rather than the word line material layer WM1. Accordingly, a portion of the word line material layer WM1 may be etched around the through hole H25, and a trench structure (i.e., body portion trench) extending in the Y-axis direction may be formed. It may be understood that the through hole H25 is included in the trench structure (i.e., body portion trench).

Figure 38A:
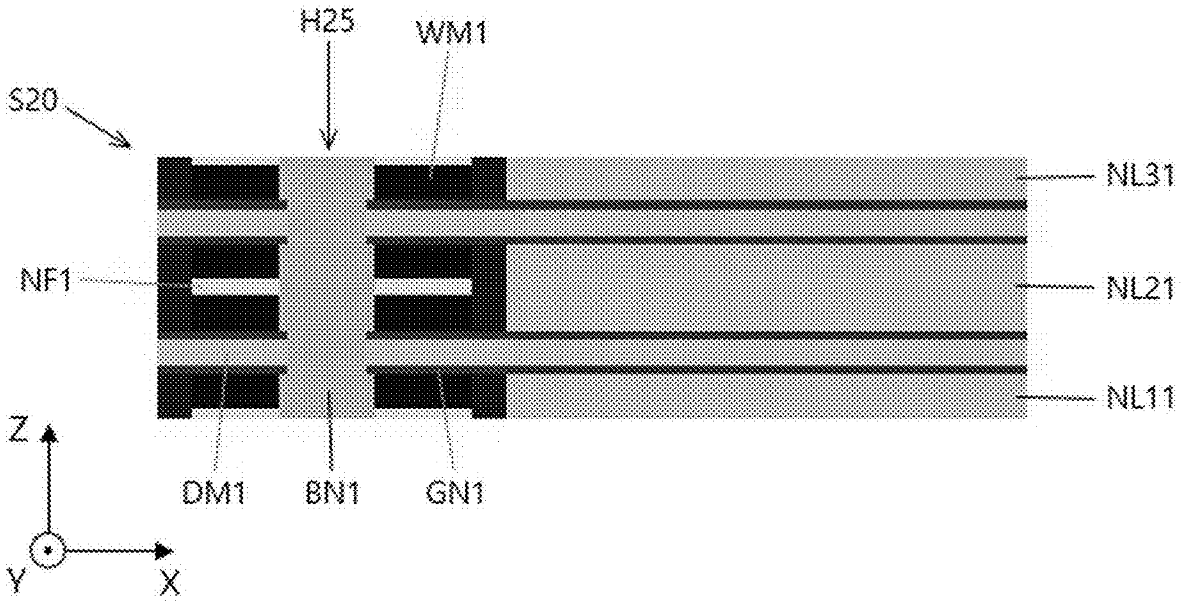
Figure 38B:
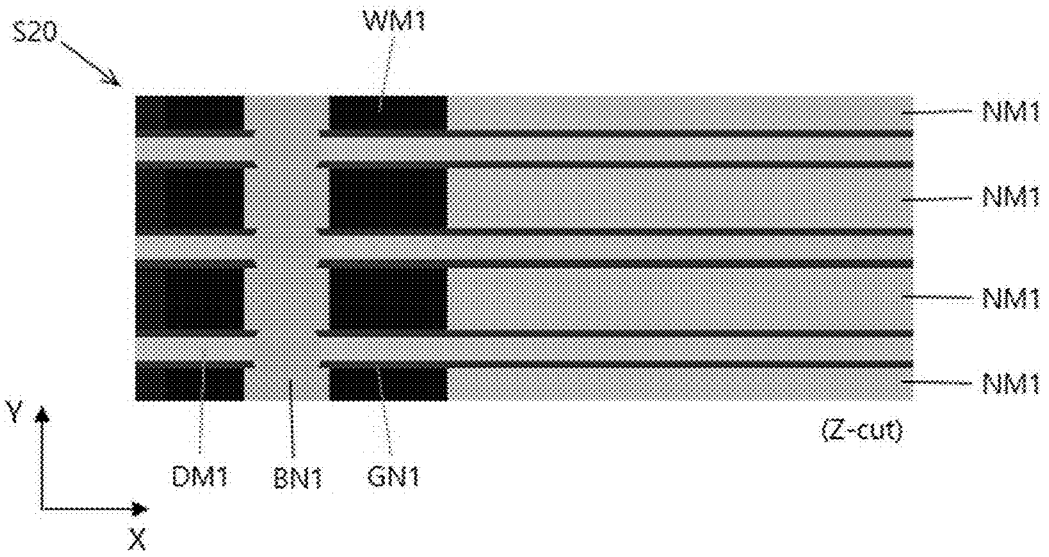
Figure 38C:
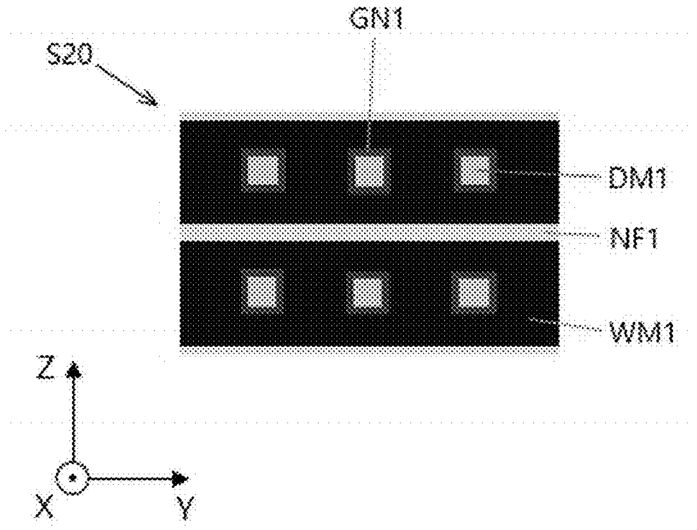

Referring to FIG. 38A to FIG. 38C, a body insulating layer BN1 may be formed to fill the through hole H25 and the trench structure (i.e., body portion trench) around the through hole H25. The body insulating layer BN1 may be formed of an insulating oxide or another insulating material. The body insulating layer BN1 may be formed of the same material as the filling insulating layer NF1 or may be formed of a different material.

Figure 39A:
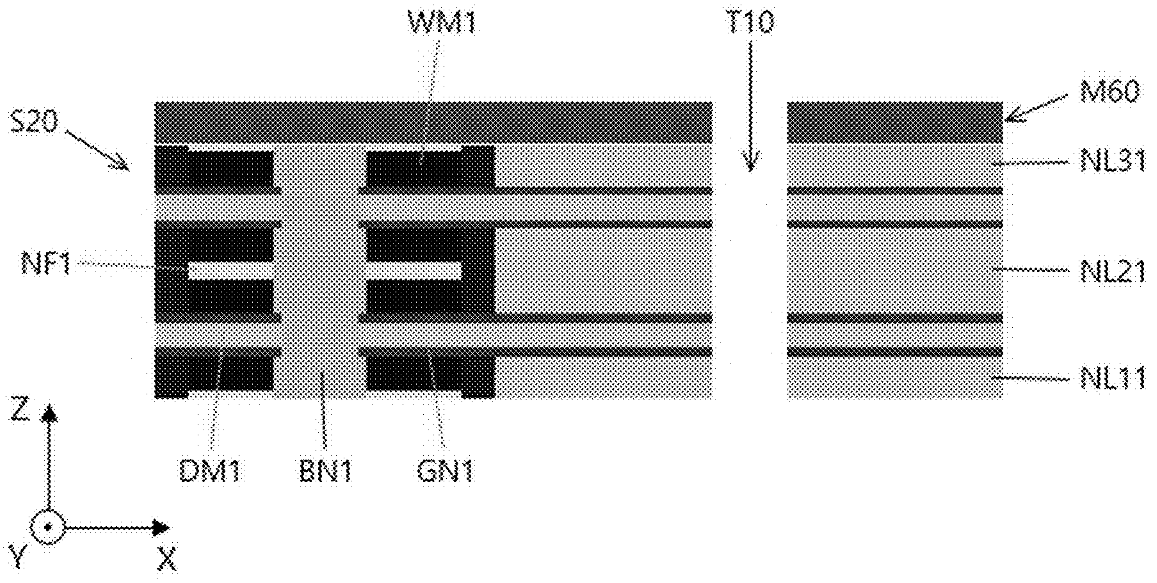
Figure 39B:
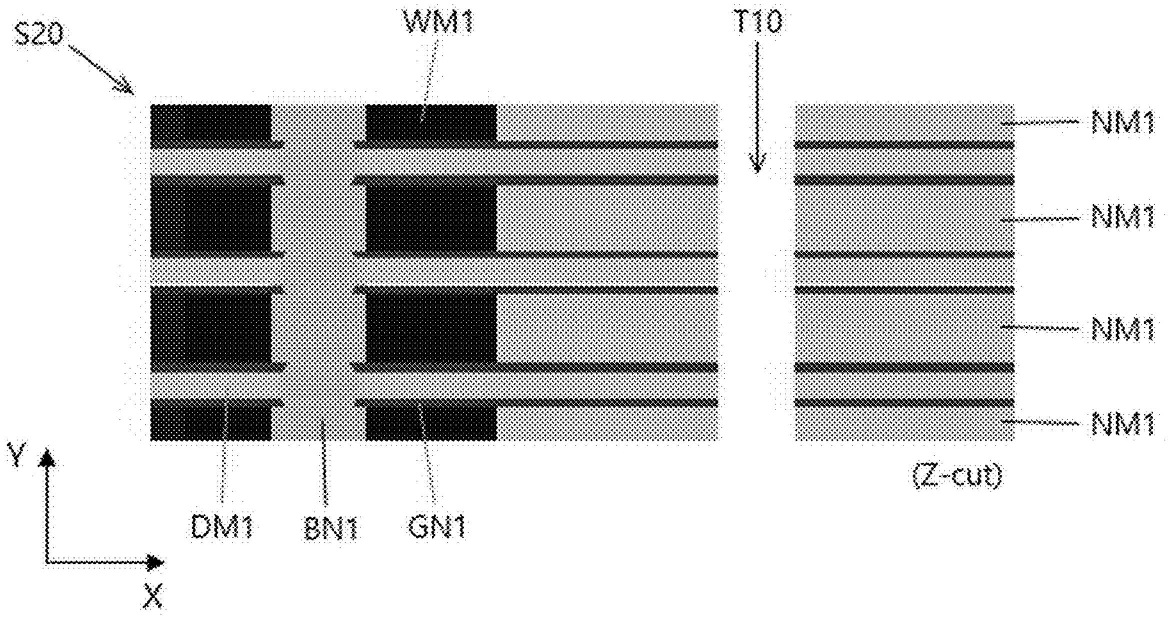

Referring to FIG. 39A and FIG. 39B, a first trench T10 may be formed in the capacitor formation region adjacent to the transistor formation region of the structure S20. The first trench T10 may be disposed to be spaced apart from the word line material layer WM1, may be formed to penetrate from the third insulating layer NL31 to the first insulating layer NL11, and may have a shape extending in the Y-axis direction.

A sixth mask pattern M60 may be used to form the first trench T10. The sixth mask pattern M60 may have a predetermined opening area. The sixth mask pattern M60 may be, for example, a photoresist pattern. The sixth mask pattern M60 may be removed after forming the first trench T10.

Figure 40A:
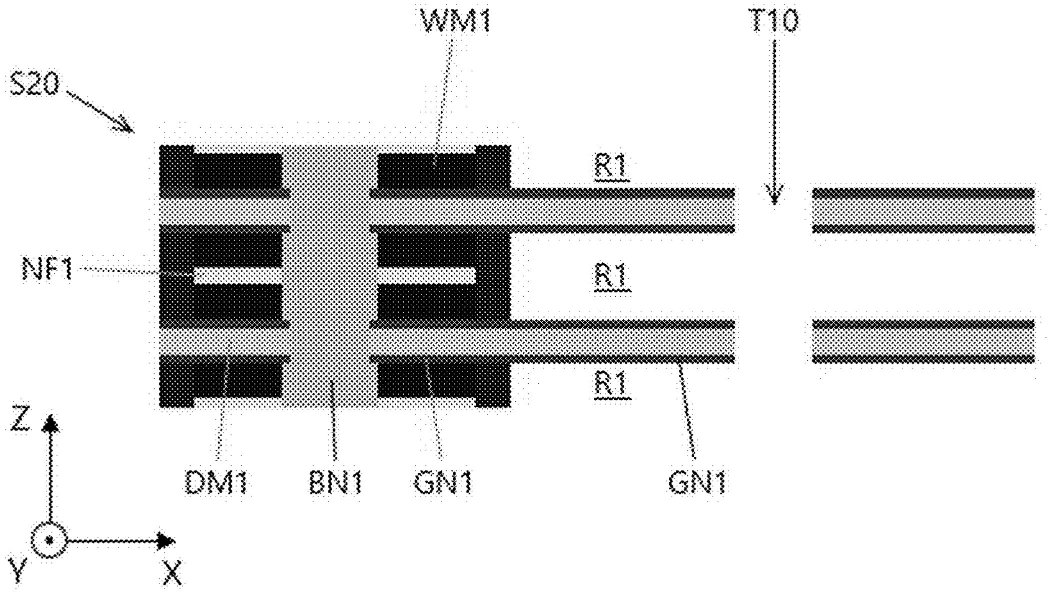
Figure 40B:
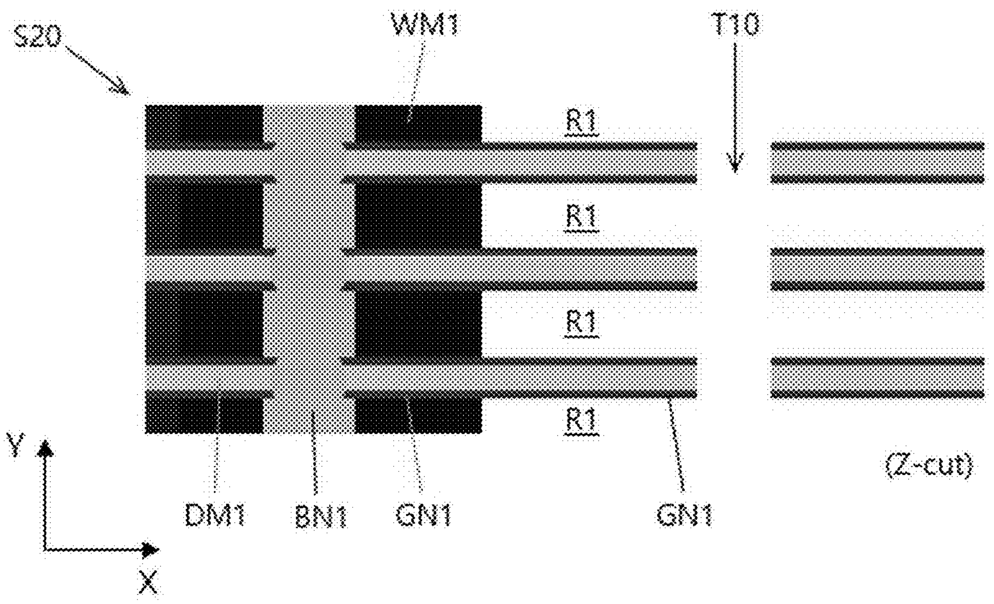

Referring to FIG. 40A and FIG. 40B, a first recess (first recess portion) R1 exposing the gate insulating material layer GN1 may be formed by removing (etching) the first to third insulating layers (NL11, NL21, and NL31 in FIG. 39A) and the insulating material (NM1 in FIG. 39B) exposed by the first trench T10 in the capacitor formation region are exposed. Since the first to the third insulating layers (NL11, NL21, and NL31 in FIG. 39Aa) and the insulating material (NM1 in FIG. 39B) may be the same material, they may be easily removed by using an etching method having an etching selectivity.

Figure 41A:
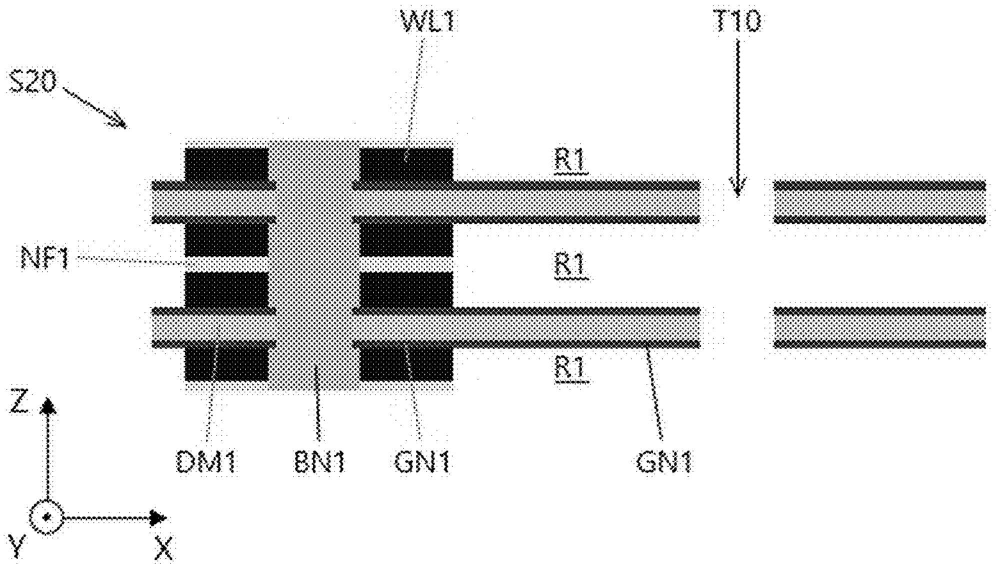
Figure 41B:
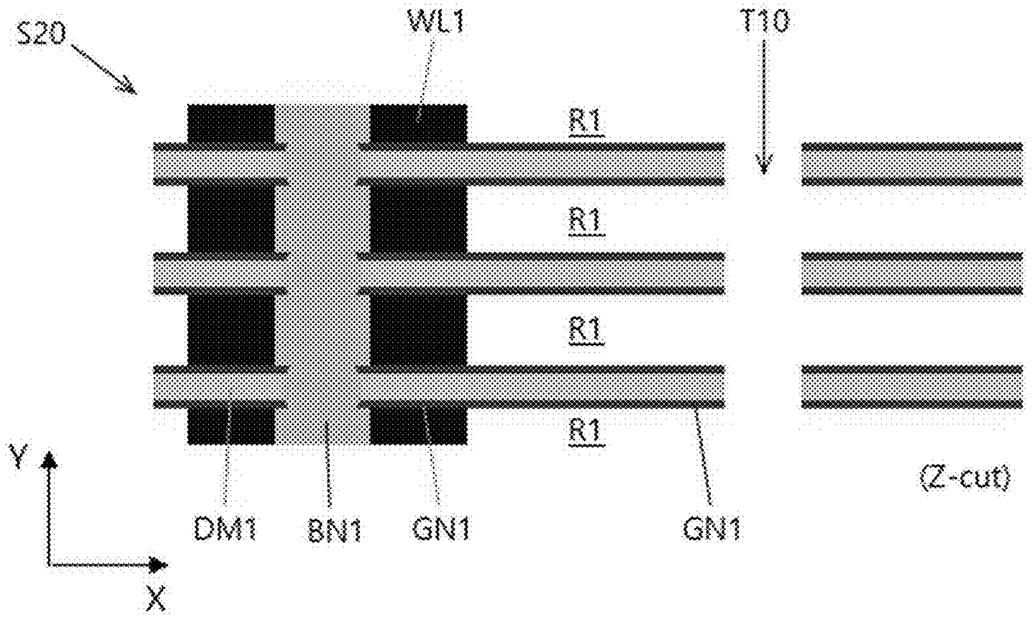

Referring to FIG. 41A and FIG. 41B, a portion of the word line material layer (WM1 in FIG. 40A) exposed by the first recess R1 may be recessed after forming the first recess R1 in the capacitor formation region. In other words, a portion of the word line material layer (WM1 in FIG. 40A) exposed toward the capacitor formation region may be recessed. As a result, the word line material layer portion surrounding the lower dummy channel material layer DM1 and the word line material layer portion surrounding the upper dummy channel material layer DM1 may be separated from each other. Here, the separated portion of the word line material layer may be referred to as the word line WL1.

Although the method for forming the word line WL1 has been described in detail with reference to FIG. 36A to FIG. 41B, this is merely an example, and the method for forming the word line WL1 may vary depending on cases. For example, if only one of the lower cell and the upper cell is formed, the 'separation process' as described in FIG. 41A and FIG. 41B may not be performed.

Figure 42A:
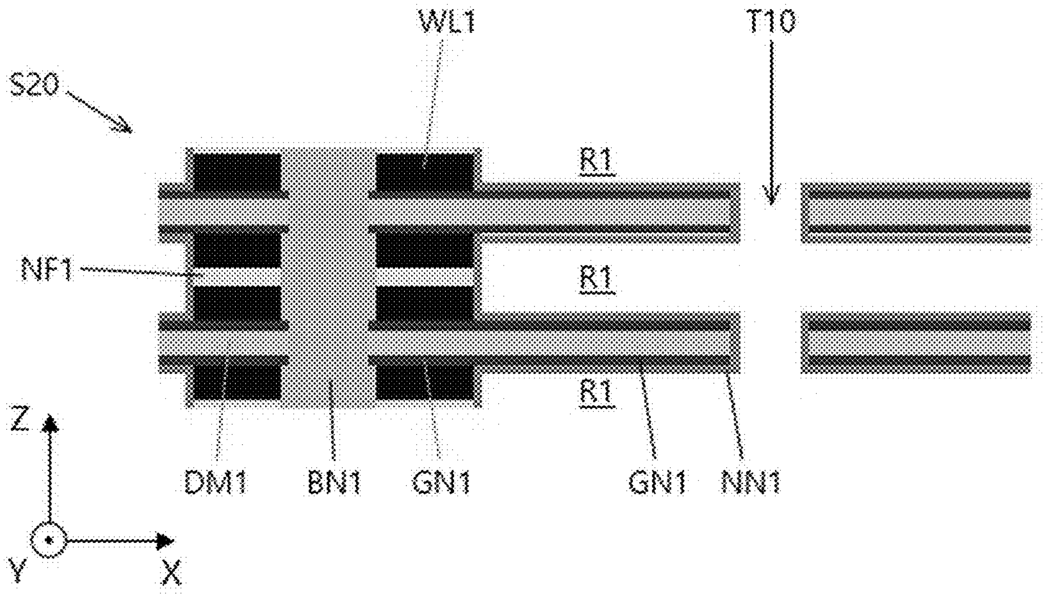
Figure 42B:
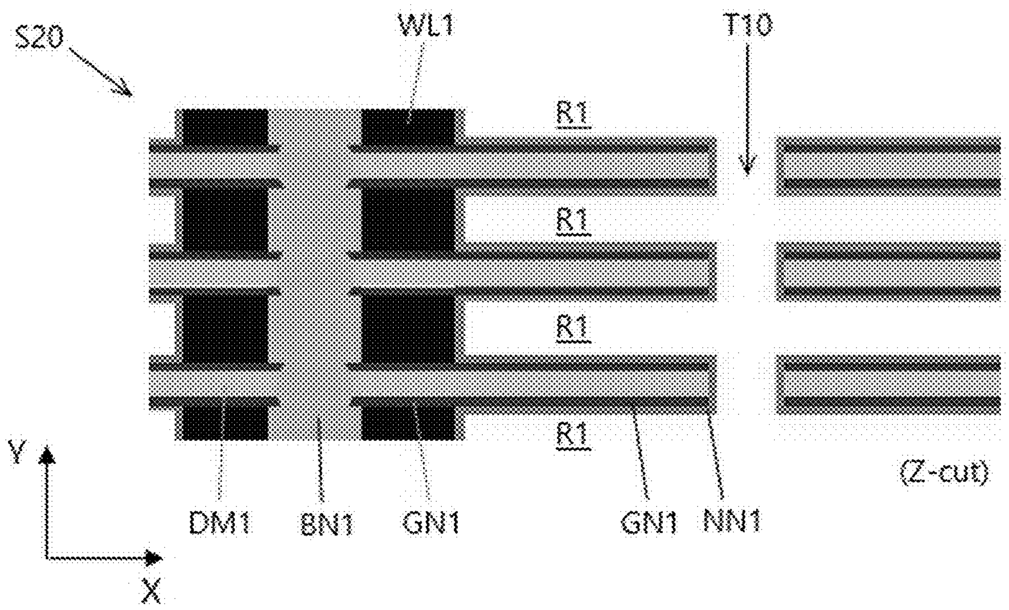

Referring to FIG. 42A and FIG. 42B, an insertion insulating layer NN1 surrounding the exposed portion of the gate insulating material layer GN1 may be formed in the capacitor formation region after forming the first recess R1 in the capacitor formation region. The insertion insulating layer NN1 may be conformally formed on the surface area exposed to the first recess R1. The insertion insulating layer NN1 may be formed to cover surfaces of the gate insulating material layer GN1, the dummy channel material layer DM1, and the word line WL1 exposed in the capacitor formation region. The insertion insulating layer NN1 may be formed through, for example, an ALD process. The thickness of the insertion insulating layer NN1 may be as thin as several tens of nm or less. The insertion insulating layer NN1 may be formed of an insulating oxide or may be formed of another insulating material.

Figure 43A:
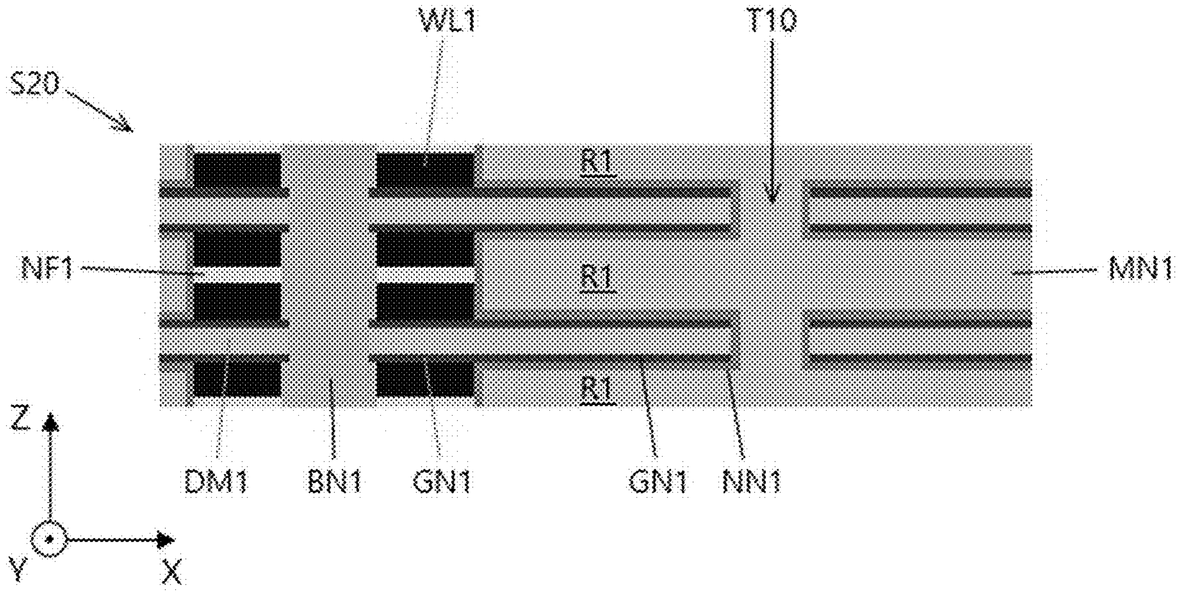
Figure 43B:
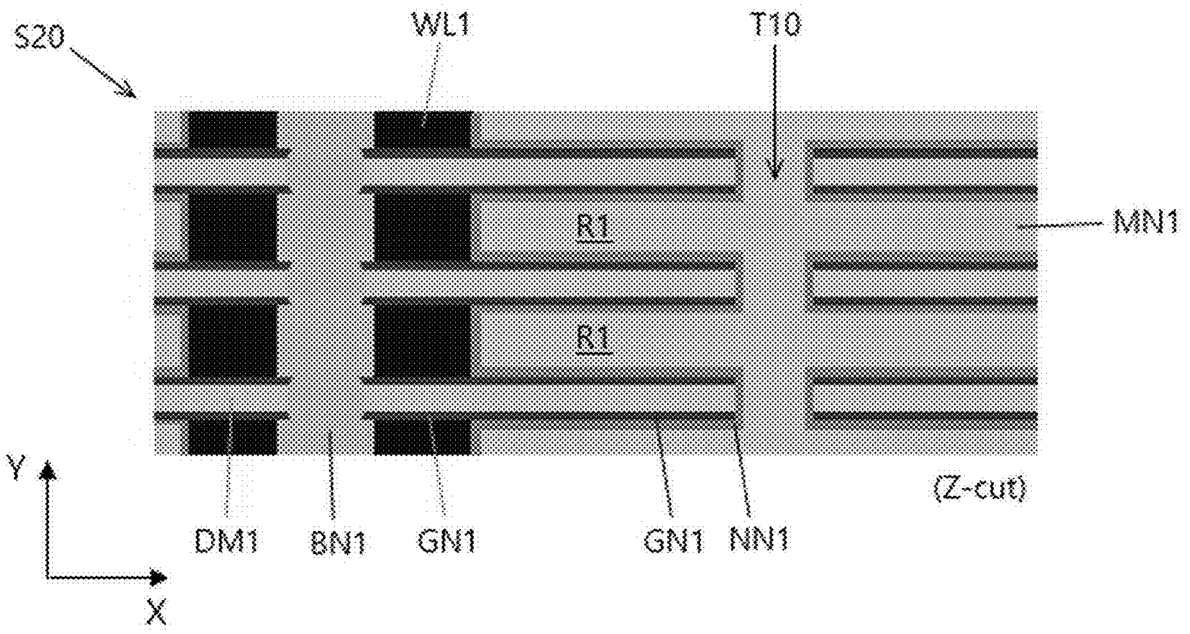

Referring to FIGS. 43A and 43B, a mold insulating layer MN1 filling the first recess R1 may be formed. The mold insulating layer MN1 may be formed to fill the first recess R1 and the first trench T10 on the insertion insulating layer NN1. The mold insulating layer MN1 may include, for example, a silicon nitride (e.g., $SiN_x$) or may be formed of a silicon nitride (e.g., $SiN_x$). When forming the mold insulating layer MN1, after depositing an insulator for the mold insulating layer MN1, a planarization process may be further performed on its upper surface and surrounding area.

Figure 44A:
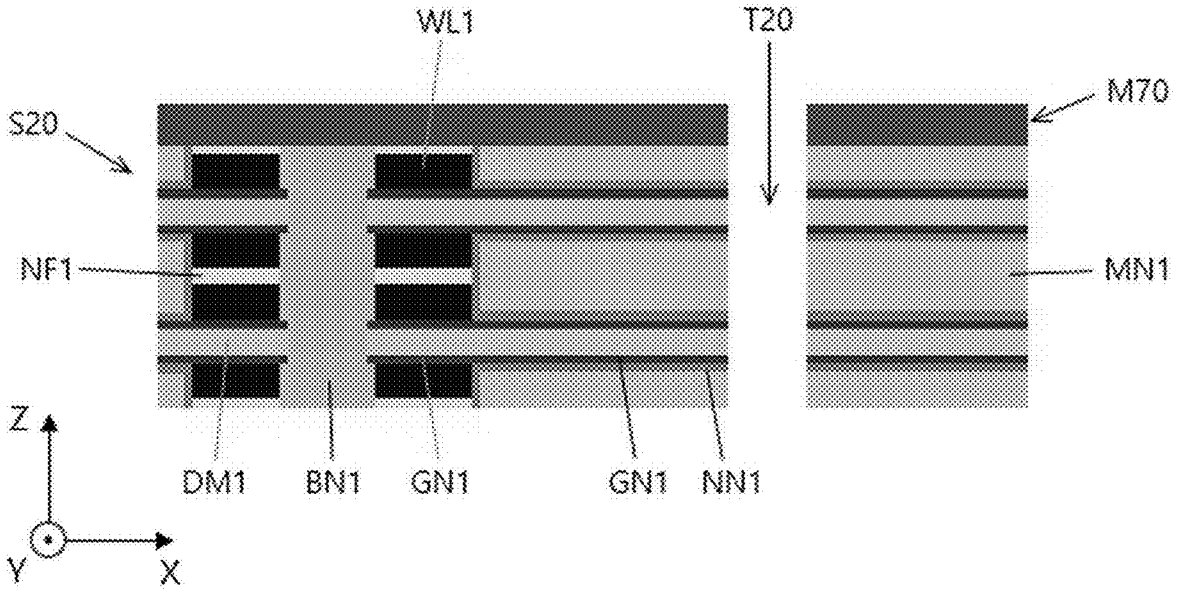
Figure 44B:
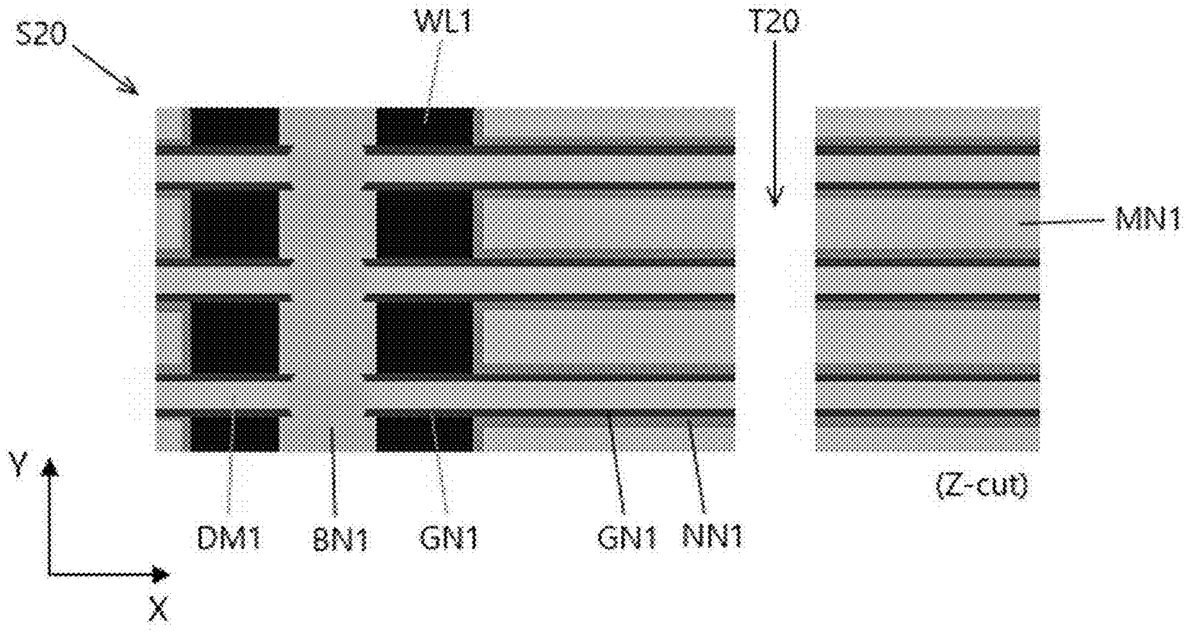

Referring to FIGS. 44A and 44B, a second trench T20 may be formed in a region corresponding to the first trench (T10 in FIG. 39A) in the mold insulating layer MN1. The second trench T20 may be formed by etching a portion of the mold insulating layer MN1 and a portion of the insertion insulating layer NN1. Accordingly, an end of the gate insulating material layer GN1 and an end of the dummy channel material layer DM1 may be exposed toward the second trench T20. The second trench T20 may have a line shape extending in the Y-axis direction.

A seventh mask pattern M70 may be used to form the second trench T20. The seventh mask pattern M70 may have a predetermined opening area. The seventh mask pattern M70 may be, for example, a photoresist pattern. The seventh mask pattern M70 may be removed after forming the second trench T20.

Figure 45A:
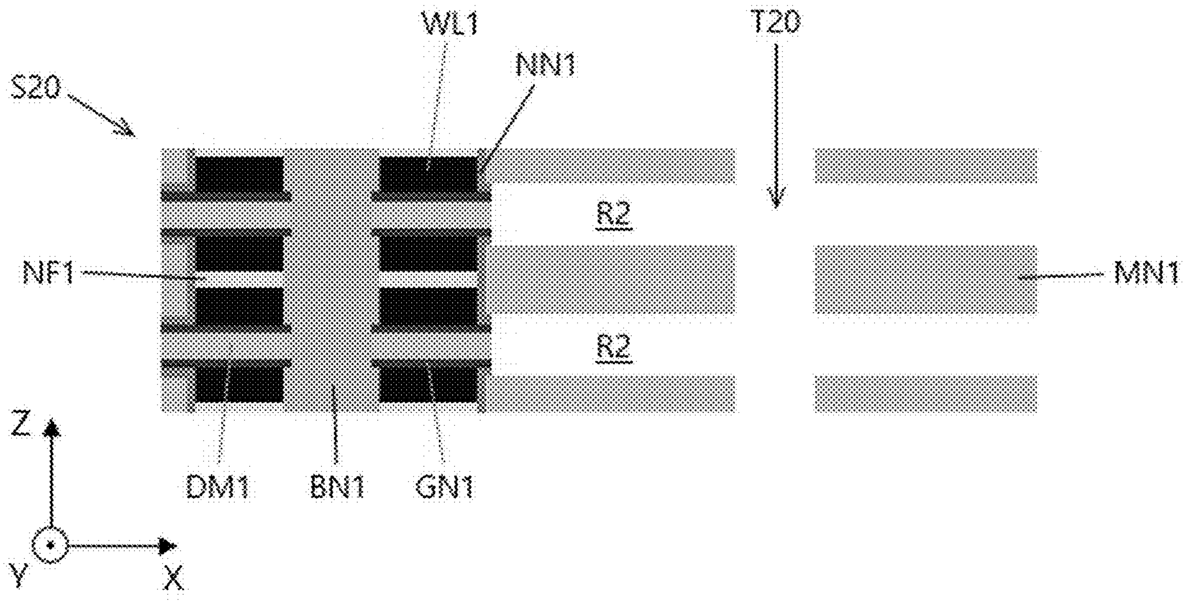
Figure 45B:
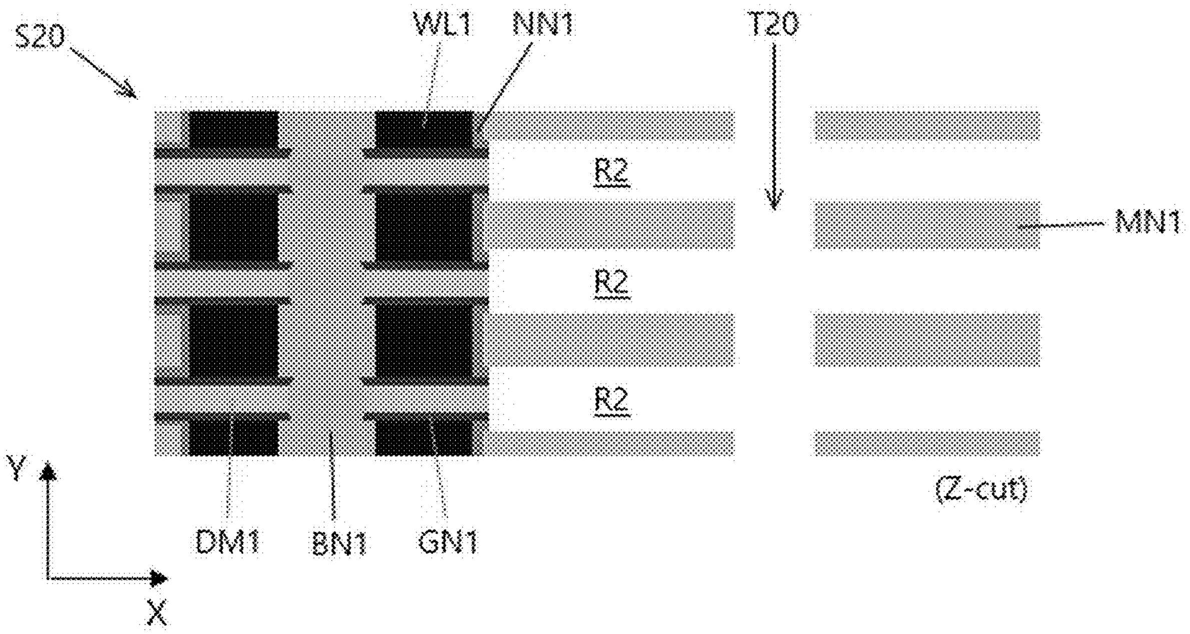

Referring to FIG. 45A and FIG. 45B, a second recess (second recess portion) R2 may be formed by etching the dummy channel material layer DM1, the gate insulating material layer GN1, and the insertion insulating layer NN1 exposed by the second trench T20. The dummy channel material layer DM1, the gate insulating material layer GN1, and the insertion insulating layer NN1 may be etched by injecting a wet etchant, that is, a wet etching solution through the second trench T20. At this time, one or more wet etchants may be used. The second recess R2 may be formed to a region somewhat spaced apart from the word line WL1. The etching ranges of the dummy channel material layer DM1, the gate insulating material layer GN1, and the insertion insulating layer NN1 may be controlled by adjusting the conditions of the etching process.

When the insertion insulating layer NN1 is removed in the step of FIG. 45A after forming the insertion insulating layer NN1 in the previous step of FIG. 42A, the second recess R2 may be formed to have a width larger than the outer diameter of the remaining gate insulating material layer GN1. Accordingly, the width of the second recess R2 in the Z-axis direction may be larger than the width (a width corresponding to the outer diameter) of the remaining gate insulating material layer GN1 in the Z-axis direction. Furthermore, the width of the second recess R2 in the Y-axis direction may be larger than the width (a width corresponding to the outer diameter) of the remaining gate insulating material layer GN1 in the Y-axis direction. As a result, the process margin for forming a capacitor in a subsequent process may be increased. In order to secure a process margin and the like, it may be desirable to form the insertion insulating layer NN1. However, the formation of the above-described insertion insulating layer NN1 may be optional and may be omitted in some cases.

Figure 46A:
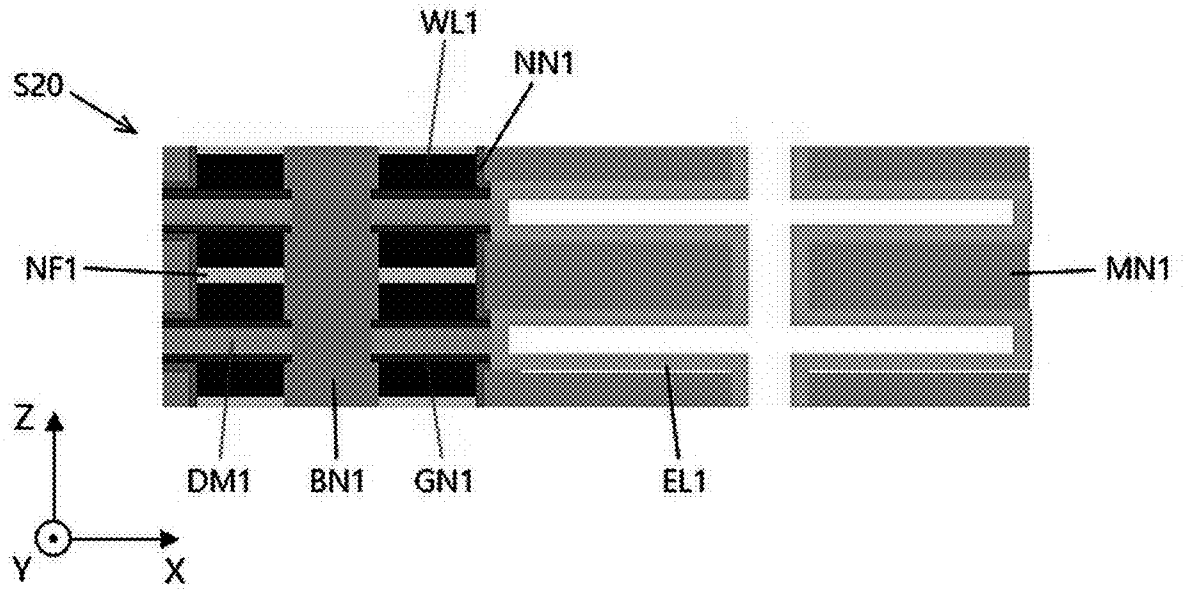
Figure 46B:
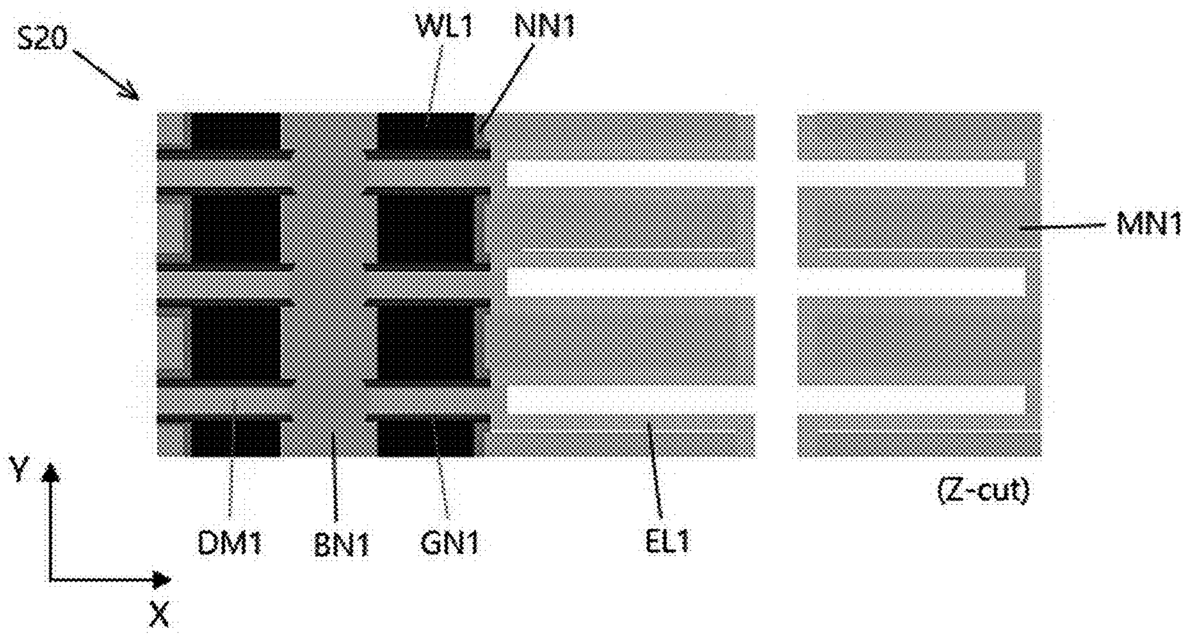

Referring to FIG. 46A and FIG. 46B, an electrode member EL1 connected to the dummy channel material layer DM1 may be formed on an inner side of the second recess (R2 in FIG. 45A). The electrode member EL1 may be said to be an electrode layer (first electrode layer) for a capacitor. The electrode member EL1 may be conformally formed along the surface shape of the mold insulating layer MN1. The electrode member EL1 may be formed, for example, through an ALD process.

Figure 47A:
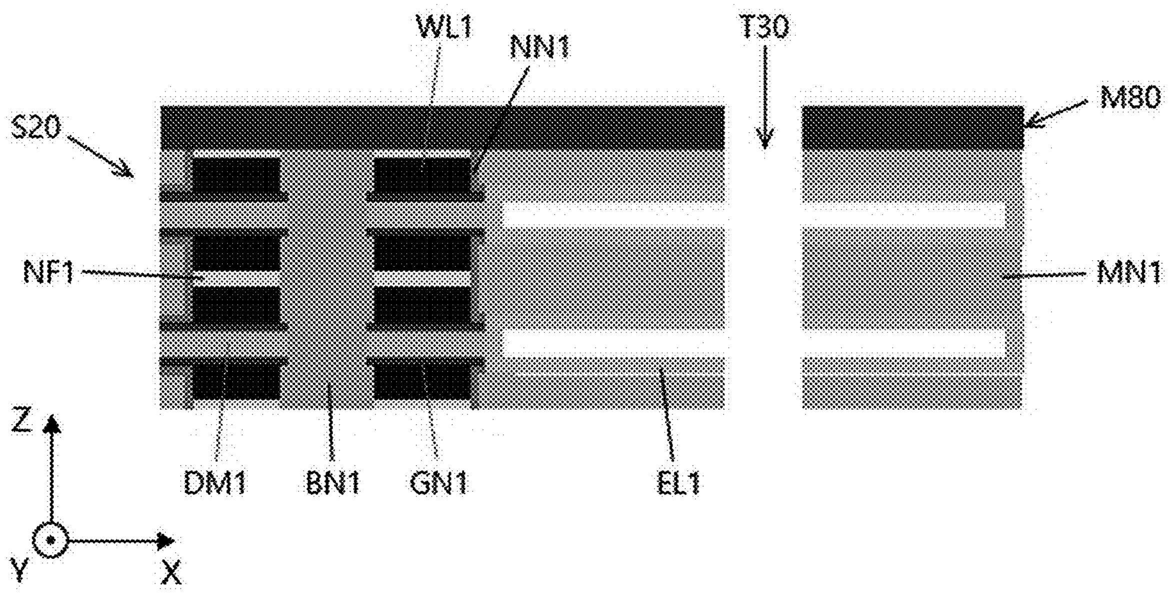
Figure 47B:
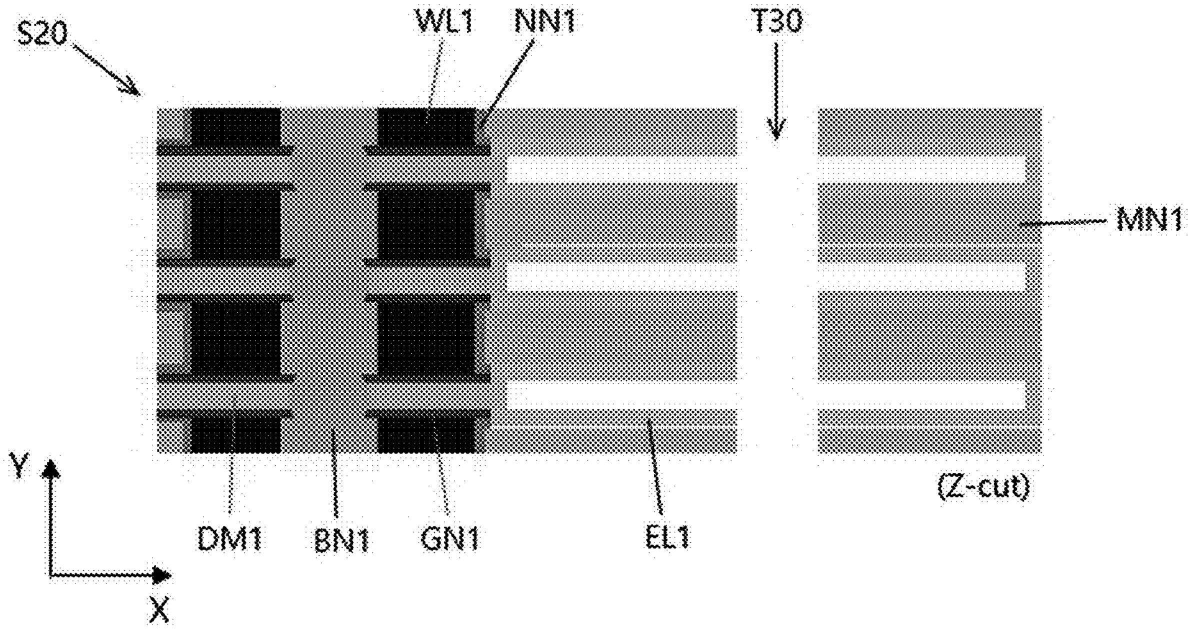

Referring to FIG. 47A and FIG. 47B, a third trench T30 may be formed in a region corresponding to the second trench (T20 in FIG. 44A) in the capacitor formation region. The third trench T30 may be formed by etching a portion of the electrode member EL1. The third trench T30 may have a line shape extending in the Y-axis direction. Through this process, the electrode member EL1 may be separated into an individual capacitor region. In other words, the electrode member EL1 may be separated into a unit cell region.

An eighth mask pattern M80 may be used to form the third trench T30. The eighth mask pattern M80 may have a predetermined opening area. The eighth mask pattern M80 may be, for example, a photoresist pattern. The eighth mask pattern M80 may be removed after forming the third trench T30.

Figure 48A:
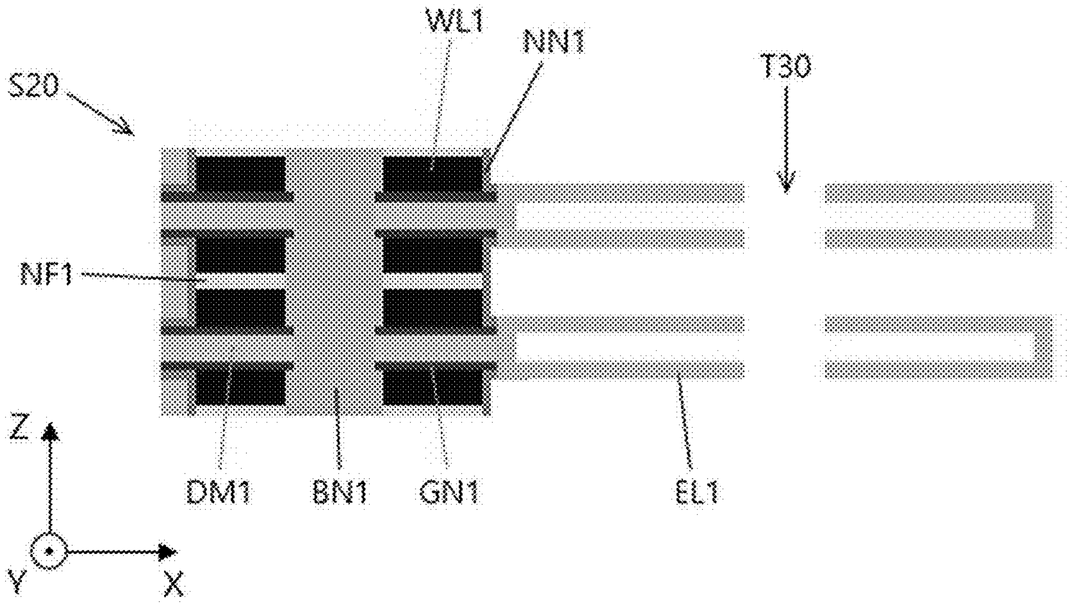
Figure 48B:
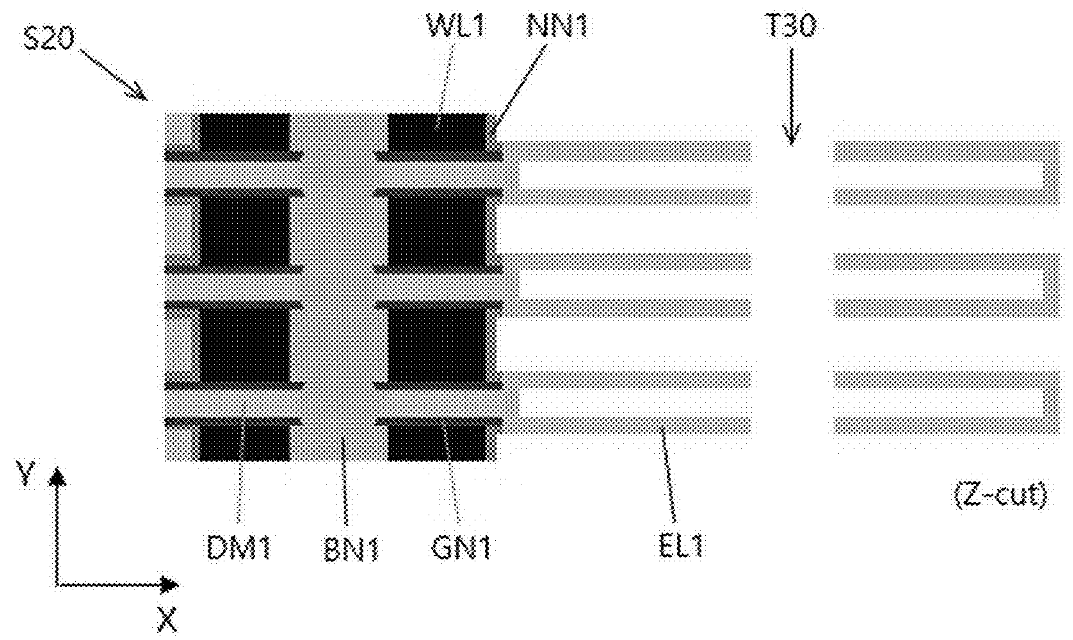

Referring to FIG. 48A and FIG. 48B, an outer surface of the electrode member EL1 48B may be exposed by etching the mold insulating layer (MN1 in FIG. 47A) after forming the electrode member EL1. At this time, the etching range of the mold insulating layer (MN1 in FIG. 47A) may be appropriately adjusted. As a method of adjusting the etching range, at least a portion of the eighth mask pattern (M80 in FIG. 47A) may be temporarily maintained, or a separate hard mask (not shown) may be used. If necessary, a portion of the mold insulating layer (MN1 in FIG. 47A) adjacent to the insertion insulating layer NN1 may be remained without being etched. However, in this step, the entire mold insulating layer (MN1 in FIG. 47A) may be removed to expose the insertion insulating layer NN1. Most or all of the mold insulating layer (MN1 in FIG. 47A) may be removed from the capacitor formation region.

Figure 49A:
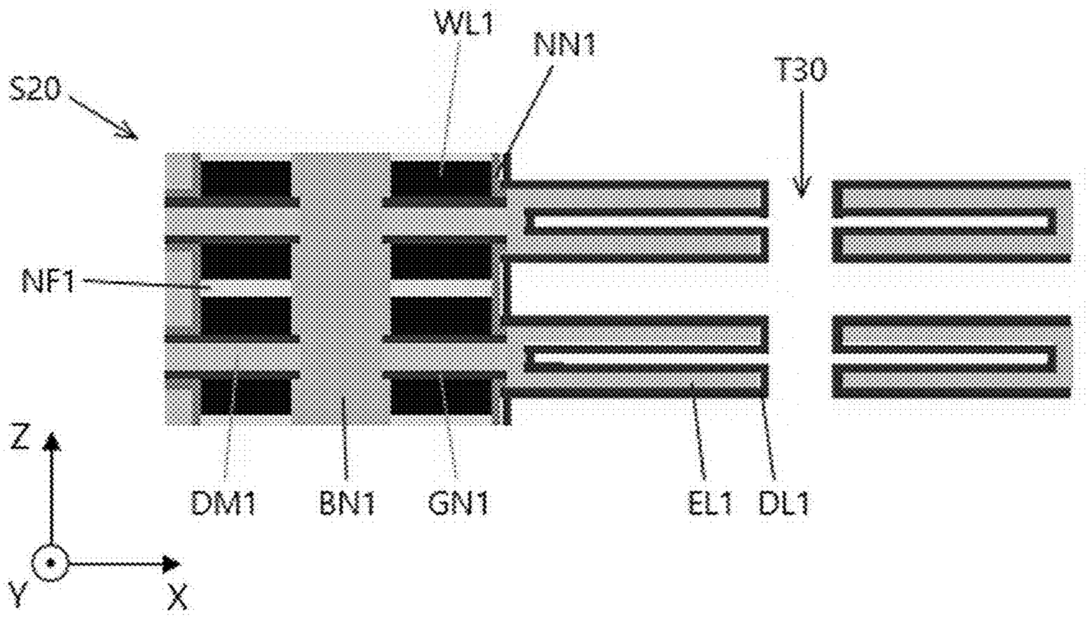
Figure 49B:
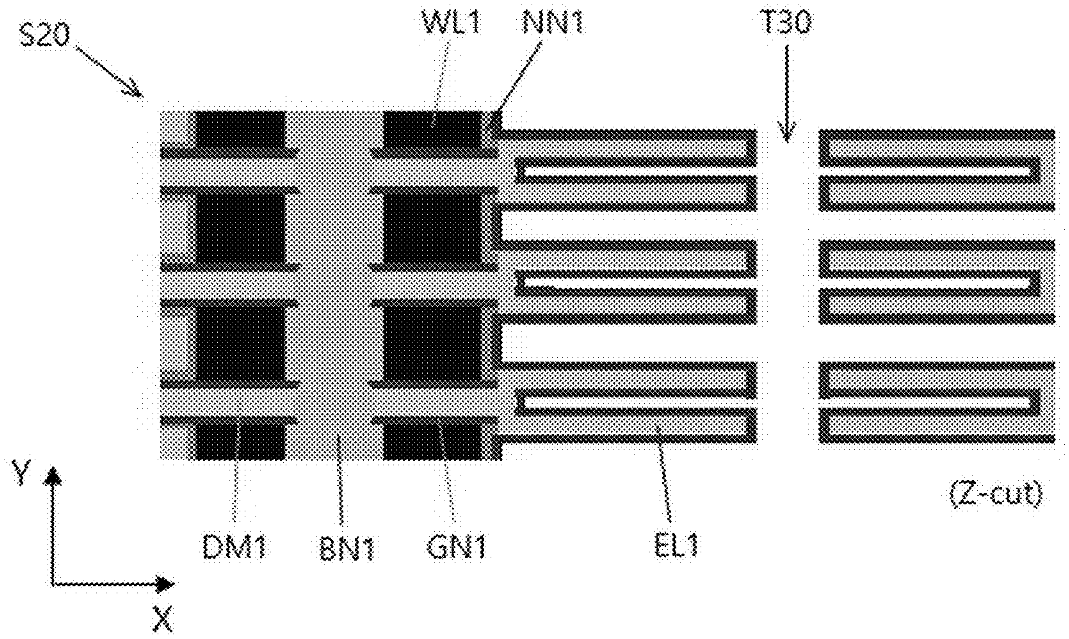

Referring to FIG. 49A and FIG. 49B, a dielectric layer DL1 may be formed on the electrode member EL1 in the capacitor formation region. The dielectric layer DL1 may be a dielectric layer for a capacitor. The dielectric layer DL1 may be formed conformally according to the surface shape of the electrode member EL1. The dielectric layer DL1 may be formed (deposited) through, for example, an ALD process. The dielectric layer DL1 may be formed to include at least any one of various dielectric materials. For example, the dielectric layer DL1 may include a high-k material with a higher dielectric constant than that of a silicon nitride. The specific material of the dielectric layer DL1 may vary.

Figure 50A:
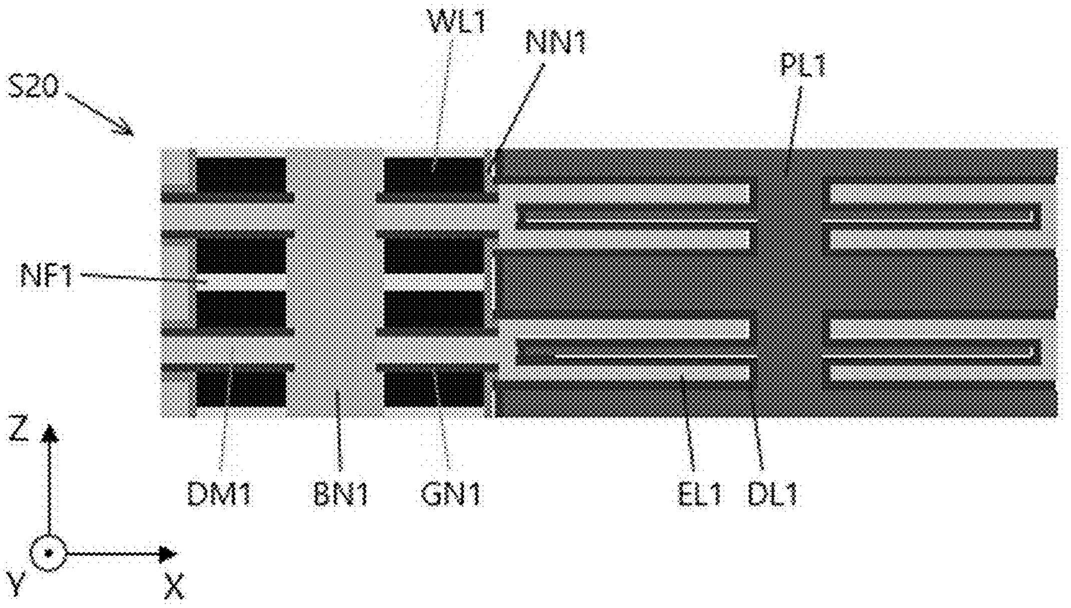
Figure 50B:
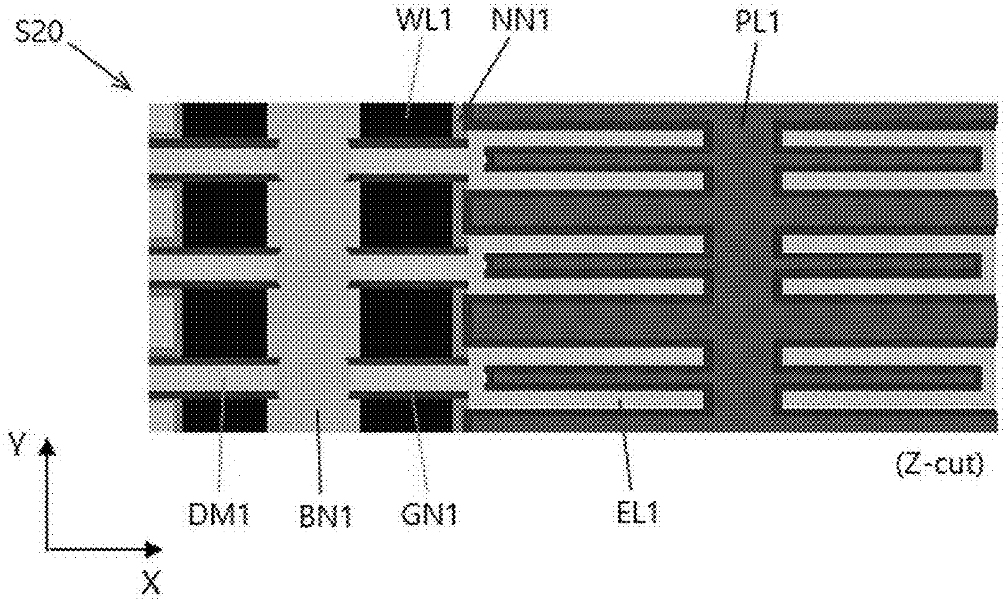

Referring to FIG. 50A and FIG. 50B, a plate electrode PL1 may be formed on the dielectric layer DL1 in the capacitor formation region. The plate electrode PL1 may be referred to as an electrode layer (second electrode layer) for a capacitor. The plate electrode PL1 may be formed to fill the third trench (T30 in FIG. 49A), the inside of the electrode member EL1, and the space between the electrode members EL1. The plate electrode PL1 may be formed to include one or more of various electrode materials used in semiconductor device processing. The plate electrode PL1 may have a type of line shape. Therefore, the plate electrode PL1 may be said to be a plate electrode line. The electrode member EL1, the dielectric layer DL1, and the plate electrode PL1 may form a capacitor.

In the process for forming the capacitor described with reference to FIG. 46A to FIG. 50B, a process using hydrogen H2, a thermal process, and the like may be applied. In addition, although the method for forming the capacitor is illustrated and described as an example in FIG. 46A to FIG.

50B, the method for forming the capacitor and the specific structure of the capacitor may vary depending on the case.

Next, by using the method illustrated in FIGS. 51A to FIG. 55B, an empty channel space may be formed by removing the dummy channel material layer DM1 from the transistor formation region, and a channel material layer (an effective channel material layer) (CM1 in FIG. 54A) connected to the capacitor may be formed in the empty channel space. Thus, a transistor including the channel material layer (CM1 in FIG. 54A) may be defined, and the bit line (BL1 in FIG. 55A) connected to the channel material layer (CM1 in FIG. 54A) may be formed.

Figure 51A:
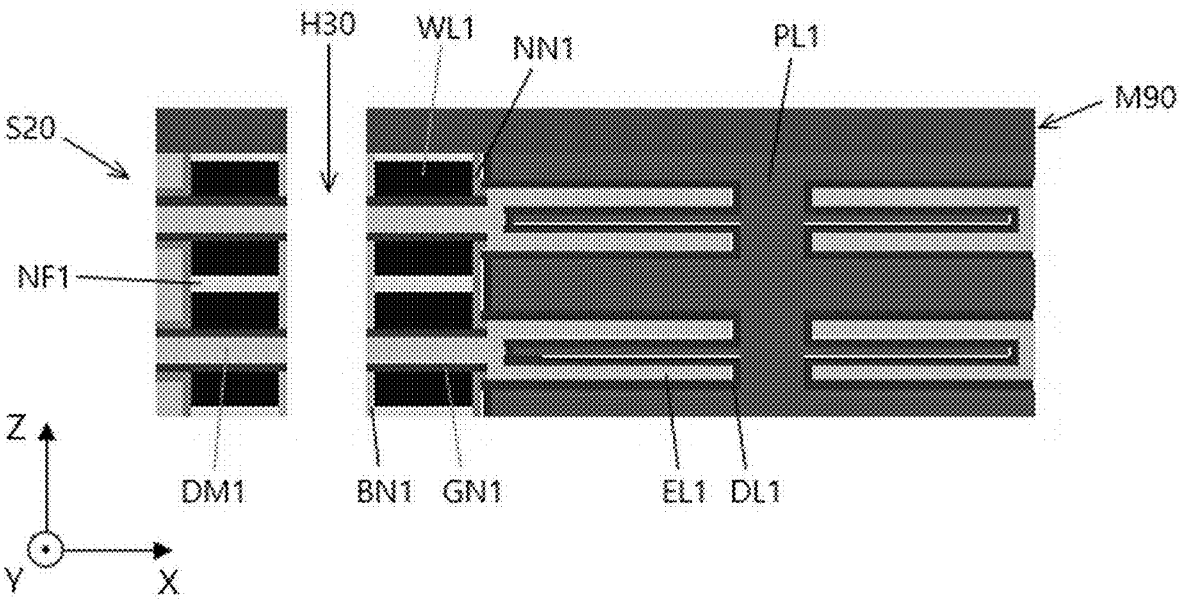
Figure 51B:
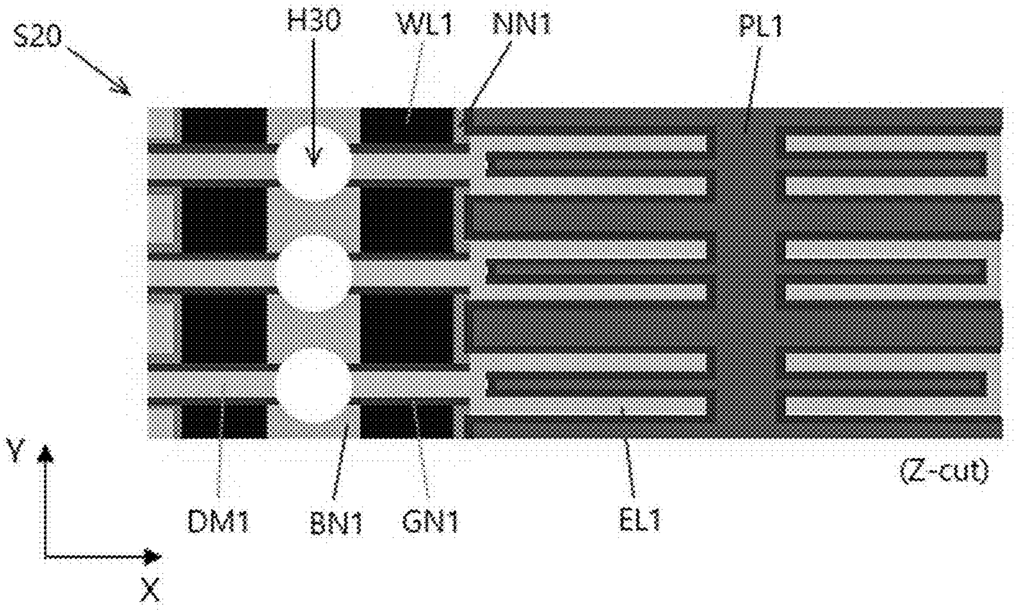

Referring to FIG. 51A and FIG. 51B, a third vertical hole H30 may be formed in a region corresponding to the second vertical hole (H20 in FIG. 34A) of the body insulating layer BN1. A ninth mask pattern M90 may be used to form the third vertical hole H30. The ninth mask pattern M90 may have a predetermined opening pattern. The ninth mask pattern M90 may be, for example, a photoresist pattern. The ninth mask pattern M90 may be removed after forming the third vertical hole H30. An end (side surface) of the dummy channel material layer DM1 may be exposed by the third vertical hole H30.

Figure 52A:
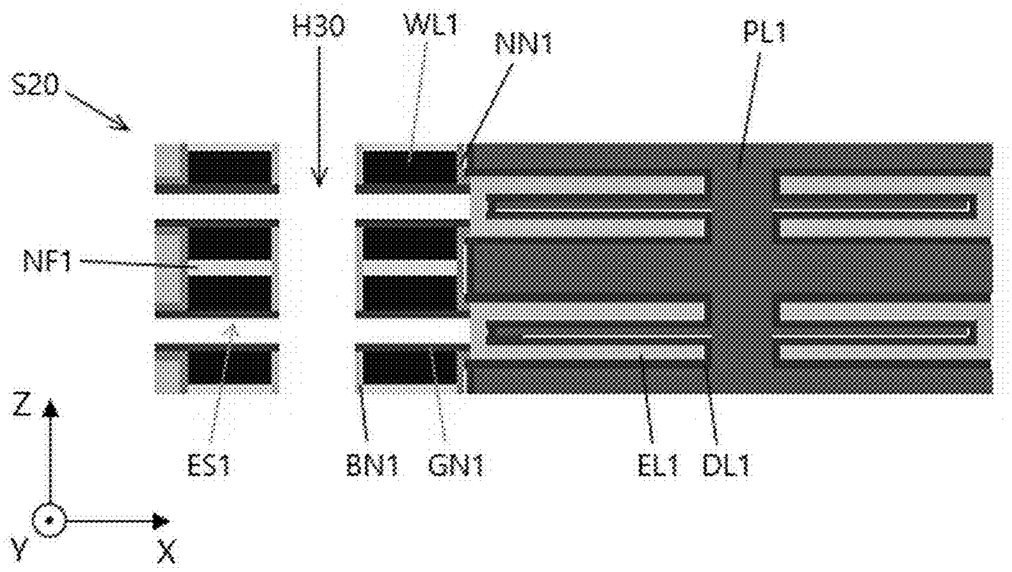
Figure 52B:
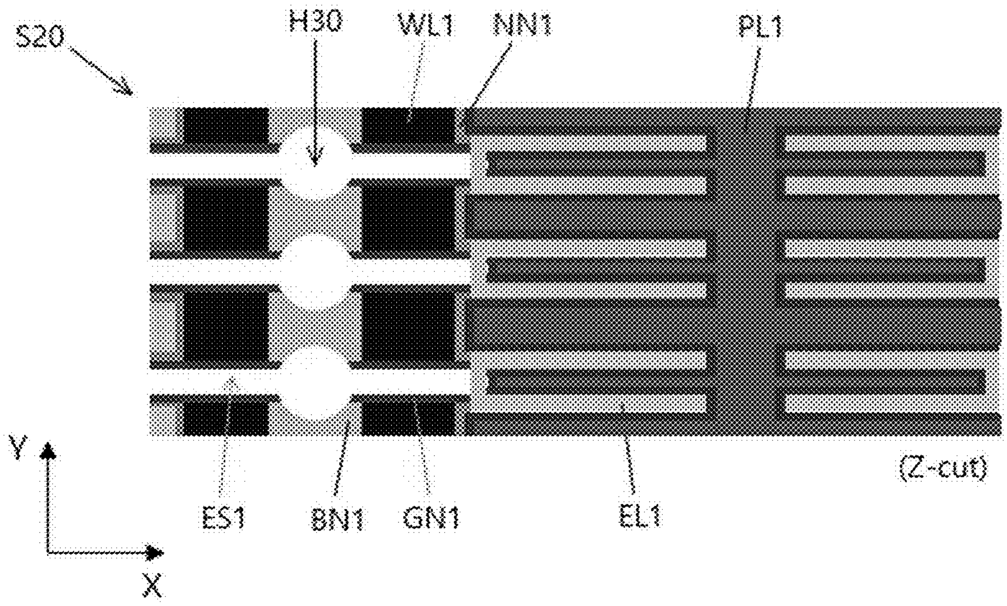

Referring to FIG. 52A and FIG. 52B, an empty channel space ESI may be formed by removing the dummy channel material layer (DM1 in FIG. 51A) exposed by the third vertical hole H30. At this time, the entire dummy channel material layer (DM1 in FIG. 51A) may be removed from the transistor formation region. The dummy channel material layer (DM1 in FIG. 51A) may be selectively etched by injecting a wet etchant having etching selectivity for the dummy channel material layer (DM1 in FIG. 51A), that is, a wet etching solution through the third vertical hole H30. The empty channel space ES1 may have, for example, a line shape or a bar shape extending in the X-axis direction.

Figure 53A:
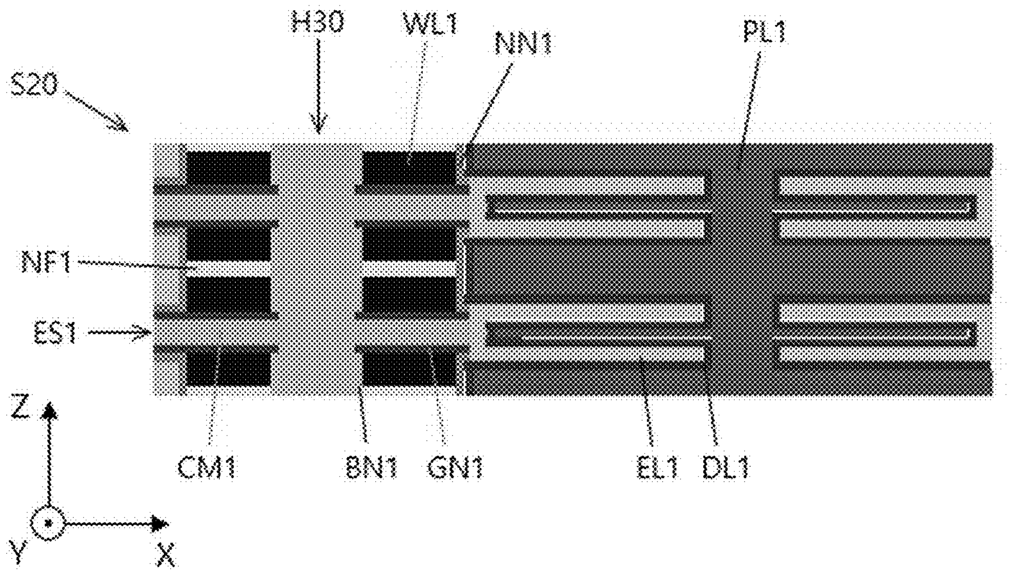
Figure 53B:
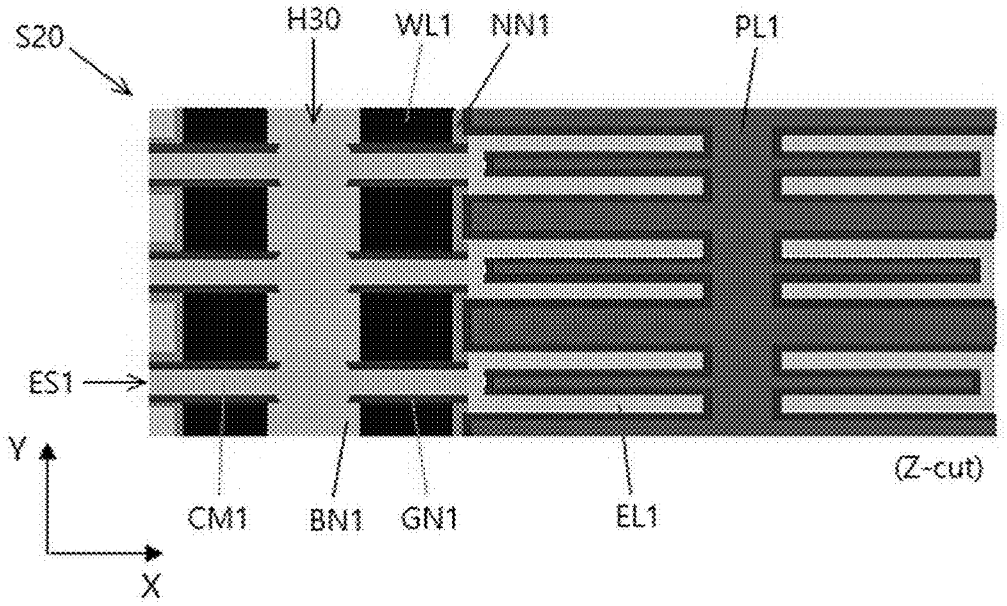

Referring to FIG. 53A and FIG. 53B, a channel material layer (effective channel material layer) CM1 may be formed in the empty channel space ES1 and the third vertical hole H30. The channel material layer CM1 may be formed, for example, through an ALD process. The channel material layer CM1 may include at least any one selected from various semiconductor materials. The channel material layer CM1 may include an oxide semiconductor or a non-oxide semiconductor. The oxide semiconductor may include an amorphous oxide semiconductor (AOS). For example, the oxide semiconductor may include at least one selected from the group consisting of indium gallium zinc oxide (IGZO), zinc tin oxide (ZTO), and indium tin oxide (ITO). However, the specific material of the channel material layer CM1 is not limited to the above and may vary in various ways. The channel material layer CM1 may be a single layer or a multilayer.

When the channel material layer CM1 is formed of the oxide semiconductor, the effects such as securing high mobility characteristics and low off-current characteristics may be obtained. However, since oxide semiconductors have a disadvantage that it is vulnerable to etching damage, in a general semiconductor device manufacturing process, a problem arises that an etching damage occurs in the oxide semiconductor due to the patterning process and the like, which causes the characteristics of the semiconductor device to deteriorate and become unstable. However, in an embodiment of the present invention, the patterned horizontal hole H15 is formed using the sacrificial layer pattern (SL11, SL21 in FIG. 29A), and then the dummy channel material layer DM1 is formed in the patterned horizontal hole H15, and the channel material layer CM1 may be formed by replacing the dummy channel material layer DM1 with the channel material layer CM1 when the manufacturing of the capacitor and transistor is completed (or almost completed). Therefore, the channel material layer CM1 may be formed without a patterning process such as etching. Therefore, even if an oxide semiconductor is applied to the channel material layer CM1, etching damage due to etching/patterning may be prevented or minimized, and as a result, a memory device with excellent characteristics may be implemented. In particular, according to embodiments of the present invention, since the dummy channel material layer DM1 is replaced with the channel material layer CM1 when manufacturing of the capacitor is completed, damage (i.e., H2 damage and thermal damage) of channel material layer CM1 due to hydrogen H2 process and thermal process required during manufacturing of the capacitor, and the like may be avoided. Accordingly, a memory device having excellent characteristics may be manufactured while preventing or minimizing etching damage, damage due to hydrogen H2, and damage due to heat for the channel material layer CM1.

Figure 54A:
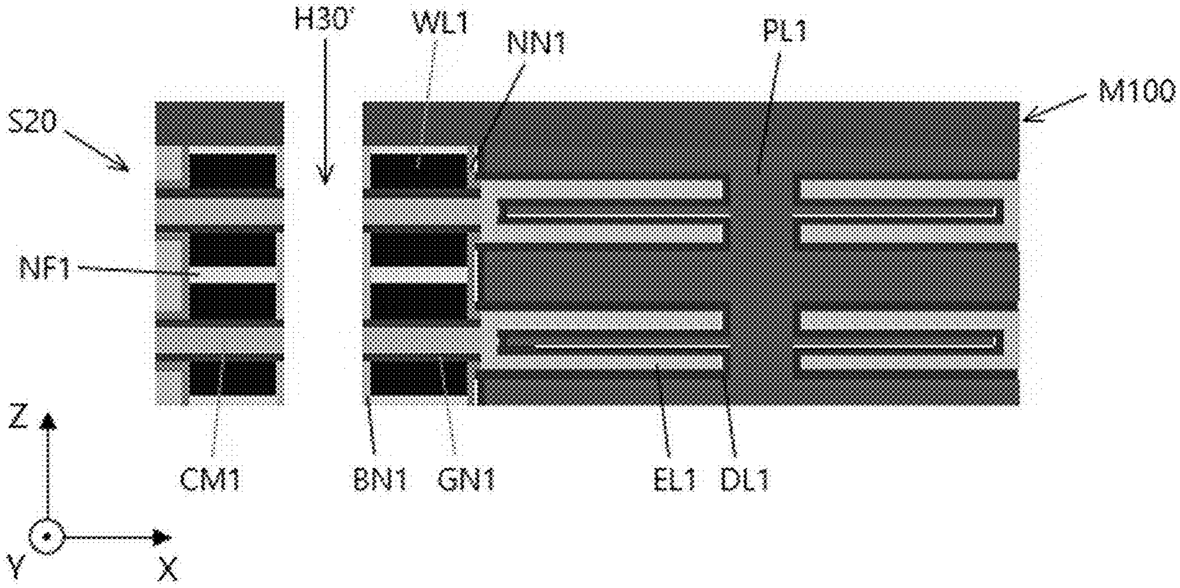
Figure 54B:
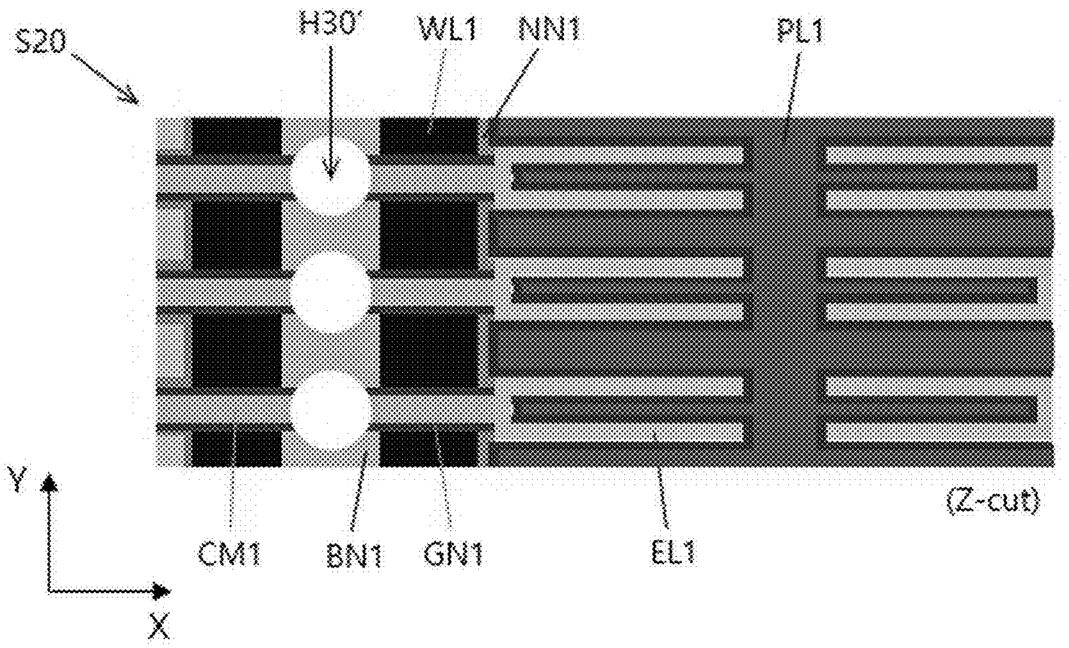

Referring to FIG. 54A and FIG. 54B, the third vertical hole (H30 in FIG. 53A) may be reformed by removing a portion of the channel material layer CM1 formed in the third vertical hole (H30 in FIG. 53A). The reformed third vertical hole is indicated by reference number H30'. The reformed third vertical hole H30' may also be referred to as a fourth vertical hole.

A tenth mask pattern M100 may be used to form the reformed third vertical hole H30'. The tenth mask pattern M100 may have a predetermined opening pattern. The tenth mask pattern M100 may be, for example, a photoresist pattern. The tenth mask pattern M100 may be removed after forming the reformed third vertical hole H30'.

Figure 55A:
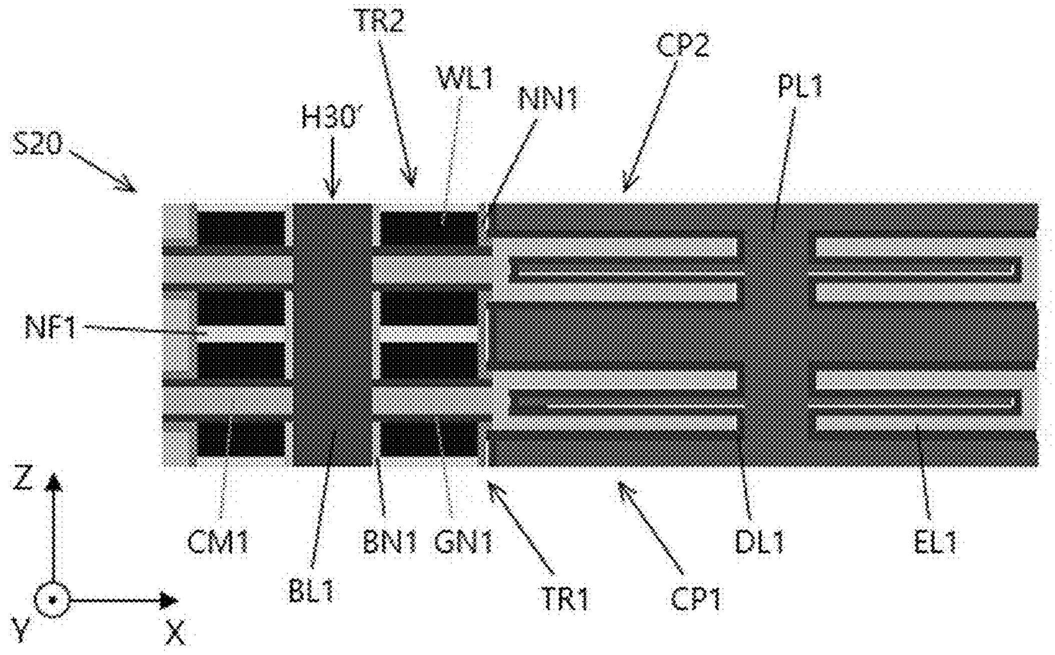
Figure 55B:
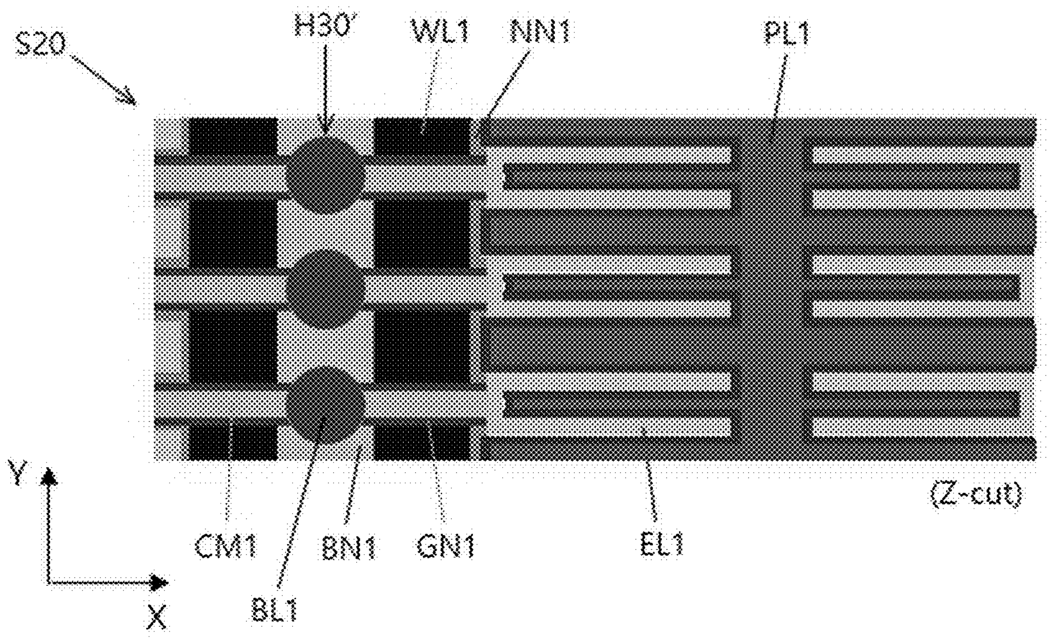

Referring to FIG. 55A and FIG. 55B, a bit line BL1 may be formed in the reformed third vertical hole H30'. The bit line BL1 may be connected (contacted) to one end of the channel material layer CM1. Accordingly, the bit line BL1 may be formed in a region corresponding to the second vertical hole (H20 in FIG. 34A) in the transistor formation region, and may be formed to be connected to (contact) one end of the channel material layer CM1. The other end of the channel material layer CM1 may be connected (in contact) to the electrode member EL1 of the capacitor. The bit line BL1 may have a pillar shape penetrating through the structure S20 in the vertical direction. The bit line BL1 may be electrically connected to the one end of the channel material layer CM1 in a lateral direction. A plurality of bit lines BL1 connected to a plurality of channel material layers CM1 may be formed.

Although not shown, if there is a conductive material of the bit line BL1 deposited above the reformed third vertical hole H30', it may be removed through, for example, an etch back process.

Referring to FIG. 51A to FIG. 55B, although a method for forming the empty channel space ES1 by removing the dummy channel material layer DM1, forming the channel material layer CM1 in the empty channel space ES1, and forming the bit line BL1 connected to the channel material layer CM1 has been described in detail, this is only an example, and the method for replacing the dummy channel material layer DM1 with the channel material layer CM1 and the method for forming the bit line BL1 may vary depending on the case.

In the device structure of FIG. 55A, the lower channel material layer CM1, the word line WL1 surrounding it, and the gate insulating material layer GN1 between them may constitute a first transistor TR1. In addition, the lower electrode member EL1 electrically connected to the first transistor TR1 on a lateral side of the first transistor TR1 and the dielectric layer DL1 in contact with the lower electrode member EL1 and the plate electrode PL1 may constitute a first capacitor CP1. Furthermore, the first transistor TR1 and the first capacitor CP1 constitute one memory cell (a lower memory cell). The first transistor TR1 and the first capacitor CP1 may be arranged in a horizontal direction.

Furthermore, the upper channel material layer CM1, the word line WL1 surrounding it, and the gate insulating material layer GN1 between them may constitute a second transistor TR2. In addition, the upper electrode member EL1 electrically connected to the second transistor TR2 on a lateral side of the second transistor TR2 and the dielectric layer DL1 in contact with the upper electrode member EL1 and the plate electrode PL1 may constitute a second capacitor CP2. Furthermore, the second transistor TR2 and the second capacitor CP2 constitute one memory cell (a upper memory cell). The second transistor TR2 and the second capacitor CP2 may be arranged in a horizontal direction. The second transistor TR2 may be placed on the first transistor TR1, and the second capacitor CP2 may be placed on the first capacitor CP1.

Although not shown, the device structures such as those in FIG. 55A and FIG. 55B may be repeatedly arranged in the Z-axis direction, may be repeatedly arranged in the X-axis direction, and may be repeatedly arranged in the Y-axis direction. According to these embodiments of the present invention, it is possible to implement a memory device which may remarkably improve integration degree and have excellent performance and operation characteristics. The memory device may be a stack-type memory device of a gate-all-around (GAA) type having a horizontal arrangement and a stacked structure. Furthermore, the memory device according to an embodiment of the present invention may be a vertical DRAM device or a three-dimensional DRAM device.

Hereinafter, a memory device according to an embodiment of the present invention will be additionally described with reference to FIG. 55A and FIG. 55B.

Referring to FIG. 55A and FIG. 55B, a memory device according to an embodiment of the present invention may include a plurality of memory cells stacked in a vertical direction. Each of the plurality of memory cells may include a transistor and a capacitor electrically connected to the transistor in a lateral direction. The transistor may correspond to TR1 and TR2, and the capacitor may correspond to CP1 and CP2. The transistor may include a channel material layer CM1, a word line WL1 surrounding the channel material layer CM1, and a gate insulating layer GN1 disposed between them. The capacitor may include an electrode member EL1 electrically connected to the transistor, a dielectric layer DL1 disposed on a surface of the electrode member EL1, and a plate electrode PL1 disposed on a surface of the dielectric layer DL1.

Furthermore, the memory device may include a bit line BL1 connected to a plurality of transistors of the plurality of memory cells. The bit line BL1 may extend in the vertical direction. A body insulating layer BN1 surrounding at least a portion of an outer surface of the bit line BL1 may be disposed between the bit line BL1 and the word line WL1. A filling insulating layer NF1 which is a separate material layer form the body insulating layer BN1 may be disposed between two adjacent word lines WL1 of the plurality of transistors.

In an embodiment of the present invention, the transistor may have a gate-all-around (GAA) structure. In this regard, the transistor and the memory device including it may have excellent characteristics.

The body insulating layer BN1 may have a line shape extending in the same direction as the word line WL1 when observed from above direction, as shown in FIG. 55B. Within the body insulating layer BN1, a plurality of bit lines BL1 may be arranged to be spaced apart from each other in the horizontal direction, that is, the horizontal direction in which the word line WL1 extends.

In addition, the memory device may further include an insertion insulating layer NN1 extending to cover a side surface of the word line WL1 while surrounding a portion (an end portion) of the gate insulating layer GN1 adjacent to the electrode member EL1. The insertion insulating layer NN1 may be a separate material layer from the body insulating layer BN1 and the filling insulating layer NF1. The insertion insulating layer NN1 may be, for example, an atomic layer deposition (ALD) material layer.

According to one embodiment, the body insulating layer BN1 may be in contact with a first side surface (first end) of the filling insulating layer NF1, and the body insulating layer BN1 may be in contact with a second side surface (second end) of the filling insulating layer NF1. A portion of the insertion insulating layer NN1 may be in contact with the electrode member EL1.

Furthermore, according to one embodiment, a side surface of the insertion insulating layer NN1 may contact a side surface of the dielectric layer DL1. The word line WL1 may contact a first side surface of the insertion insulating layer NN1, and the dielectric layer DL1 may contact a second side surface of the insertion insulating layer NN1. However, it is not limited to this structure and may be modified.

A memory device according to an embodiment of the present invention may have structural features as shown in FIG. 55A and FIG. 55B. For example, the memory device may have a stacked structure and may have features in the structures consisting of the body insulating layer BN1, the filling insulating layer NF1, the insertion insulating layer NN1 and their peripheral portions, and the transistor and the capacitor.

According to the embodiments of the present invention described above, a stack-type memory device which may improve integration degree and have excellent performance and operation characteristics may be implemented. In addition, according to embodiments of the present invention, it is possible to implement manufacturing method of a memory device capable of preventing or minimizing property deterioration of a semiconductor material (e.g., an oxide semiconductor material) due to etching damage, damage due to a hydrogen H2 process, damage due to a thermal process, and the like. For example, according to embodiments of the present invention, after patterning a sacrificial layer according to a given method, a dummy material is formed in a region (space) where the pattern of the sacrificial layer was removed, and then, when the manufacturing of the device is almost completed, the dummy material may be replaced with an effective semiconductor material (e.g., oxide semiconductor material). Therefore, it is possible to implement a manufacturing method of a stack-type memory device which may prevent or minimize characteristic deterioration due to etching damage, damage due to a hydrogen H2 process, damage due to a thermal process, and the like for an effective semiconductor material (e.g., oxide semiconductor material). According to one example, the stack-type memory device may be configured to include a horizontal stack-type DRAM device. However, at least some of the device structures and the manufacturing method thereof according to embodiments of the present invention may be used not only for DRAM devices, but also for other memory devices (e.g., PRAM, RRAM, SRAM, flash memory, MRAM, FRAM, etc.) or a field of technology which implements logic devices with integrated logic circuits.

In this specification, the preferred embodiments of the present invention have been disclosed, and although specific terms have been used, they are only used in a general sense to easily explain the technological content of the present invention and to help understanding the present invention, and they are not used to limit the scope of the present invention. It is obvious to those having ordinary skill in the related art to which the present invention belong that other modifications based on the technological idea of the present invention may be implemented in addition to the embodiments disclosed herein. It will be understood to those having ordinary skill in the related art that in connection with a memory device and a manufacturing method thereof according to the embodiment described with reference to FIG. 1A to FIG. 26B and FIG. 27A to FIG. 55B, various substitutions, changes, and modifications may be made without departing from the technological spirit of the present invention. Therefore, the scope of the invention should not be determined by the described embodiments, but should be determined by the technological concepts described in the claims.

INDUSTRIAL APPLICABILITY

The embodiments of the present invention may be applied to semiconductor/electronic devices and manufacturing methods thereof. For example, the embodiments of the present invention may be applied to memory devices and manufacturing methods thereof.

The invention claimed is:

1. A manufacturing method of a memory device comprising:

forming a stack including a first insulating layer, and a first sacrificial layer and a second insulating layer which are sequentially stacked on the first insulating layer;

forming a patterned stack having at least one pattern portion having a first sacrificial layer pattern obtained from the first sacrificial layer by patterning the stack, wherein the pattern portion has a shape extending in a first direction, and empty spaces are provided on both sides of the pattern portion along a second direction perpendicular to the first direction;

forming a structure including the patterned stack and an insulating material by filling the empty spaces on both sides of the at least one pattern portion with the insulating material;

forming a first vertical hole penetrating through the first sacrificial layer pattern of the pattern portion in the structure;

forming a horizontal hole extending in the first direction by removing the first sacrificial layer pattern exposed by the first vertical hole;

forming a gate insulating material layer on inner surfaces of the first vertical hole and the horizontal hole, and forming a channel material layer filling the first vertical hole and the horizontal hole on the gate insulating material layer;

forming a second vertical hole in a region corresponding to the first vertical hole in the structure where the gate insulating material layer and the channel material layer are formed;

exposing the gate insulating material layer by removing the first and second insulating layers and the insulating material from a transistor formation region around the second vertical hole of the structure;

defining a transistor including a word line by forming the word line surrounding the exposed portion of the gate insulating material layer in the transistor formation region;

forming a first trench in a capacitor formation region adjacent to the transistor formation region of the structure;

forming a first recess exposing the gate insulating material layer by removing the first and second insulating layers and the insulating material exposed by the first trench in the capacitor formation region;

forming a mold insulating layer filling the first recess;

forming a bit line connected to one end of the channel material layer in a region corresponding to the second vertical hole in the transistor formation region; and forming a second recess by removing the channel material layer and the gate insulating material layer from the capacitor formation region, forming an electrode member connected to the other end of the channel material layer on an inner surface of the second recess, and forming a capacitor including the electrode member, a dielectric layer, and a plate electrode by sequentially forming the dielectric layer and the plate electrode on the electrode member.

2. The manufacturing method of a memory device of claim 1, wherein the entire first sacrificial layer pattern is removed in the forming the horizontal hole.

3. The manufacturing method of a memory device of claim 1, wherein the first insulating layer, the second insulating layer, and the insulating material include a silicon nitride, and the first sacrificial layer includes a silicon oxide.

4. The manufacturing method of a memory device of claim 1, wherein the channel material layer includes an oxide semiconductor.

5. The manufacturing method of a memory device of claim 1, wherein the defining the transistor by forming the word line includes:

forming a word line material layer surrounding the exposed portion of the gate insulating material layer in the transistor formation region;

forming a through hole by etching a region corresponding to the second vertical hole in the word line material layer;

recessing a portion of the word line material layer exposed through the through hole so that the one end of the channel material layer protrudes toward the through hole rather than the word line material layer; and forming a body insulating layer to fill the through hole.

6. The manufacturing method of a memory device of claim 5, further comprising recessing a portion of the word line material layer exposed by the first recess after forming the first recess in the capacitor formation region.

7. The manufacturing method of a memory device of claim 5, wherein the forming the bit line includes:

forming a third vertical hole in a region of the body insulating layer corresponding to the second vertical hole; and forming the bit line in the third vertical hole.

8. The manufacturing method of a memory device of claim 1, further comprising:

forming an insertion insulating layer surrounding the exposed gate insulating material layer in the capacitor formation region after forming the first recess in the capacitor formation region, wherein the mold insulating layer is formed to fill the first recess and the first trench on the insertion insulating layer; and forming a second trench in a region corresponding to the first trench in the mold insulating layer is further included, wherein the second recess is formed by etching the channel material layer, the gate insulating material layer, and the insertion insulating layer exposed by the second trench.

9. The manufacturing method of a memory device of claim 1, further comprising exposing an outer surface of the electrode member by etching the mold insulating layer after forming the electrode member, wherein the dielectric layer and the plate electrode are sequentially formed after etching the mold insulating layer.

10. The manufacturing method of a memory device of claim 1, wherein the stack further includes a second sacrificial layer and a third insulating layer sequentially stacked on the second insulating layer, and the stack has a vertically symmetrical structure with respect to the second insulating layer.

11. The manufacturing method of a memory device of claim 10, wherein the second insulating layer has a thickness larger than that of each of the first insulating layer, the third insulating layer, the first sacrificial layer, and the second sacrificial layer.

12. The manufacturing method of a memory device of claim 10, wherein the transistor is a first transistor, the capacitor is a first capacitor, and the memory device further includes a second transistor disposed on the first transistor and a second capacitor disposed on the first capacitor.

13. A manufacturing method of a memory device comprising:

forming a stack including a first insulating layer, and a first sacrificial layer and a second insulating layer which are sequentially stacked on the first insulating layer;

forming a patterned stack having at least one pattern portion having a first sacrificial layer pattern obtained from the first sacrificial layer by patterning the stack, wherein the pattern portion has a shape extending in a first direction, and empty spaces are provided on both sides of the pattern portion along a second direction perpendicular to the first direction;

forming a structure including the patterned stack and an insulating material by filling the empty spaces on both sides of the at least one pattern portion with the insulating material;

forming a first vertical hole penetrating through the first sacrificial layer pattern of the pattern portion in the structure;

forming a horizontal hole extending in the first direction by removing the first sacrificial layer pattern exposed by the first vertical hole;

forming a gate insulating material layer on inner surfaces of the first vertical hole and the horizontal hole, and forming a dummy channel material layer to fill the first vertical hole and the horizontal hole on the gate insulating material layer;

forming a second vertical hole in a region corresponding to the first vertical hole in the structure where the gate insulating material layer and the dummy channel material layer are formed;

exposing the gate insulating material layer by removing the first and second insulating layers and the insulating material from a transistor formation region around the second vertical hole of the structure;

forming a word line surrounding the exposed portion of the gate insulating material layer in the transistor formation region;

forming a first trench in a capacitor formation region adjacent to the transistor formation region of the structure;

forming a first recess exposing the gate insulating material layer by removing the first and second insulating layers and the insulating material exposed by the first trench in the capacitor formation region;

forming a mold insulating layer filling the first recess;

forming a second recess by removing the dummy channel material layer and the gate insulating material layer from the capacitor formation region, forming an electrode member on an inner surface of the second recess, forming a capacitor including the electrode member, a dielectric layer, and a plate electrode by sequentially forming the dielectric layer and the plate electrode on the electrode member;

forming an empty channel space by removing the dummy channel material layer from the transistor formation region, and forming a channel material layer connected to the capacitor in the empty channel space to define a transistor including the channel material layer; and forming a bit line connected to the channel material layer.

14. The manufacturing method of a memory device of claim 13, wherein the first insulating layer, the second insulating layer, and the insulating material include a silicon nitride, and the first sacrificial layer includes a silicon oxide.

15. The manufacturing method of a memory device of claim 13, wherein the dummy channel material layer includes poly-silicon (poly-Si).

16. The manufacturing method of a memory device of claim 13, wherein the channel material layer includes an oxide semiconductor.

17. The manufacturing method of a memory device of claim 13, wherein the forming the word line includes:

forming a word line material layer surrounding the exposed portion of the gate insulating material layer in the transistor formation region;

forming a through hole by etching a region corresponding to the second vertical hole in the word line material layer;

recessing a portion of the word line material layer exposed through the through hole so that one end of the dummy channel material layer protrudes toward the through hole rather than the word line material layer; and forming a body insulating layer to fill the through hole.

18. The manufacturing method of a memory device of claim 17, further comprising recessing a portion of the word line material layer exposed by the first recess after forming the first recess in the capacitor formation region.

19. The manufacturing method of a memory device of claim 17, wherein the forming the empty channel space and forming the channel material layer include:

forming a third vertical hole in a region of the body insulating layer corresponding to the second vertical hole;

forming the empty channel space by removing the dummy channel material layer exposed by the third vertical hole; and forming the channel material layer in the empty channel space and the third vertical hole.

20. The manufacturing method of a memory device of claim 19, wherein the forming the bit line includes:

reforming the third vertical hole by removing a portion of the channel material layer formed in the third vertical hole; and forming the bit line in the reformed third vertical hole.

21. The manufacturing method of a memory device of claim 13, further comprising:

forming an insertion insulating layer surrounding the exposed portion of the gate insulating material layer in the capacitor formation region after forming the first recess in the capacitor formation region, wherein the mold insulating layer is formed to fill the first recess and the first trench on the insertion insulating layer; and forming a second trench in a region corresponding to the first trench in the mold insulating layer is further included, wherein the second recess is formed by etching the dummy channel material layer, the gate insulating material layer, and the insertion insulating layer exposed by the second trench.

22. The manufacturing method of a memory device of claim 13, further comprising etching the mold insulating layer to expose an outer surface of the electrode member after forming the electrode member, wherein the dielectric layer and the plate electrode are sequentially formed after etching the mold insulating layer.

23. The manufacturing method of a memory device of claim 13, wherein the stack further includes a second sacrificial layer and a third insulating layer sequentially stacked on the second insulating layer, wherein the stack has a vertically symmetrical structure with respect to the second insulating layer.

24. The manufacturing method of a memory device of claim 23, wherein the second insulating layer has a thickness larger than that of each of the first insulating layer, the third insulating layer, the first sacrificial layer, and the second sacrificial layer.

25. The manufacturing method of a memory device of claim 23, wherein the transistor is a first transistor, the capacitor is a first capacitor, and the memory device further includes a second transistor disposed on the first transistor and a second capacitor disposed on the first capacitor.

* * * * *